US012757456B2

(12) United States Patent
Chen et al.

(10) Patent No.: US 12,757,456 B2
(45) Date of Patent: Oct. 6, 2026

(54) METHOD FOR FORMING SEMICONDUCTOR STRUCTURE

(71) Applicant: Taiwan Semiconductor Manufacturing Company, Ltd., Hsinchu (TW)

(72) Inventors: Yi-Ren Chen, Taoyuan City (TW); Shih-Hsun Chang, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 18/488,207

(22) Filed: Oct. 17, 2023

(65) Prior Publication Data

US 2025/0126857 A1 Apr. 17, 2025

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/024* (2025.01);
(Continued)

(58) Field of Classification Search
CPC ............. H10D 84/834; H10D 30/6757; H10D 62/121; H10D 62/151; H10D 30/014; H10D 30/43; H10D 30/6735; H10D 64/518; H10D 62/364; H10D 64/017; H10D 64/251; H10D 64/519; H10D 84/83; H10D 84/0149; H10D 84/0151; H10D 84/0153; H10D 84/038; H10D 84/0135; H10D 84/0142; H10D 84/0167; H10D 84/0186; H10D 84/85; H10D 64/01; H10D 64/258; H10D 30/797; H10D 62/82; H10D 62/822; H10D 30/0198; H10D 64/256; H10D 30/024; H10D 30/6211; H10D 84/017; H10D 84/0193; H10D 84/853; H10D 84/832; H10D 30/6219; B82Y 10/00; H01L 23/481;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Jonathan Han
(74) *Attorney, Agent, or Firm* — Birch, Stewart, Kolasch & Birch, LLP

(57) ABSTRACT

A method for forming a semiconductor structure is provided. The method includes forming a source/drain feature over an active region, forming a gate stack across the active region, forming an interlayer dielectric layer over the source/drain feature, and etching the interlayer dielectric layer to form an opening exposing the source/drain feature. The opening has a first sidewall extending in a first horizontal direction and a second sidewall extending in a second horizontal direction. The method also includes forming a contact liner along the opening, and forming a contact plug in the opening. A first portion of the contact liner along the first sidewall of the opening is thinner than a second portion of the contact liner along the second sidewall of the opening.

20 Claims, 43 Drawing Sheets

(51) Int. Cl.

| | |
|---|---|
| ***H10D 30/43*** | (2025.01) |
| ***H10D 30/62*** | (2025.01) |
| ***H10D 30/67*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.
CPC ......... *H10D 30/43* (2025.01); *H10D 30/6211* (2025.01); *H10D 30/6735* (2025.01); *H10D 30/6757* (2025.01); *H10D 64/017* (2025.01); *H10D 84/0167* (2025.01); *H10D 84/017* (2025.01); *H10D 84/0193* (2025.01); *H10D 84/038* (2025.01); *H10D 84/853* (2025.01)

(58) Field of Classification Search
CPC ............. H01L 21/308; H01L 21/76897; H01L 23/5286; H01L 21/0245; H01L 21/02532; H01L 21/0262; H01L 21/02636
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2022/0028786 | A1* | 1/2022 | Huang | H10D 84/0149 |
| 2022/0238713 | A1* | 7/2022 | Lee | H10D 30/797 |
| 2023/0420367 | A1* | 12/2023 | Xie | H10D 88/00 |
| 2024/0112985 | A1* | 4/2024 | Xie | H10D 30/6735 |

* cited by examiner

METHOD FOR FORMING SEMICONDUCTOR STRUCTURE

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1 and 2A-2 are cross-sectional views of a semiconductor structure corresponding to line X-X and line Y-Y of FIG. 1, in accordance with some embodiments of the disclosure.

FIGS. 2B-1 and 2B-2 are cross-sectional views of a semiconductor structure corresponding to line X-X and line Y-Y of FIG. 1, in accordance with some embodiments of the disclosure.

FIGS. 2C-1 and 2C-2 are cross-sectional views of a semiconductor structure corresponding to line X-X and line Y-Y of FIG. 1, in accordance with some embodiments of the disclosure.

FIGS. 2D-1 and 2D-2 are cross-sectional views of a semiconductor structure corresponding to line X-X and line Y-Y of FIG. 1, in accordance with some embodiments of the disclosure.

FIGS. 2E-1 and 2E-2 are cross-sectional views of a semiconductor structure corresponding to line X-X and line Y-Y of FIG. 1, in accordance with some embodiments of the disclosure.

FIGS. 2F-1 and 2F-2 are cross-sectional views of a semiconductor structure corresponding to line X-X and line Y-Y of FIG. 1, in accordance with some embodiments of the disclosure.

FIGS. 2G-1 and 2G-2 are cross-sectional views of a semiconductor structure corresponding to line X-X and line Y-Y of FIG. 1, in accordance with some embodiments of the disclosure.

FIGS. 2H-1 and 2H-2 are cross-sectional views of a semiconductor structure corresponding to line X-X and line Y-Y of FIG. 1, in accordance with some embodiments of the disclosure.

FIGS. 2I-1 and 2I-2 are cross-sectional views of a semiconductor structure corresponding to line X-X and line Y-Y of FIG. 1, in accordance with some embodiments of the disclosure.

FIGS. 2J-1 and 2J-2 are cross-sectional views of a semiconductor structure corresponding to line X-X and line Y-Y of FIG. 1, in accordance with some embodiments of the disclosure.

FIGS. 2A-3, 2B-3, 2C-3, 2D-3, 2F-3, 2G-3, 2H-3, 2I-3 and 2J-3 are plan views illustrating the formation of a semiconductor structure at various intermediate stages, in accordance with some embodiments of the disclosure.

FIG. 2E-3 is an enlarged view of FIG. 2E-2 to illustrate a surface modification of interlayer dielectric layers, in accordance with some embodiments of the disclosure.

FIG. 3 is a schematic view exhibiting various profiles of the dopant concentration of an interlayer dielectric layer after an implantation process, in accordance with some embodiments of the disclosure.

FIGS. 4A-1 and 4A-2 are cross-sectional views of a semiconductor structure corresponding to line X-X and line Y-Y of FIG. 1, in accordance with some embodiments of the disclosure.

FIGS. 4B-1 and 4B-2 are cross-sectional views of a semiconductor structure corresponding to line X-X and line Y-Y of FIG. 1, in accordance with some embodiments of the disclosure.

FIGS. 4C-1 and 4C-2 are cross-sectional views of a semiconductor structure corresponding to line X-X and line Y-Y of FIG. 1, in accordance with some embodiments of the disclosure.

FIGS. 4D-1 and 4D-2 are cross-sectional views of a semiconductor structure corresponding to line X-X and line Y-Y of FIG. 1, in accordance with some embodiments of the disclosure.

FIGS. 4E-1 and 4E-2 are cross-sectional views of a semiconductor structure corresponding to line X-X and line Y-Y of FIG. 1, in accordance with some embodiments of the disclosure.

FIGS. 4F-1 and 4F-2 are cross-sectional views of a semiconductor structure corresponding to line X-X and line Y-Y of FIG. 1, in accordance with some embodiments of the disclosure.

FIGS. 5A-1 and 5A-2 are cross-sectional views of a semiconductor structure corresponding to line X-X and line Y-Y of FIG. 1, in accordance with some embodiments of the disclosure.

FIGS. 5B-1 and 5B-2 are cross-sectional views of a semiconductor structure corresponding to line X-X and line Y-Y of FIG. 1, in accordance with some embodiments of the disclosure.

FIGS. 5C-1 and 5C-2 are cross-sectional views of a semiconductor structure corresponding to line X-X and line Y-Y of FIG. 1, in accordance with some embodiments of the disclosure.

FIGS. 5D-1 and 5D-2 are cross-sectional views of a semiconductor structure corresponding to line X-X and line Y-Y of FIG. 1, in accordance with some embodiments of the disclosure.

FIGS. 7A-1 and 7A-2 are cross-sectional views of a semiconductor structure corresponding to line X-X and line Y-Y of FIG. 6, in accordance with some embodiments of the disclosure.

FIGS. 7B-1 and 7B-2 are cross-sectional views of a semiconductor structure corresponding to line X-X and line Y-Y of FIG. 6, in accordance with some embodiments of the disclosure.

FIGS. 7C-1 and 7C-2 are cross-sectional views of a semiconductor structure corresponding to line X-X and line Y-Y of FIG. 6, in accordance with some embodiments of the disclosure.

FIGS. 7D-1 and 7D-2 are cross-sectional views of a semiconductor structure corresponding to line X-X and line Y-Y of FIG. 6, in accordance with some embodiments of the disclosure.

FIGS. 7A-3, 7B-3, 7C-3 and 7D-3 are plan views illustrating the formation of a semiconductor structure at various intermediate stages, in accordance with some embodiments of the disclosure.

FIGS. 8-1, 8-2 and 8-3 illustrate a modification of the semiconductor structure of FIGS. 2J-1, 2J-2 and 2J-3, in accordance with some embodiments of the disclosure.

DETAILED DESCRIPTION

Figure 1:
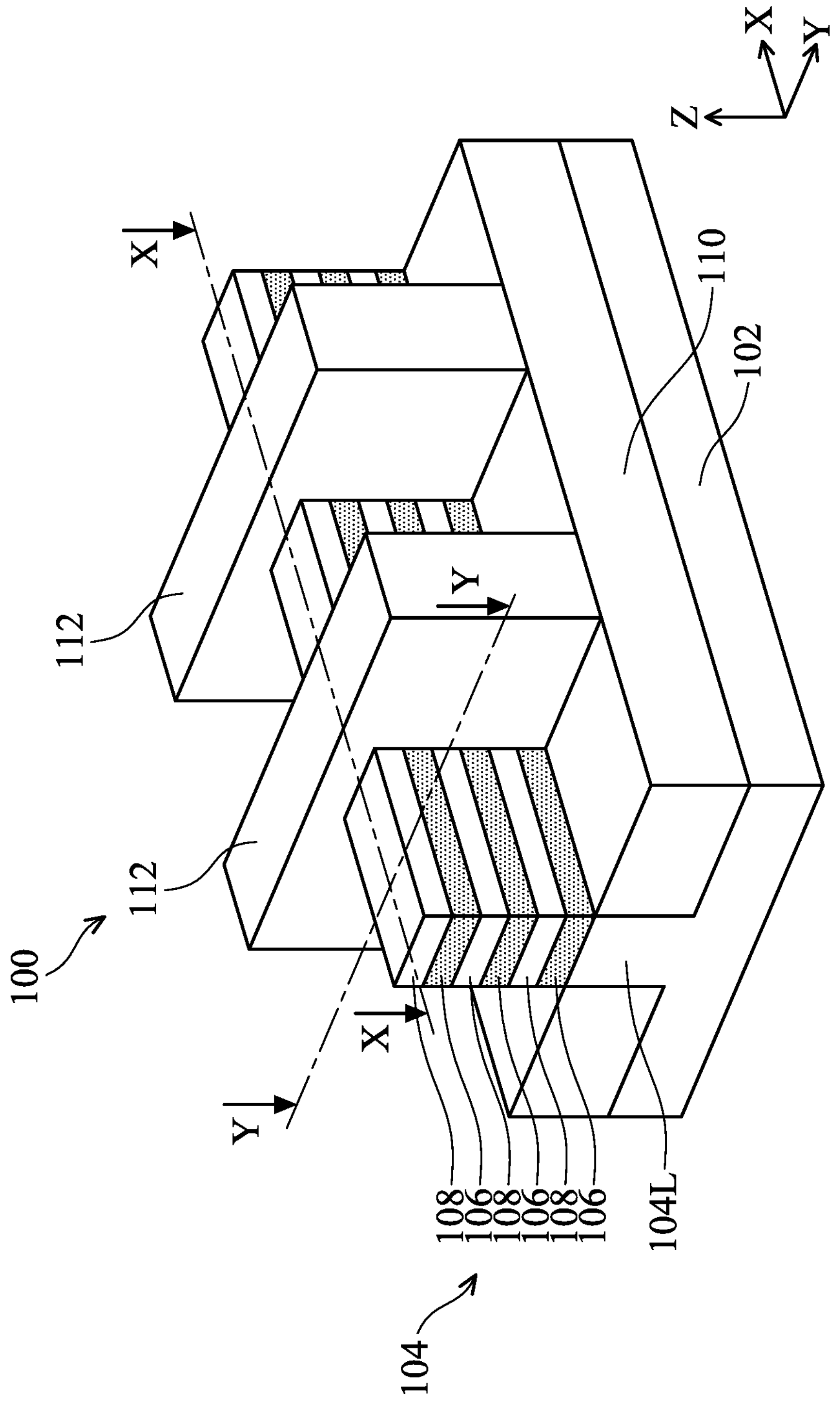
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Embodiments of a semiconductor structure and the method for forming the semiconductor structure are provided. The semiconductor structure may include a contact liner and a contact plug nested within the contact liner. The semiconductor structure may also include a via landing on both a first portion of the contact liner and the contact plug, and a final gate stack adjacent to a second portion of the contact liner. Because the first portion of the contact liner has a relatively thin thickness and the second portion of the contact liner has a relatively thick thickness, the via may have a larger contact area with the contact plug while the risk of leakage between the contact plug and the final gate stack may be reduced. Therefore, the performance and reliability of the resulting semiconductor device may improve.

FIG. 1 is a perspective view of a semiconductor structure 100 having a nanostructure FET architecture, in accordance with some embodiments. A semiconductor structure 100 is provided, as shown in FIG. 1, in accordance with some embodiments. The semiconductor structure 100 includes a substrate 102 and a fin structure 104 and an isolation structure 110 over the substrate 102, in accordance with some embodiments.

For a better understanding of the semiconductor structure, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The nanostructure transistor (e.g., nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fin structure 104 includes a lower fin element 104L surrounded by the isolation structure 110 and an upper fin element formed from an epitaxial stack including alternating first semiconductor layers 106 and second semiconductor layer 108, in accordance with some embodiments. The second semiconductor layers 108 will form nanostructures (e.g., nanowires or nanosheets) and serve as the channel for the resulting semiconductor devices, in accordance with some embodiments.

The fin structure 104 extends in the X direction, in accordance with some embodiments. That is, the fin structure 104 has a longitudinal axis that is parallel to the X direction, in accordance with some embodiments. The X direction may also be referred to as the channel-extending direction. The current of the resulting semiconductor device (i.e., nanostructure transistor) flows in the X direction through the channel. The fin structure 104 is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same.

Gate structures 112 are formed with longitudinal axes parallel to the Y direction and extending across and/or surrounding the channel regions of the fin structure 104, in accordance with some embodiments. The source/drain regions of the fin structure 104 are exposed from the gate structures 112, in accordance with some embodiments. The Y direction may also be referred to as a gate-extending direction, in accordance with some embodiments.

FIG. 1 further illustrates reference cross-sections that are used in later figures. Cross-section X-X is in a plan parallel to the longitudinal axis of the fin structure 104 (i.e., X direction) and through the fin structure 104. Cross-section Y-Y is in a plan parallel to the longitudinal axis of the gate structure (i.e., Y direction) and across the source/drain region of the fin structure 104.

Figures 1, 2A:
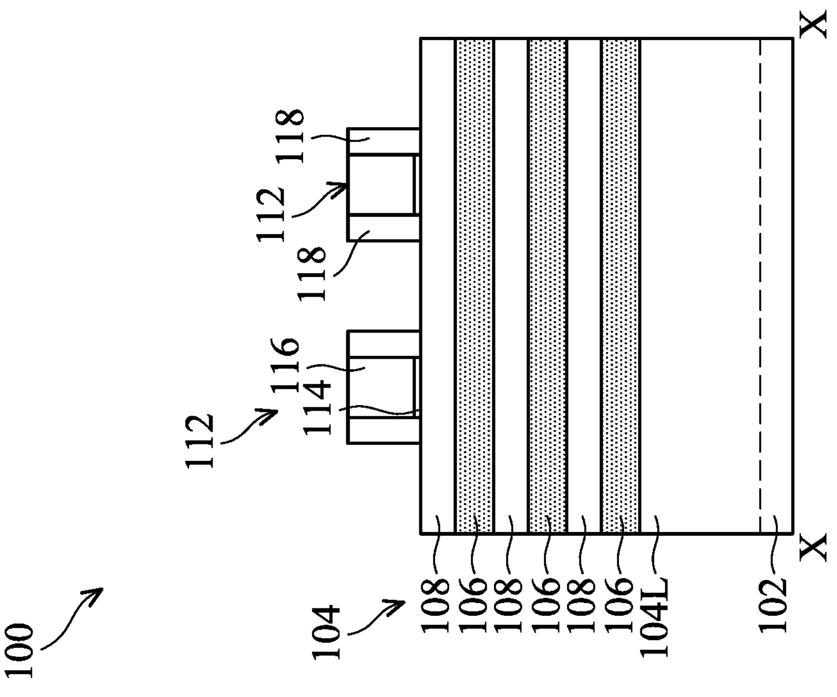
Figures 2, 2A:
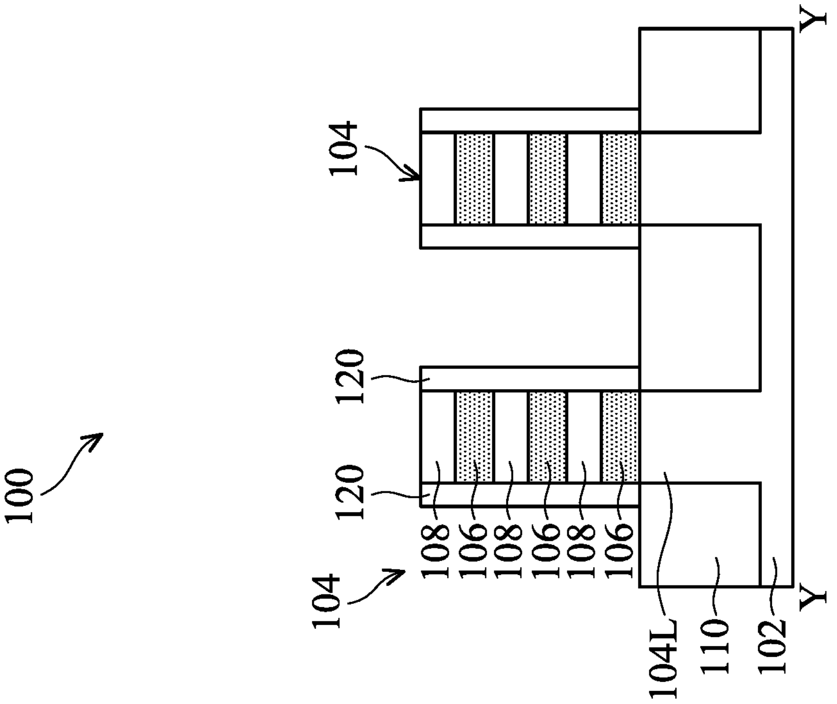
Figures 2, 2A, 3:
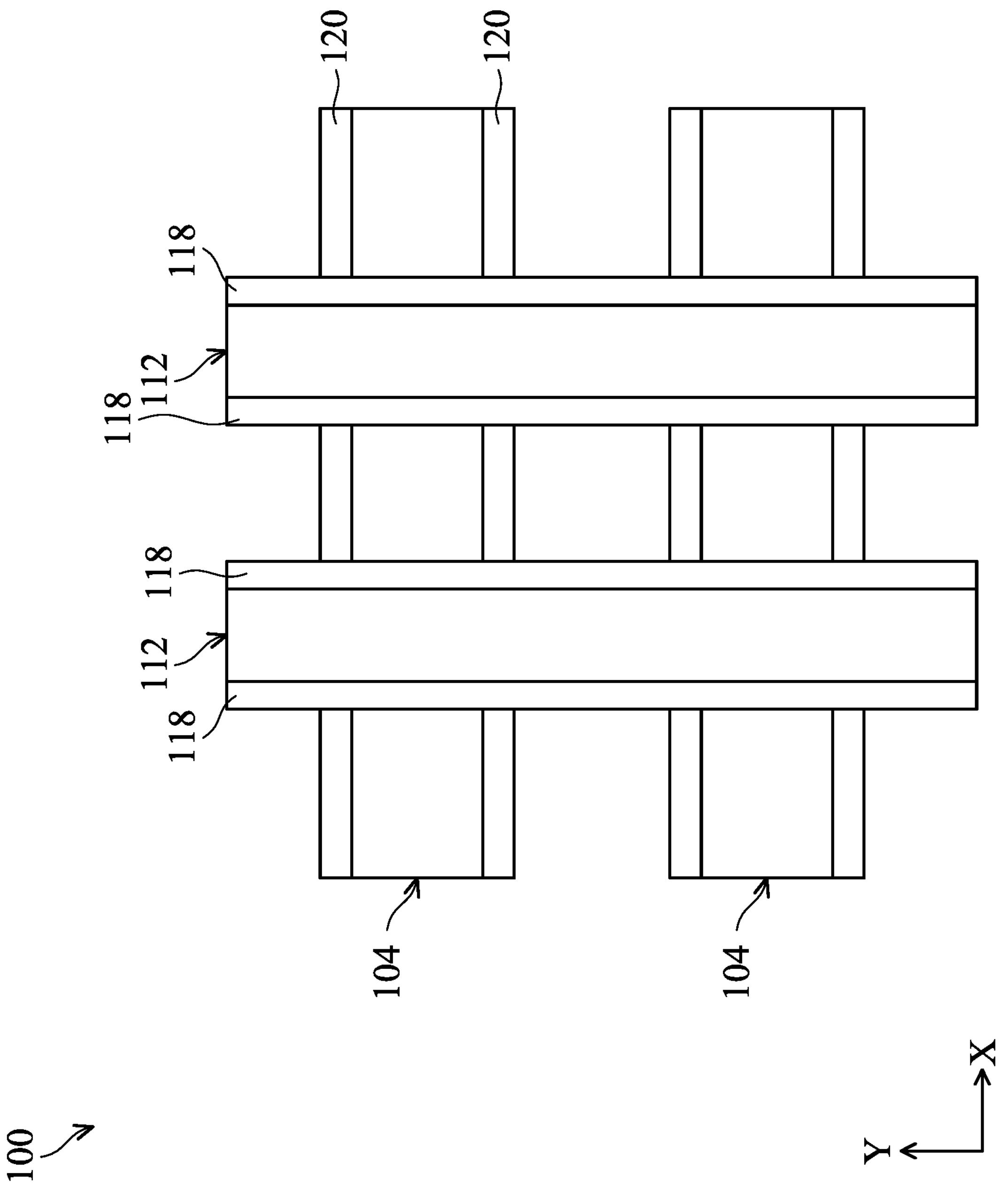

FIGS. 2A-1 through 2J-3 are schematic views illustrating the formation of a semiconductor structure 100 at various intermediate stages. FIGS. 2A-1 and 2A-2 are cross-sectional views of the semiconductor structure 100 after the formation of active regions 104, an isolation structure 110, dummy gate structures 112, gate spacer layers 118 and fin spacer layers 120 corresponding to line X-X and line Y-Y of FIG. 1. FIG. 2A-3 is a plan view illustrating the semiconductor structure 100.

The semiconductor structure 100 includes a substrate 102 and active regions 104 over the substrate 102, as shown in FIGS. 2A-1 to 2A-3, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

In some embodiments, the active regions 104 extend in the X direction. The active regions 104 have longitudinal axes parallel to the X direction, in accordance with some embodiments. In some embodiments, the active regions 104 are the fin structure 104 shown in FIG. 1. Although two active regions 104 are shown in FIG. 2A-3, the number of active regions 104 is not limited thereto, and may depend on the performance and design demands of the resulting semiconductor device.

The formation of the active regions 104 includes forming an epitaxial stack over the substrate 102 using an epitaxial growth process, in accordance with some embodiments. The epitaxial stack may be formed by depositing a first semiconductor layer 106 on the substrate 102, depositing a second semiconductor layer 108 on the first semiconductor layer 106, and repeating the cycle of depositing the semiconductor layers 106 and 108 several times. The first semiconductor layers 106 and the second semiconductor layers 108 are alternately stacked, in accordance with some embodiments. The epitaxial growth process may be molecular beam epitaxy (MBE), metal organic chemical vapor deposition (MOCVD), vapor phase epitaxy (VPE), or another suitable technique.

In some embodiments, the first semiconductor layers 106 are made of a first semiconductor material and the second semiconductor layers 108 are made of a second semiconductor material with a different composition than the first semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, in accordance with some embodiments. The second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shape and/or sheet shape. A gate stack (not shown) will be formed across and wrap around the nanostructures, in accordance with some embodiments. Although three first semiconductor layers 106 and three second semiconductor layers 108 are shown in FIGS. 2A-1 and 2A-2, the number is not limited to three, and can be two or four, and is less than ten.

In some embodiments, the thickness of the second semiconductor layers 108 is in a range from about 3 nm to about 20 nm, such as about 4 nm to about 12 nm. In some embodiments, the thickness of each of the first semiconductor layers 106 is in a range from about 2 nm to about 20 nm, such as about 2 nm to about 10 nm.

The formation of the active regions 104 further includes patterning the epitaxial stack and the underlying substrate 102 using photolithography and etching processes, thereby forming trenches and the active regions 104 protruding from between trenches, in accordance with some embodiments. The portion of the substrate 102 protruding from between the trenches serves as the lower fin elements 104L of the active regions 104, in accordance with some embodiments. The remainder of the epitaxial stack (including the first semiconductor layers 106 and the second semiconductor layers 108) serves as the upper fin elements of the active regions 104, in accordance with some embodiments.

An isolation structure 110 is formed to surround the lower fin elements 104L of the active regions 104, as shown in FIG. 2A-2, in accordance with some embodiments. The isolation structure 110 is configured to electrically isolate neighboring active regions 104 and is also referred to as shallow trench isolation (STI) feature, in accordance with some embodiments.

The formation of the isolation structure 110 includes forming an insulating material to overfill the trenches, in accordance with some embodiments. In some embodiments, the insulating material is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof.

A planarization process is performed on the insulating material to remove a portion of the insulating material above the active regions 104, in accordance with some embodiments. The planarization may be chemical mechanical polishing (CMP), an etching back process, or a combination thereof. The insulating material is then recessed by an etching process (such as dry plasma etching and/or wet chemical etching) to expose the sidewalls of the upper fin elements of the active regions 104, in accordance with some embodiments. The remaining insulating material serves as the isolation structure 110, in accordance with some embodiments.

Dummy gate structures 112 are formed across the active regions 104 and the isolation structure 110, as shown in FIGS. 2A-1 and 2A-3, in accordance with some embodiments. The dummy gate structures 112 are configured as sacrificial structures and will be replaced with final gate stacks, in accordance with some embodiments. In some embodiments, the dummy gate structures 112 extend in the Y direction. That is, the dummy gate structures 112 have longitudinal axes parallel to the Y direction, in accordance with some embodiments. The dummy gate structures 112 surround the channel regions of the active regions 104, in accordance with some embodiments. The dummy gate structures 112 may be the gate structures 112 shown in FIG. 1. Although two dummy gate structures 112 are shown in FIGS. 2A-1 and 2A-3, the number of dummy gate structures 112 is not limited thereto, and may depend on the performance and design demands of the resulting semiconductor device.

Each of the dummy gate structures 112 includes a dummy gate dielectric layer 114 and a dummy gate electrode layer 116 formed over the dummy gate dielectric layer 114, as shown in FIG. 2A-1, in accordance with some embodiments. In some embodiments, the dummy gate dielectric layer 114 is conformally formed along the upper fin element of the active regions 104. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO. In some embodiments, the dielectric material is deposited using ALD, CVD, thermal oxidation, physical vapor deposition (PVD), another suitable technique, or a combination thereof.

In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof.

In some embodiments, the formation of the dummy gate structures 112 includes globally and conformally depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the material for the dummy gate electrode layer 116 and the dielectric material into the dummy gate structures 112.

The patterning process includes forming a patterned hard mask layer (not shown) over the material for the dummy gate electrode layer 116, in accordance with some embodiments. The patterned hard mask layer corresponds to and overlaps the channel region of the active regions 104, in accordance with some embodiments. The materials for the dummy gate dielectric layer 114 and the dummy gate electrode layer 116, uncovered by the patterned hard mask layer, are etched away until the active regions 104 and the top surface of the isolation structure 110 are exposed, in accordance with some embodiments.

Gate spacer layers 118 are formed along opposite sidewalls of the dummy gate structures 112, and fin spacer layers 120 are formed along opposite sidewalls of the active regions 104, as shown in FIGS. 2A-1 to 2A-3, in accordance with some embodiments. The gate spacer layers 118 extend in the Y direction and across the active regions 104 and the isolation structure 110, in accordance with some embodiments. The gate spacer layers 118 are used to offset the subsequently formed source/drain features and separate the source/drain features from the gate structure, in accordance with some embodiments.

The fin spacer layers 120 extend in the X direction, in accordance with some embodiments. The fin spacer layers 120 may be used to confine the growth of epitaxial material to prevent neighboring epitaxial material from merging with each other, in accordance with some embodiments.

In some embodiments, the gate spacer layers 118 and the fin spacer layers 120 are formed from a continuous dielectric material. In some embodiments, the formation of the gate spacer layers 118 and the fin spacer layers 120 includes globally and conformally depositing a dielectric material over the semiconductor structure 100 using ALD, CVD (such as LPCVD, PECVD, HDP-CVD or HARP), another suitable method, and/or a combination thereof, followed by an anisotropic etching process. In some embodiments, the etching process is performed without an additional photolithography process. In some embodiments, the dielectric material for the gate spacer layers 118 and the fin spacer layers 120 may be silicon oxide ($SiO_2$), silicon nitride (SiN), silicon carbide (SiC), silicon oxynitride (SiON), silicon carbon nitride (SiCN), silicon oxycarbonitride (SiOCN), oxygen-doped silicon carbonitride (Si(O)CN), and/or a combination thereof.

The vertical portions of the dielectric material left remaining on the opposite sides of the dummy gate structures 112 serve as the gate spacer layers 120, in accordance with some embodiments. The vertical portions of the dielectric material left remaining on the opposite sides of the active regions 104 serve as fin spacer layers 120, in accordance with some embodiments.

Figures 1, 2B:
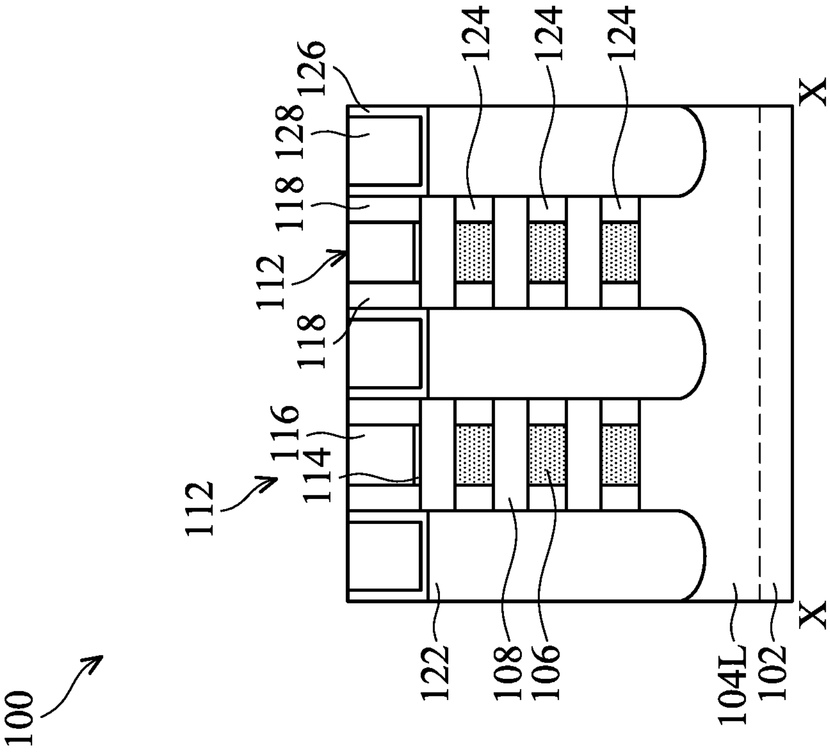
Figures 2, 2B:
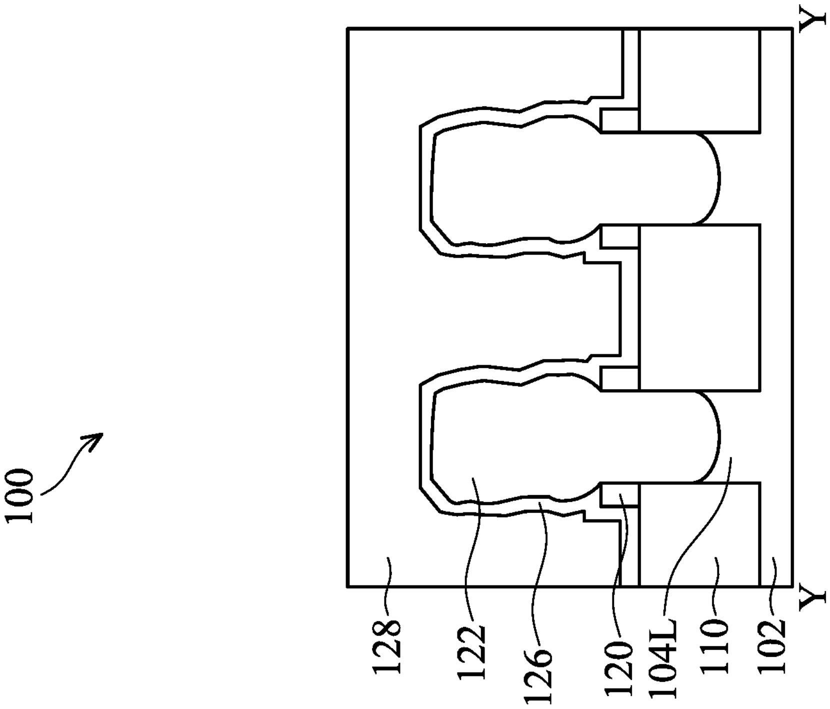
Figures 2, 2B, 3:
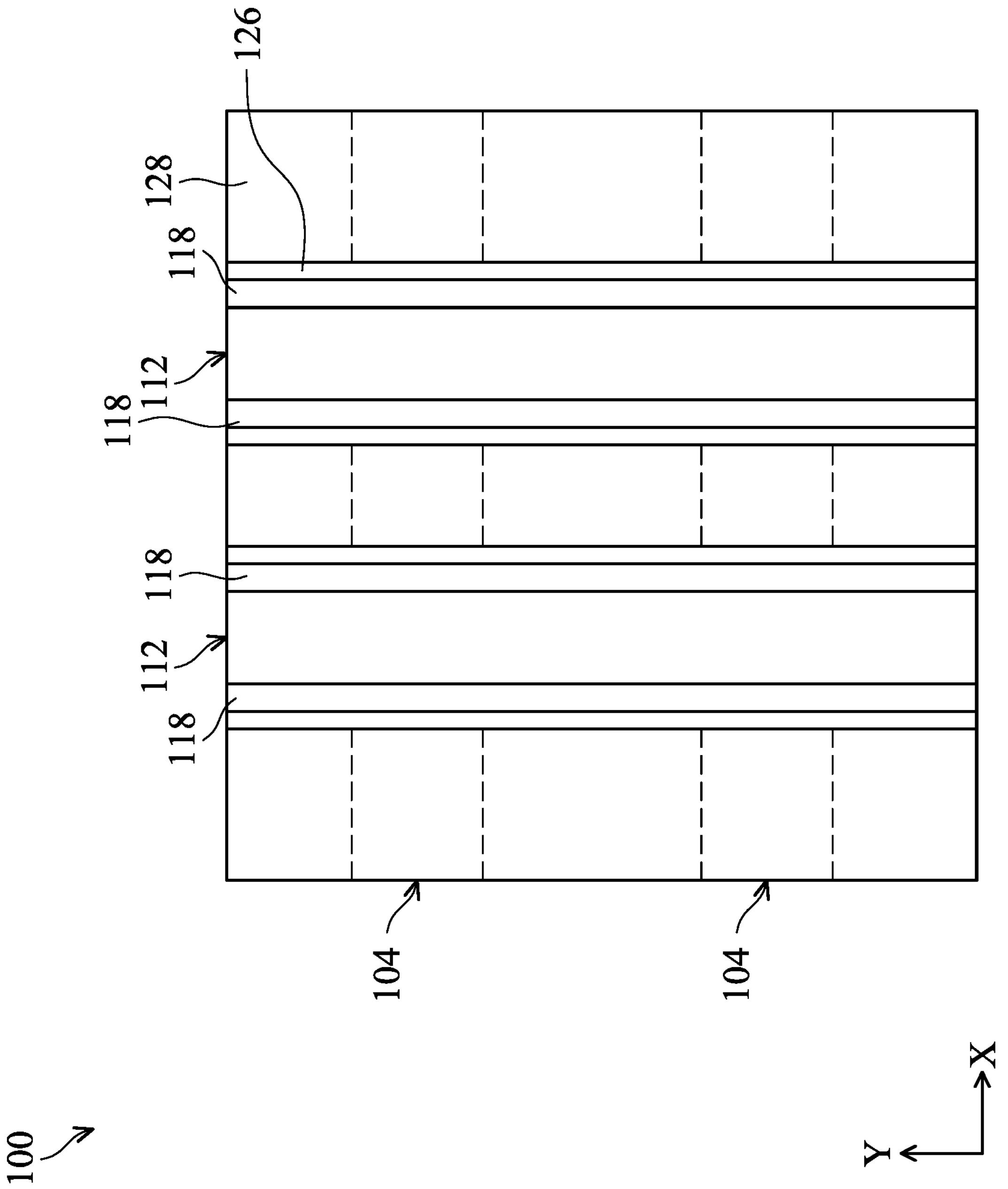

FIGS. 2B-1 and 2B-2 are cross-sectional views of the semiconductor structure 100 after the formation of source/drain features 122, inner spacer layers 124, a contact etching stop layer (CESL) 126 and a first interlayer dielectric (ILD) layer 128 corresponding to line X-X and line Y-Y of FIG. 1, in accordance with some embodiments of the disclosure. FIG. 2B-3 is a plan view of the semiconductor structure 100.

Source/drain features 122 are formed in and/or over the source/drain regions of the active regions 104, as shown in FIGS. 2B-1 and 2B-2, in accordance with some embodiments. The formation of the source/drain features 122 includes recessing the source/drain regions of the active regions 104 using the dummy gate structures 112 and the gate spacer layers 118 as masks to form source/drain recesses (where the source/drain features 122 are to be formed) on opposite sides of the dummy gate structures 112, in accordance with some embodiments. The source/drain recesses may extend into the lower fin elements 104L, in accordance with some embodiments.

In some embodiments, the recessing process includes an anisotropic etching process such as dry plasma etching, an isotropic etching process such as dry chemical etching, remote plasma etching or wet chemical etching, or a combination thereof. In some embodiments, the fin spacer layers 120 may be also recessed in the etching process.

Afterward, an etching process is performed to laterally recess, from the source/drain recesses, the first semiconductor layers 106 of the active regions 104 thereby forming notches, and then inner spacer layers 124 are formed in the notches, as shown in FIG. 2B-1, in accordance with some embodiments. The inner spacer layers 124 are formed to abut the recessed side surfaces of the first semiconductor layers 106, in accordance with some embodiments. In some embodiments, the inner spacer layers 124 are located between adjacent second semiconductor layers 108 and between the lowermost second semiconductor layer 108 and the lower fin element 104L. In some embodiments, the inner spacer layers 124 extend directly below the gate spacer layers 118.

The inner spacer layers 124 may avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 124 are made of dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the inner spacer layers 124 are formed by depositing a dielectric material for the inner spacer layers 124 over the semiconductor structure 100 to fill the notches, and then etching back the dielectric material to remove the dielectric material outside the notches. Portions of the dielectric material left in the notches serve as the inner spacer layers 124, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

Afterward, the source/drain features 122 are formed on the exposed surfaces of the second semiconductor layers 108 and the lower fin elements 104L in the source/drain recesses using an epitaxial growth process, as shown in FIGS. 2B-1 and 2B-2, in accordance with some embodiments. The source/drain features 122 are formed on opposite sides of the dummy gate structures 112, in accordance with some embodiments. The epitaxial growth process may be MBE, MOCVD, or VPE, another suitable technique, or a combination thereof.

In some embodiments, the source/drain features 122 are made of any suitable semiconductor material for n-type semiconductor devices or p-type semiconductor devices. In some embodiments, the source/drain features 122 are doped. The concentration of the dopant in the source/drain features 122 in a range from about $1\times10^{19}$ $cm^{-3}$ to about $6\times10^{21}$ $cm^{-3}$. An annealing process may be performed on the semiconductor structure 100 to activate the dopants in the source/drain features 122, in accordance with some embodiments.

In some embodiments wherein the active regions 104 are to be formed as an N-type device (such as n-channel nanostructure transistor), the source/drain features 122 are made of semiconductor material such as SiP, SiAs, SiCP, SiC, Si, GaAs, another suitable semiconductor material, or a combination thereof. In some embodiments, the source/drain features 122 are doped with the n-type dopant during the epitaxial growth process. For example, the n-type dopant may be phosphorous (P) or arsenic (As). For example, the source/drain features 122 may be the epitaxially grown Si doped with phosphorous to form silicon:phosphor (Si:P) source/drain features and/or arsenic to form silicon:arsenic (Si:As) source/drain feature.

In some embodiments wherein the active regions 104 are to be formed as a P-type device (such as p-channel nanostructure transistor), the source/drain features 122 are made of semiconductor material such as SiGe, Si, GaAs, another suitable semiconductor material, or a combination thereof. In some embodiments, the source/drain features 122 are doped with the p-type dopant during the epitaxial growth process. For example, the p-type dopant may be boron (B) or $BF_2$. For example, the source/drain features 122 may be the epitaxially grown SiGe doped with boron (B) to form silicon germanium:boron (SiGe:B) source/drain feature.

A contact etching stop layer 126 is formed over the semiconductor structure 100 to cover the source/drain features 122, as shown in FIGS. 2B-1 to 2B-3, in accordance with some embodiments. In some embodiments, the contact etching stop layer 126 is made of dielectric material, such as silicon nitride (SiN), silicon oxide ($SiO_2$), silicon oxycarbide (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 126 is globally and conformally deposited over the semiconductor structure 100 using CVD (such as LPCVD, PECVD, HDP-CVD, or HARP), ALD, another suitable method, or a combination thereof.

Afterward, a first interlayer dielectric layer 128 is formed over the contact etching stop layer 126, as shown in FIGS. 2B-1 and 2B-3, in accordance with some embodiments. In some embodiments, the first interlayer dielectric layer 128 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the first interlayer dielectric layer 128 and the contact etching stop layer 126 are made of different materials and have a great difference in etching selectivity. In some embodiments, the contact etching stop layer 126 is made of silicon nitride, and the first interlayer dielectric layer 128 is made of silicon oxide.

In some embodiments, the dielectric material for the first interlayer dielectric layer 128 is deposited using such as CVD (such as HDP-CVD, PECVD, HARP or FCVD), another suitable technique, or a combination thereof. The dielectric materials for the contact etching stop layer 126 and the first interlayer dielectric layer 128 above the upper surface of the dummy gate electrode layer are removed using such as CMP, in accordance with some embodiments.

Figures 1, 2C:
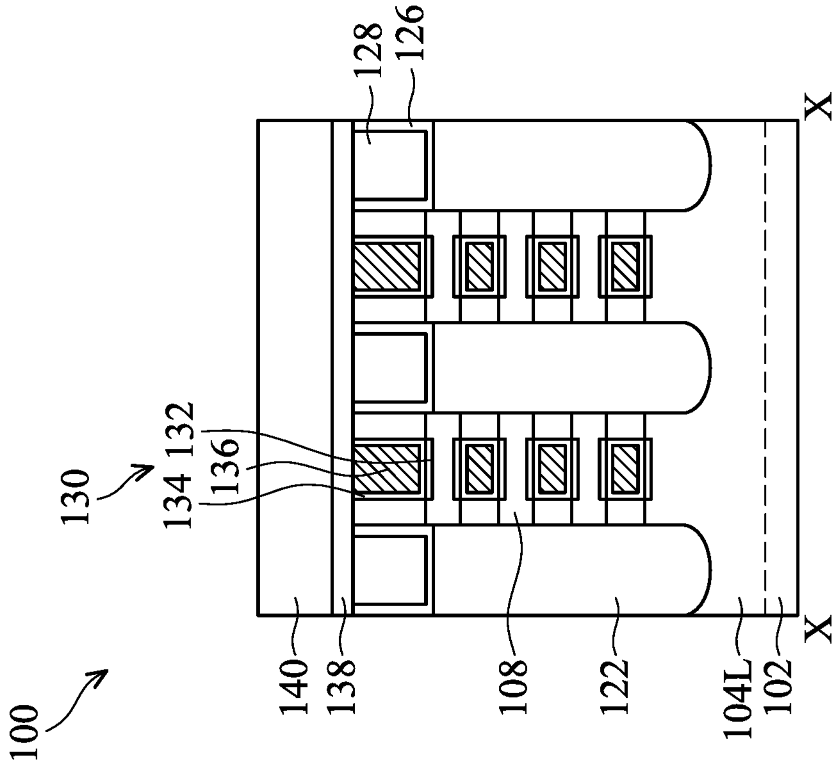
Figures 2, 2C:
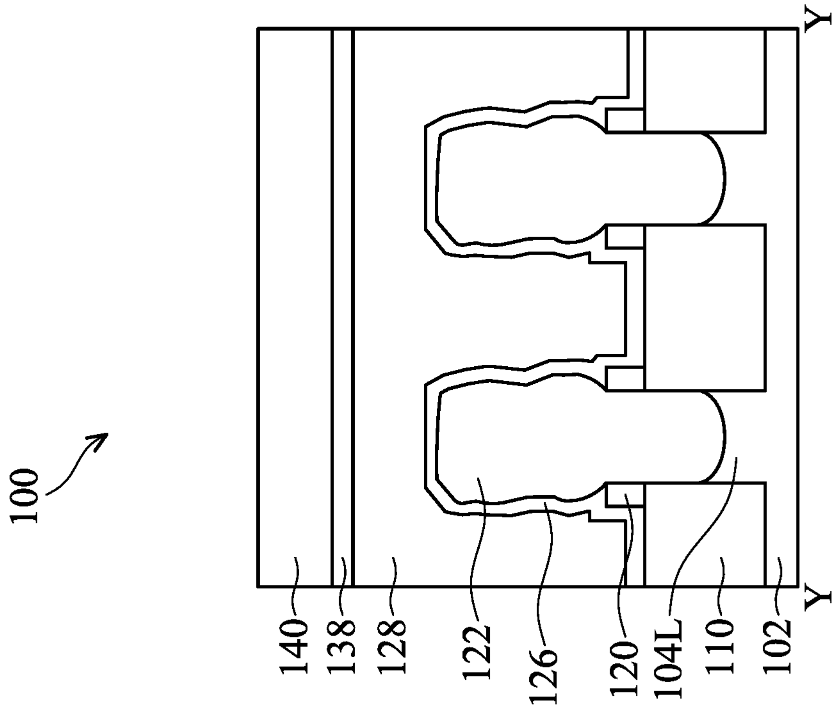
Figures 2, 2C, 3:
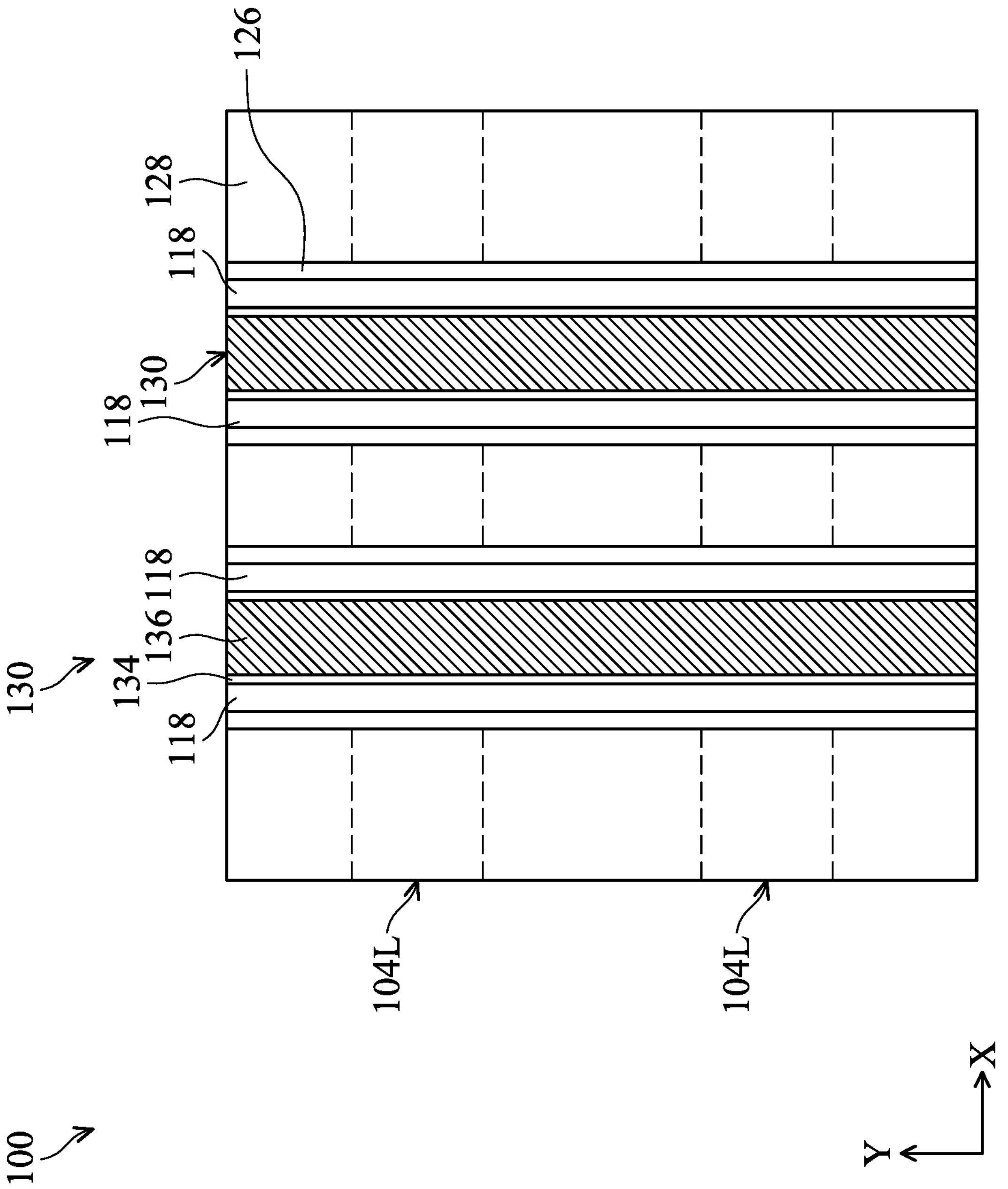

FIGS. 2C-1 and 2C-2 are cross-sectional views of the semiconductor structure 100 after the formation of final gate stacks 130, an etching stop layer 138 and a second interlayer dielectric layer 140 corresponding to line X-X and line Y-Y of FIG. 1, in accordance with some embodiments of the disclosure. FIG. 2C-3 is a plan view of the semiconductor structure 100.

One or more etching processes are performed to remove the dummy gate structures 112 to form gate trenches and remove the first semiconductor layers 106 of the active regions 104 to form gaps, in accordance with some embodiments. In some embodiments, the gate trenches expose the sidewalls of the gate spacer layers 118 facing the channel regions, in accordance with some embodiments. In some embodiments, the gaps expose the sidewalls of the inner spacer layers 124 facing the channel region. The one or more etching processes may include an anisotropic etching process such as dry plasma etching, an isotropic etching process such as dry chemical etching, remote plasma etching or wet chemical etching, or a combination thereof.

After the one or more etching processes, the four main surfaces of the second semiconductor layers 108 are exposed, in accordance with some embodiments. The exposed second semiconductor layers 108 form sets of nanostructures 108, in accordance with some embodiments. Each set includes three nanostructures 108 vertically stacked and spaced apart from one other, in accordance with some embodiments. The nanostructures 108 function as channel layers of the resulting semiconductor devices (e.g., nanostructure transistors such as GAA transistors), in accordance with some embodiments.

Final gate stacks 130 are formed in the gate trenches and gaps, thereby wrapping around the nanostructures 108, as shown in FIGS. 2C-1 and 2C-3, in accordance with some embodiments. In some embodiments, the final gate stacks 130 extend in the Y direction. That is, the final gate stacks 130 have longitudinal axes parallel to the Y direction, in accordance with some embodiments. The final gate stacks 130 engage the channel regions so that current can flow between the source/drain regions during operation.

In some embodiments, each of the final gate stacks 130 includes an interfacial layer 132, a gate dielectric layer 134 and a metal gate electrode layer 136, as shown in FIGS. 2C-1 and 2C-3, in accordance with some embodiments. The interfacial layer 132 is formed on the exposed surfaces of the nanostructures 108 and the lower fin element 104L, in accordance with some embodiments. The interfacial layer 132 wraps around the nanostructures 108, in accordance with some embodiments. In some embodiments, the interfacial layer 132 is made of a chemically formed silicon oxide. In some embodiments, the interfacial layer 132 is nitrogen-doped silicon oxide. In some embodiments, the interfacial layer 132 is formed using one or more cleaning processes such as including ozone (03), ammonia hydroxide-hydrogen peroxide-water mixture, and/or hydrochloric acid-hydrogen peroxide-water mixture. Semiconductor material from the nanostructures 108 and the lower fin elements 104L is oxidized to form the interfacial layer 132, in accordance with some embodiments.

The gate dielectric layer 134 is formed conformally along the interfacial layer 132 to wrap around the nanostructures 108, in accordance with some embodiments. The gate dielectric layer 134 is also conformally formed along the sidewalls of the gate spacer layers 118 facing the channel region, in accordance with some embodiments. The gate dielectric layer 134 is also conformally formed along the sidewalls of the inner spacers 127 facing the channel region, in accordance with some embodiments.

The gate dielectric layer 134 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Si_3N_4$, oxynitride (SiON), a combination thereof, or another suitable material. The high-k dielectric layer may be deposited using ALD, PVD, CVD, or another suitable technique.

The metal gate electrode layer 136 is formed to overfill remainders of the gate trenches and gaps, in accordance with some embodiments. In some embodiments, the metal gate electrode layer 136 is made of more than one conductive material, such as a metal, metal alloy, conductive metal oxide and/or metal nitride, another suitable conductive material, and/or a combination thereof. For example, the metal gate electrode layer 136 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 136 may be a multi-layer structure with various layer combinations of a diffusion barrier layer, a work function layer with a selected work function to enhance the device's performance (e.g., threshold voltage) for n-channel FETs or p-channel FETs, a capping layer to prevent oxidation of the work function layers, a glue layer to adhere the work function layer to the next layer, and a metal fill layer to reduce the total resistance of gate stacks, and/or another suitable layer. The metal gate electrode layer 136 may be formed using ALD, PVD, CVD, e-beam evaporation, or another suitable technique.

A planarization process such as CMP may be performed on the semiconductor structure 100 to remove the materials of the gate dielectric layer 134 and the metal gate electrode layer 136 formed above the top surface of the interlayer dielectric layer 136, in accordance with some embodiments. The final gate stacks 130 that are wrapped around the nanostructures 108 combine with the neighboring source/drain features 122 to form nanostructure transistors, e.g., n-channel nanostructure transistors and p-channel nanostructure transistors.

An etching stop layer 138 is formed over the semiconductor structure 100, as shown in FIGS. 2C-1 and 2C-2, in accordance with some embodiments. In some embodiments, the etching stop layer 138 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the etching stop layer 138 is deposited using CVD (such as LPCVD, PECVD, HDP-CVD, or HARP), ALD, another suitable method, or a combination thereof.

A second interlayer dielectric layer 140 is formed over the etching stop layer 138, as shown in FIGS. 2C-1 and 2C-2, in accordance with some embodiments. In some embodiments, the second interlayer dielectric layer 140 is made of dielectric material, such as USG, BPSG, FSG, PSG, BSG, or another suitable dielectric material. In some embodiments, the second interlayer dielectric layer 140 and etching stop layer 138 are made of different materials and have a great difference in etching selectivity. In some embodiments, the etching stop layer 138 is made of silicon nitride, and the second interlayer dielectric layer 140 is made of silicon oxide. In some embodiments, the second interlayer dielectric layer 140 is deposited using such as CVD (such as HDP-CVD, PECVD, HARP or FCVD), another suitable technique, or a combination thereof.

Figures 2, 2D:
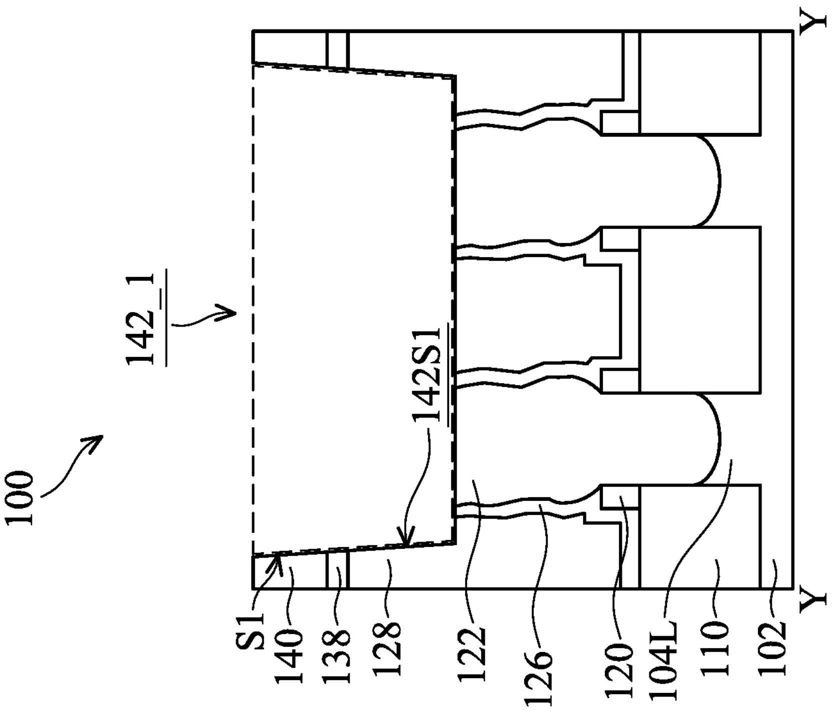
Figures 1, 2D:
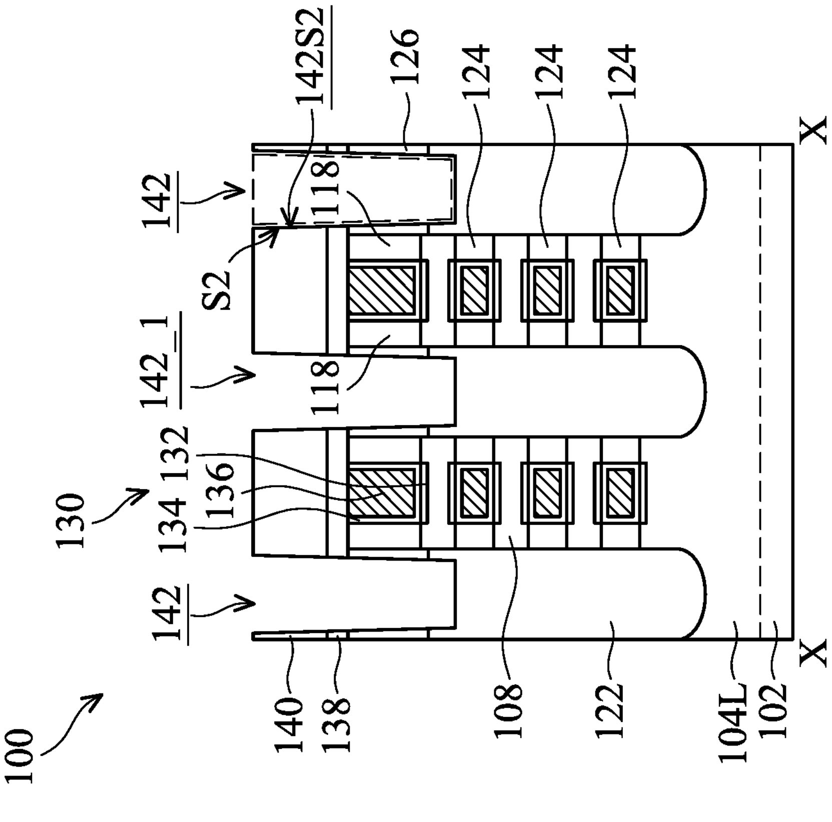
Figures 2, 2D, 3:
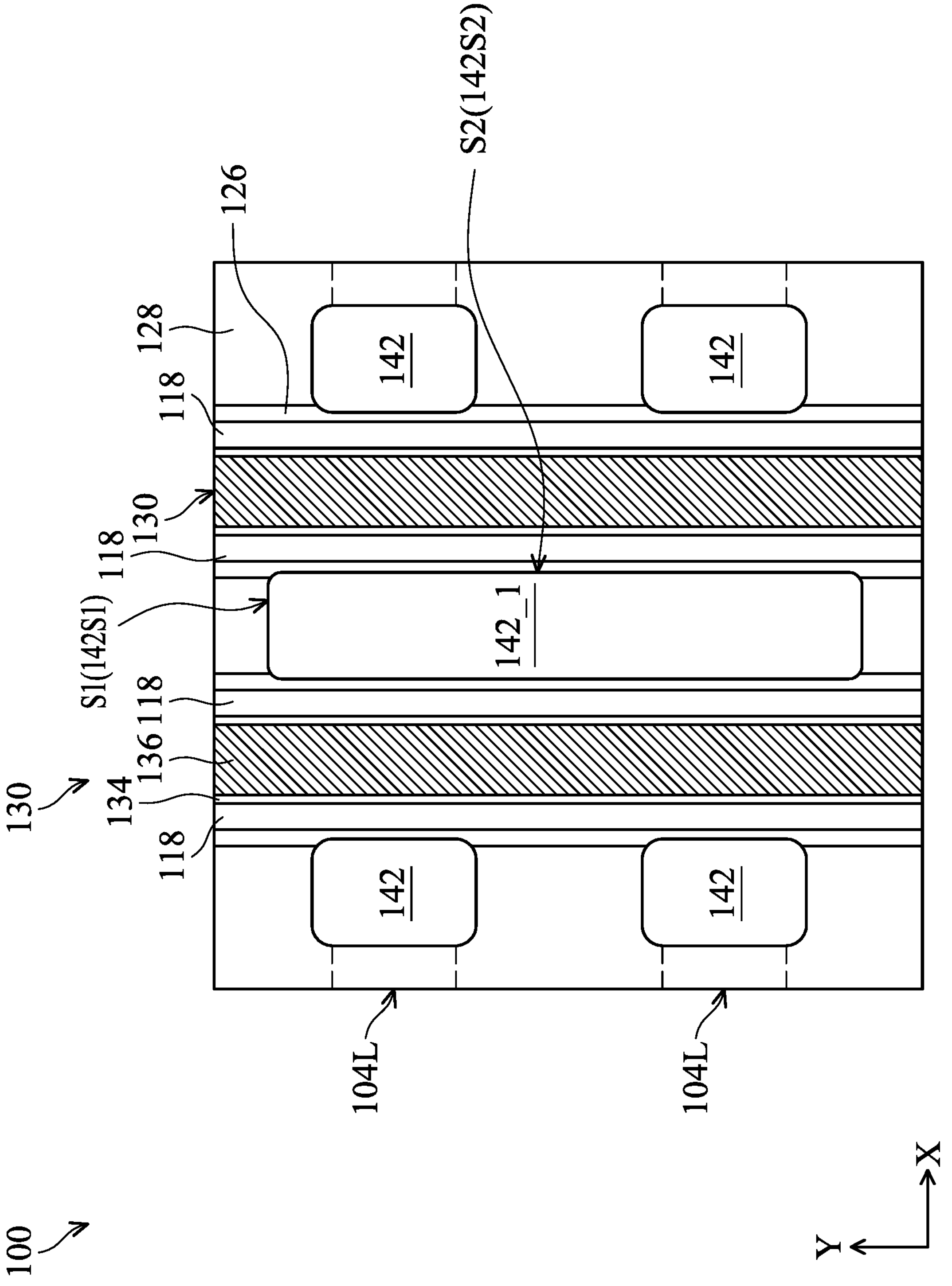

FIGS. 2D-1 and 2D-2 are cross-sectional views of the semiconductor structure 100 after the formation of contact openings 142 corresponding to line X-X and line Y-Y of FIG. 1, in accordance with some embodiments of the disclosure. FIG. 2D-3 is a plan view of the semiconductor structure 100.

The second interlayer dielectric layer 140, the etching stop layer 138, the first interlayer dielectric layer 128 and the contact etching stop layer 126 are patterned to form contact openings 142, as shown in FIGS. 2D-1 to 2D-3, in accordance with some embodiments. The contact openings 142 correspond to and expose the source/drain features 122, in accordance with some embodiments. In some embodiments, the contact openings 142 extend in the Y direction. That is, the contact openings 142 have longitudinal axes parallel to the Y direction, in accordance with some embodiments. In some embodiments, the contact opening 142_1 corresponds to two source/drain features 122.

The patterning process includes forming a photoresist (not shown) such as by using spin-on coating, and then patterning the photoresist to have opening patterns corresponding to the contact openings 142 by exposing the photoresist to light using an appropriate photomask (or reticle). Exposed or unexposed portions of the photoresist may be removed depending on whether a positive or negative resist is used. The opening patterns of the photoresist may then be transferred to the second interlayer dielectric layer 140, the etching stop layer 138, the first interlayer dielectric layer 128 and the contact etching stop layer 126, such as by using one or more suitable etch processes. The photoresist can be removed in an ashing or wet strip process, for example.

In alternative embodiments, a hard mask layer (not shown) may be formed on semiconductor structure 100. The hard mask layer may include, or be formed of, a nitrogen-free anti-reflection layer (NFARL), carbon-doped silicon dioxide (e.g., $SiO_2$:C), titanium nitride (TiN), titanium oxide (TiO), aluminum oxide (AlO), boron nitride (BN), a multilayer thereof, another suitable material, and/or a combination thereof. The hard mask layer may be etched using a patterned photoresist layer, which may be formed by the photolithography described above, thereby having the opening patterns corresponding to the contact openings 142. The patterned hard mask layer may transfer the opening patterns to the second interlayer dielectric layer 140, the etching stop layer 138, the first interlayer dielectric layer 128 and the contact etching stop layer 126, which may be accomplished by using one or more suitable etch processes.

The etch processes may include dry etching such as a reactive ion etch (RIE), neutral beam etch (NBE), inductive coupled plasma (ICP) etch, another suitable method, or a combination thereof. The etch processes may be anisotropic. In some embodiments, the source/drain features 122 may be recessed in the etching process.

The sidewalls of the contact openings 142 extending in the X direction are denoted as 142S1, as shown in FIGS. 2D-2 and 2D-3, in accordance with some embodiments. The exposed side surfaces of the second interlayer dielectric layer 140, the etching stop layer 138 and the first interlayer dielectric layer 128 extending in the X direction (i.e., defined by the sidewalls 142S1) are referred to as first side surfaces S1 of the second interlayer dielectric layer 140, the etching stop layer 138 and the first interlayer dielectric layer 128, as shown in FIGS. 2D-2 and 2D-3, in accordance with some embodiments.

The sidewalls of the contact openings 142 extending in the Y direction are denoted as 142S2, as shown in FIGS. 2D-1 and 2D-3, in accordance with some embodiments. The exposed side surfaces of the second interlayer dielectric layer 140, the etching stop layer 138 and the contact etching stop layer 126 extending in the Y direction (i.e., defined by the sidewalls 142S2) are referred to as second side surfaces S2 of the second interlayer dielectric layer 140, the etching stop layer 138 and the contact etching stop layer 126, as shown in FIGS. 2D-1 and 2D-3, in accordance with some embodiments.

In some embodiments, the corners between the first side surfaces S1 and the second side surfaces S2 may be round due to the characteristics of the etching process, as shown in FIG. 2D-3.

Figures 2, 2E:
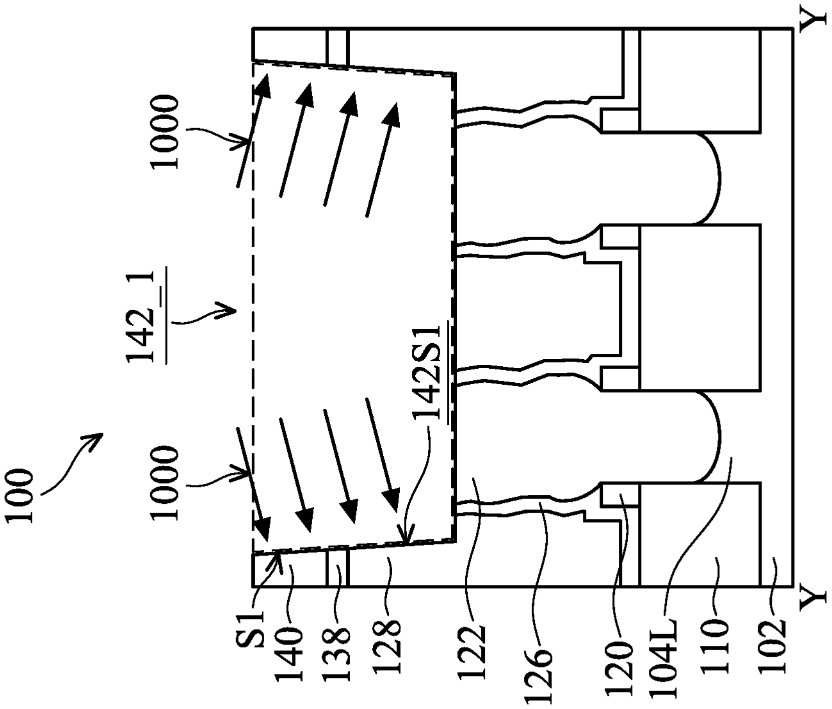
Figures 1, 2E:
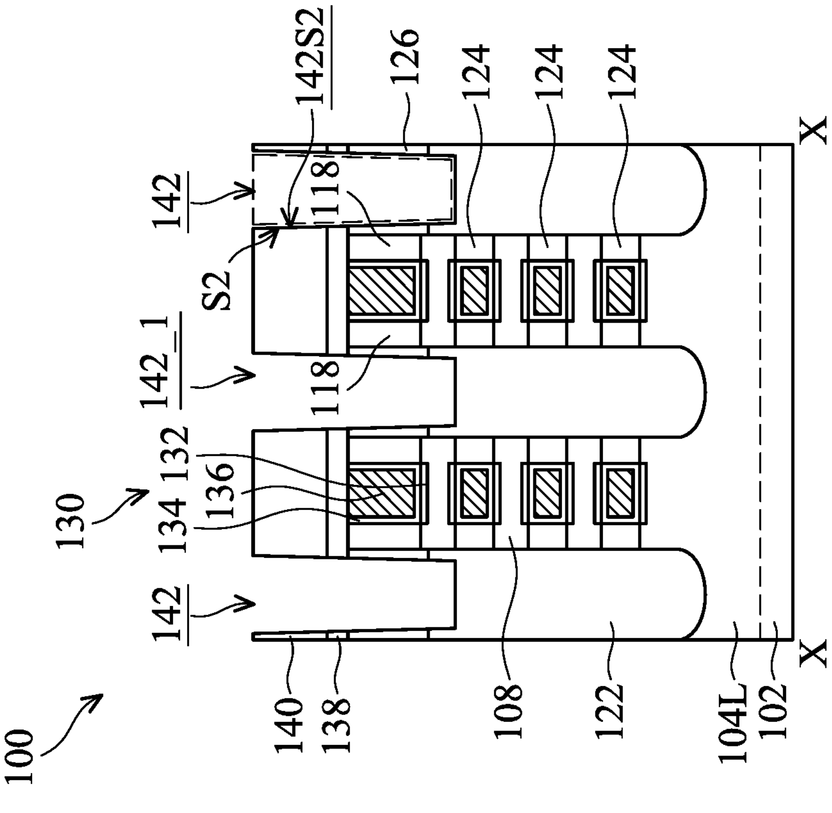
Figures 2, 2E, 3:
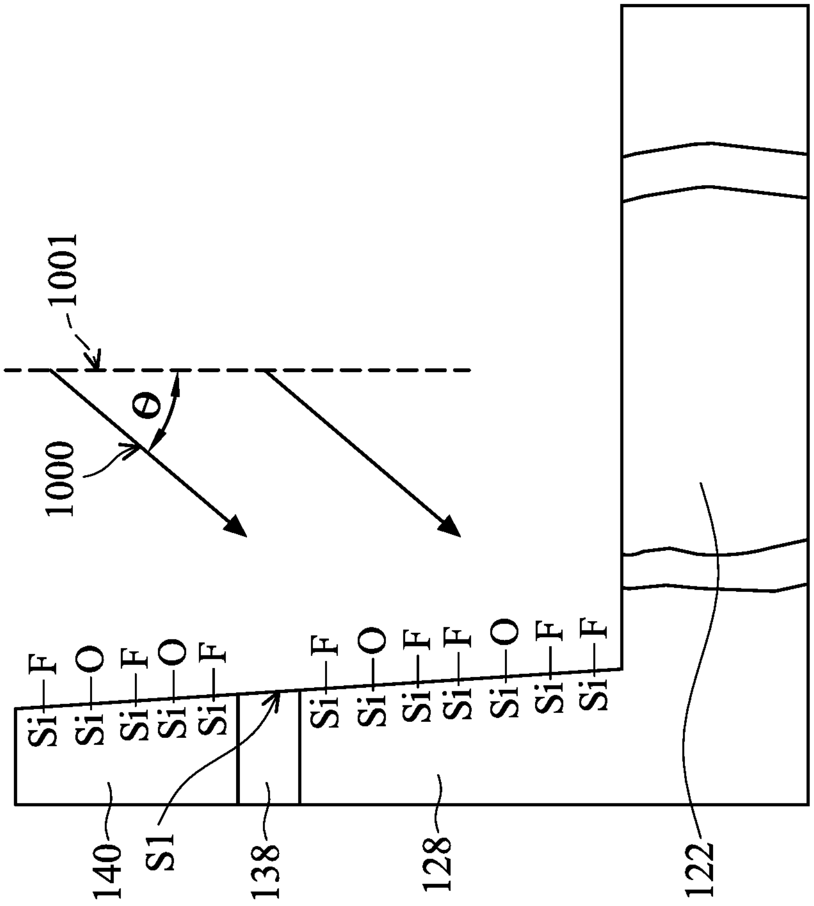

FIGS. 2E-1 and 2E-2 are cross-sectional views of the semiconductor structure 100 after an implantation process 1000 corresponding to line X-X and line Y-Y of FIG. 1, in accordance with some embodiments of the disclosure. FIG. 2E-3 is an enlarged view of FIG. 2E-2 to illustrate a surface modification of the interlayer dielectric layers 140 and 128, in accordance with some embodiments of the disclosure.

An implantation process 1000 is performed on the semiconductor structure 100 to introduce dopants through the contact openings 142 and into the second interlayer dielectric layer 140, the etching stop layer 138 and the first interlayer dielectric layer 128, as shown in FIG. 2E-2, in accordance with some embodiments. The implantation process 1000 is used to treat the exposed first side surfaces S1 of the second interlayer dielectric layer 140, the etching stop layer 138 and the first interlayer dielectric layer 128, in accordance with some embodiments.

The implantation process 1000 may be performed using a high-current ion implanter, or the like. In the implantation process 1000, implantation species (or dopants) are introduced using various ion species that are ionized and accelerated to inject into the second interlayer dielectric layer 140, the etching stop layer 138 and the first interlayer dielectric layer 128 using a number of ion beams. In some embodiments, the implantation species (or dopants) may include fluorine (F), $SiF_3$, carbon (C), argon (Ar), germanium (Ge), another suitable implantation species, a combination thereof, or the like.

In some embodiments, the implantation process 1000 may performed with an energy of about 0.5 to about 3 KeV and a dose of about $1.5\times10^{15}$ to about $4.5\times10^{15}$ $cm^{-2}$. The implantation process 1000 may direct the implantation species (or dopants) at a tilt angle θ1 with respect to the axis 1001 perpendicular to the major surface of the substrate 102, as shown in FIG. 2E-3. In some embodiments, the tilt angle θ1 may greater than 0° and less than about 15°.

The implantation process 1000 directs the implantation species toward the exposed first side surfaces S1 in the Y direction, in accordance with some embodiments. As a result, the dopants are introduced to penetrate through the first side surfaces S1 and into the second interlayer dielectric layer 140, the etching stop layer 138 and the first interlayer dielectric layer 128. The implantation process 1000 may direct an implantation species in a non-twisting (or non-rotating) manner, in accordance with some embodiments. In some embodiments, the dopants are substantially not through the exposed second side surfaces S2, in accordance with some embodiments.

Surface properties of the exposed first side surfaces S1 of the second interlayer dielectric layer 140 and the first interlayer dielectric layer 128 are modified by the implantation process 1000, in accordance with some embodiments. For example, in some embodiments where fluorine (F) or $SiF_3$ are used as implantation species in the implantation process 1000, the implantation process 1000 induces a cleavage of silicon-oxygen (Si—O) bond of the second interlayer dielectric layer 140 and the first interlayer dielectric layer 128 on the first side surfaces S1, and induces the formation of the silicon-fluorine (Si—F) bond on the first side surfaces S1, as shown in FIG. 2E-3.

Therefore, the treated first side surfaces S1 of the second interlayer dielectric layer 140 and the first interlayer dielectric layer 128 have a different surface characteristic than the untreated second side surfaces S2 of the second interlayer dielectric layer 140, which may affect the deposition rates of a subsequent dielectric layer deposited thereon, in accordance with some embodiments.

FIG. 3 is a schematic view exhibiting various profiles of the dopant concentration of the interlayer dielectric layer 140 after the implantation process 1000, in accordance with some embodiments of the disclosure.

In some embodiments where $SiF_3$ is used as the implantation species of the implantation process 1000, the fluorine concentration of the second interlayer dielectric layer 140 has a peak concentration [X1] at the location D1 from the exposed first side surfaces S1. In some embodiments, the peak concentration [X1] is in a range from about $5\times10^{21}$ $cm^{-3}$ to $5\times10^{22}$ $cm^{-3}$, and the location D1 is in a range from about 2.5 angstrom (Å) to about 15 Å. The fluorine concentration of the second interlayer dielectric layer 140 decreases gradually from the peak concentration [X1] to the interior of the interlayer dielectric layer 140. In some embodiments, the fluorine concentration may decrease by an order of magnitude every 7.5-45 Å.

In some embodiments where fluorine (F) is used as the implantation species of the implantation process 1000, the fluorine concentration of the second interlayer dielectric layer 140 has a peak concentration [X2] at the location D2 from the exposed first side surfaces S1. In some embodiments, the peak concentration [X2] is in a range from about $1.5\times10^{21}$ $cm^{-3}$ to $1\times10^{22}$ $cm^{-3}$, and the location D2 is in a range from about 6 Å to about 35 Å. The fluorine concentration of the second interlayer dielectric layer 140 decreases gradually from the peak concentration [X2] to the interior of the interlayer dielectric layer 140. In some embodiments, the fluorine concentration may decrease by an order of magnitude every 20-120 Å.

Although not illustrated in FIG. 3, the first interlayer dielectric layer 128 may also have a similar distribution of the dopant concentration to the second interlayer dielectric layer 140. In some embodiments, the portions of the interlayer dielectric layer 140 defined from the second side surfaces S2 toward the interior of the interlayer dielectric layer 140 in the X direction are undoped, for example, having a dopant concentration less than $10^{14}$ $cm^{-3}$.

Figures 1, 2F:
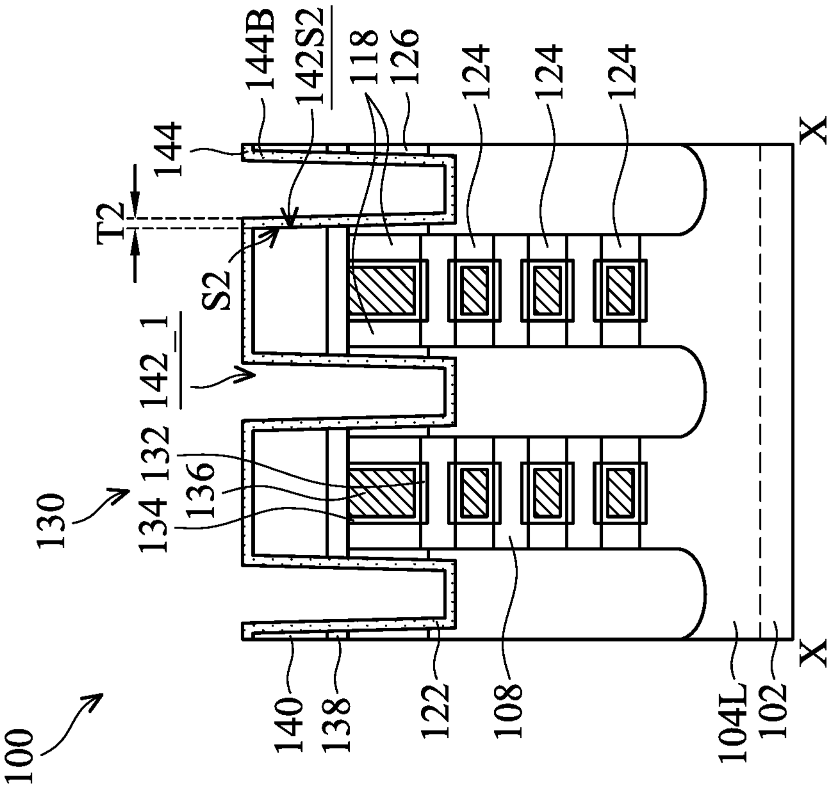
Figures 2, 2F:
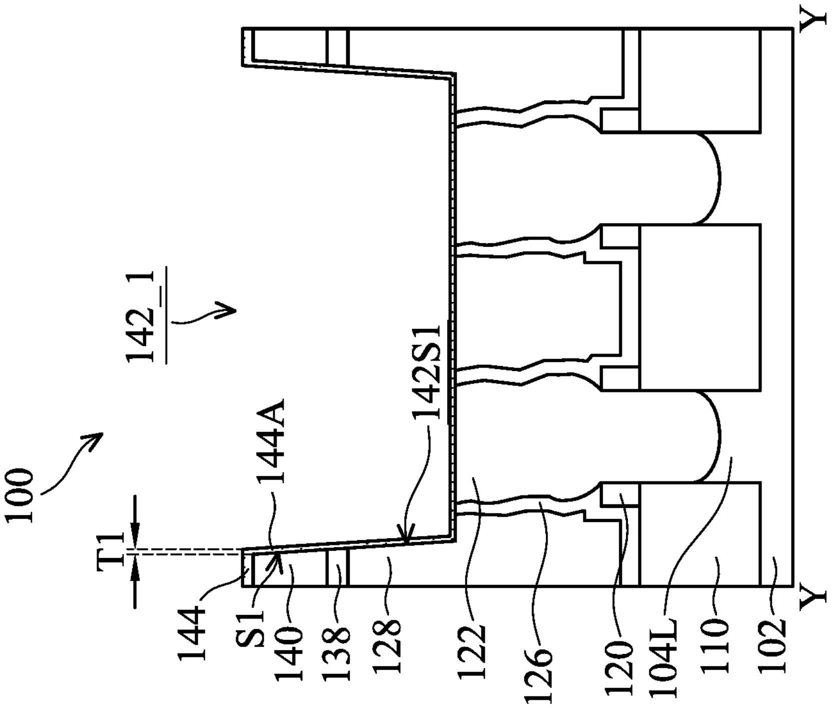
Figures 2, 2F, 3:
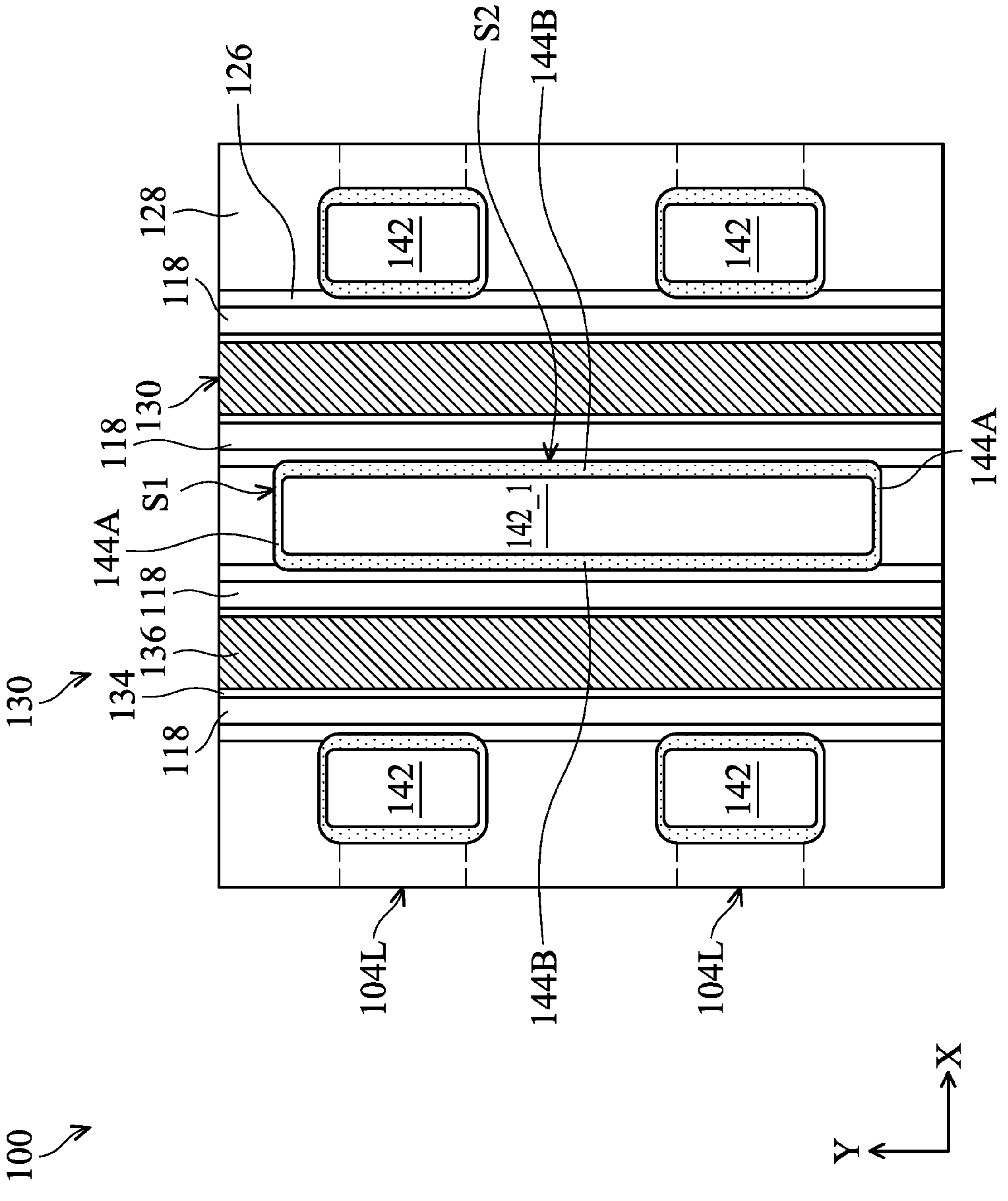

FIGS. 2F-1 and 2F-2 are cross-sectional views of the semiconductor structure 100 after the deposition of a dielectric layer 144 corresponding to line X-X and line Y-Y of FIG. 1, in accordance with some embodiments of the disclosure. FIG. 2F-3 is a plan view of the semiconductor structure 100.

A dielectric layer 144 is formed over the semiconductor structure 100 to partially fill the contact openings 142, as shown in FIGS. 2F-1 to 2F-3, in accordance with some embodiments. The dielectric layer 144 is formed along the sidewalls 142S1 and 142S2 and the bottom surfaces of the contact openings 142, the top surface of the second interlayer dielectric layer 140, in accordance with some embodiments.

In some embodiments, the dielectric layer 144 is made of silicon nitride (SiN), silicon oxycarbide (SiOC), silicon oxynitride (SiON), silicon oxide ($SiO_2$), silicon carbon nitride (SiCN), silicon oxycarbonitride (SiOCN), and/or oxygen-doped silicon carbonitride (Si(O)CN), or high-k dielectric material (e.g., with dielectric constant greater than about 7.9) such as AlO, AlON, LaO, ZrO, HfO, ZnO, ZrN, ZrAlO, TiO, TaO, YO, TaCN, or a combination thereof. In some embodiments, the dielectric layer 144 is deposited using ALD, CVD (such as LPCVD, PECVD or HDP-CVD), another suitable method, and/or a combination thereof.

The dielectric layer 144 includes first portions 144A along the first side surfaces S1 of the second interlayer dielectric layer 140, the etching stop layer 138 and the first interlayer dielectric layer 128, as shown in FIGS. 2F-2 and 2F-3, in accordance with some embodiments. The first portions 144A extend in the X direction, in accordance with some embodiments. The dielectric layer 144 also includes second portions 144B along the second side surfaces S2 of the second interlayer dielectric layer 140, the etching stop layer 138 and the contact etching stop layer 126, as shown in FIGS. 2F-1 and 2F-3, in accordance with some embodiment, in accordance with some embodiments. The second portions 144B extend in the Y direction, in accordance with some embodiments.

Because the surface properties of the first side surfaces S1 of the interlayer dielectric layers 140 and 128 are modified (e.g., having the silicon-fluorine (Si—F) bond thereon), the nucleation of dielectric material growth on first side surfaces S1 may be inhibited in the deposition process, in accordance with some embodiments. As a result, the deposition rate of the first portions 144A of the dielectric layer 144 is slower than the deposition rate of the second portions 144B of the dielectric layer 144, in accordance with some embodiments.

In some embodiments, the first portions 144A have a thickness T1 (measured in the Y direction) in a range from about 0.1 nm to about 2 nm. In some embodiments, the second portions 144B have a thickness T2 (measured in the X direction) that is equal to or greater than the thickness T1 and in a range from about 0.5 nm to about 6 nm. In some embodiments, the ratio (T1/T2) of the thickness T1 to the thickness T2 is in a range from about 0.1 to about 0.7.

In the case where the first side surfaces S1 are not treated, the first portions 144A of the dielectric layer 144 may grow with a faster deposition rate than the second portions 144B of the dielectric layer 144 due to the round corners between the first side surfaces S1 and the second side surfaces S2, which may lead to a low contact area between the subsequently formed contact plug and via. Therefore, the thinner first portions 144A of the dielectric layer 144 may improve the contact area between the contact plug and the via, in accordance with some embodiments. This will be discussed in detail later.

Figures 1, 2G:
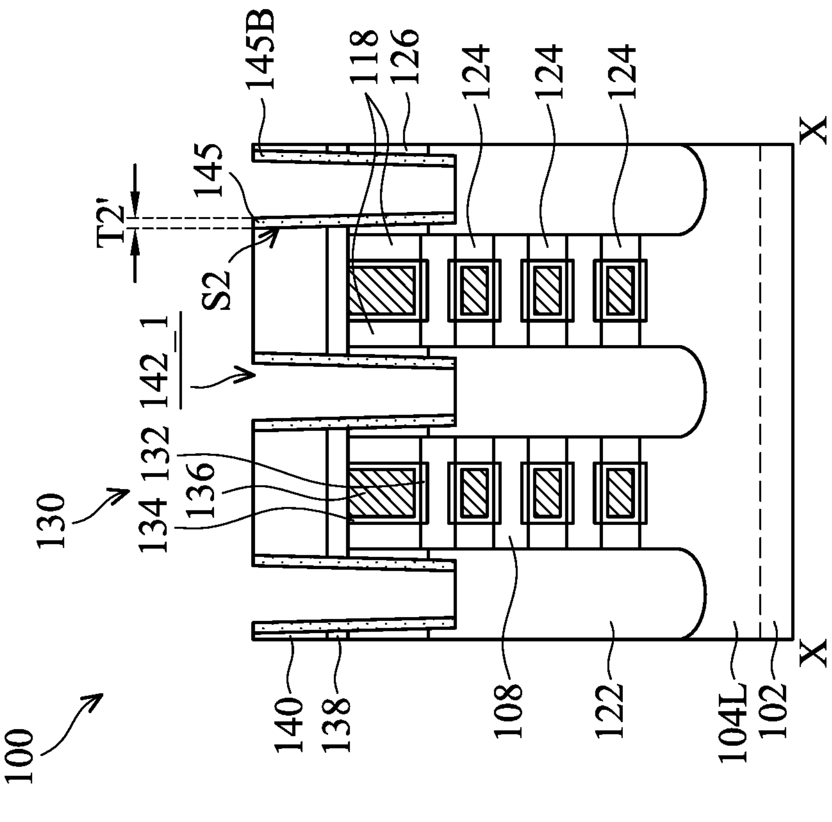
Figures 2, 2G:
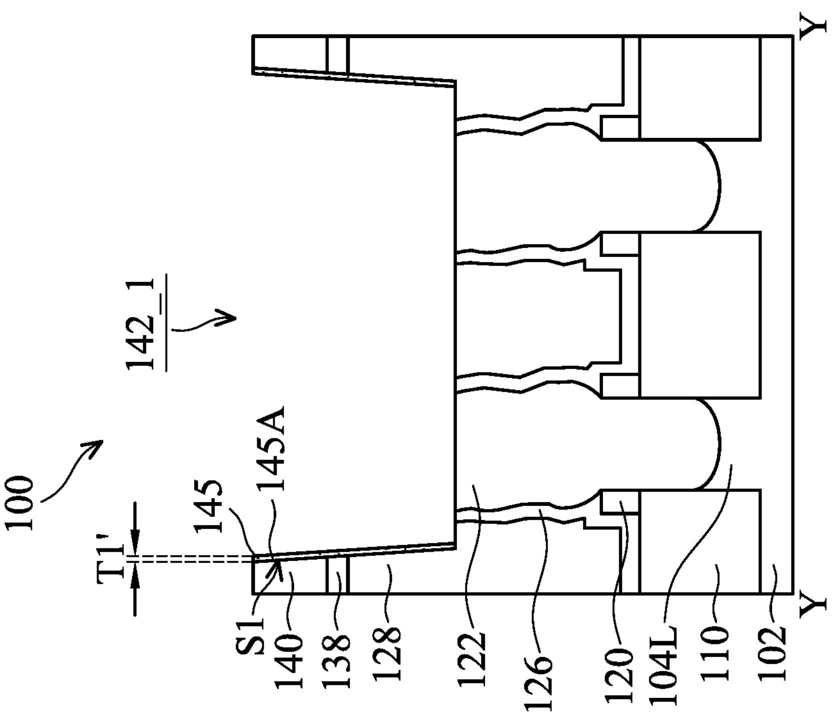
Figures 2, 2G, 3:
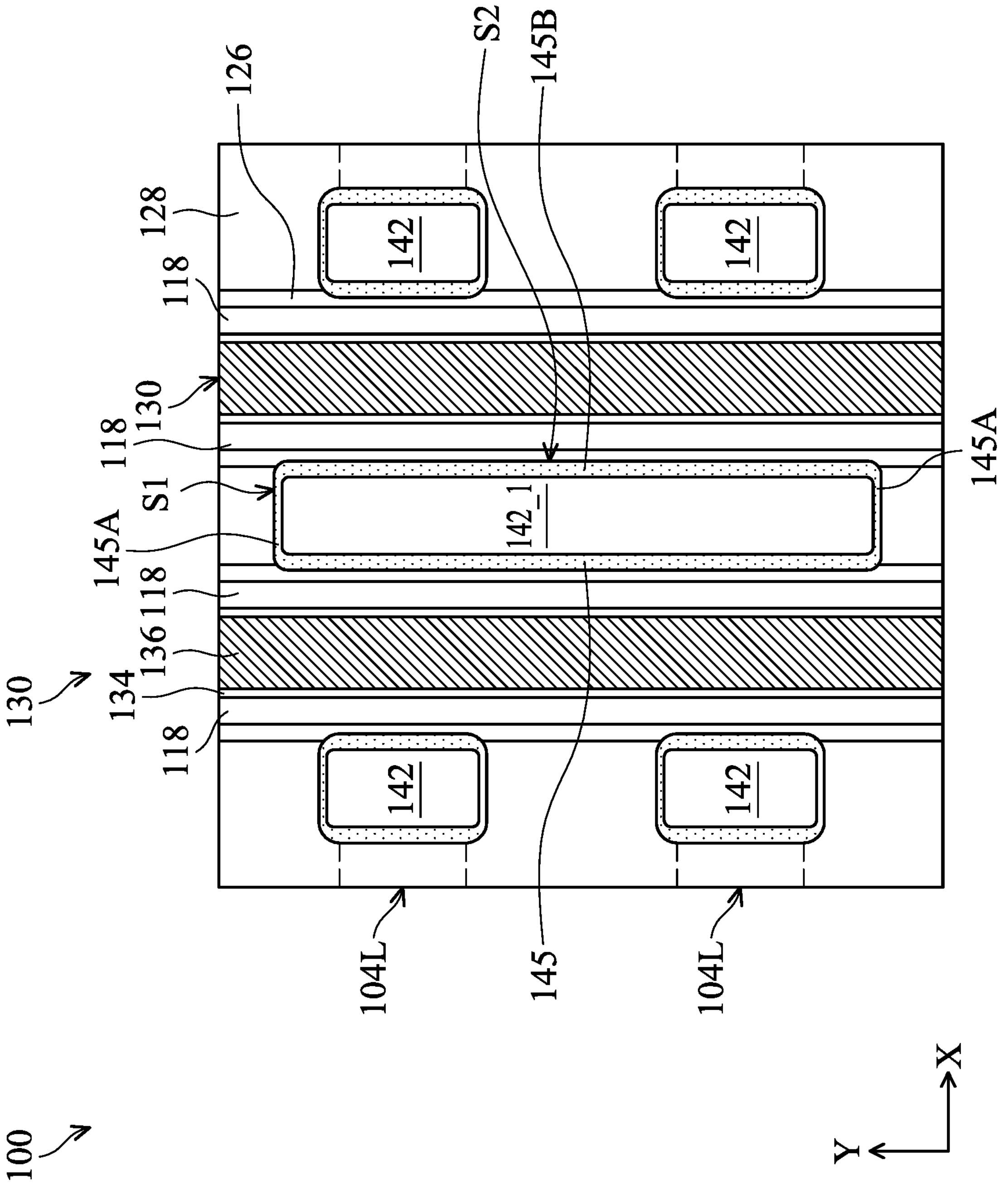

FIGS. 2G-1 and 2G-2 are cross-sectional views of the semiconductor structure 100 after an etching process corresponding to line X-X and line Y-Y of FIG. 1, in accordance with some embodiments of the disclosure. FIG. 2G-3 is a plan view of the semiconductor structure 100.

An etching process is performed on the dielectric layer 144 to remove the horizontal portions of the dielectric layer 144 along the top surfaces of the second interlayer dielectric layer 140 and the bottom surfaces of the contact openings 142, as shown in FIGS. 2G-1 and 2G-2, in accordance with some embodiments. The etching process may be an anisotropic etching process such as dry plasma etching, an isotropic etching process such as dry chemical etching, remote plasma etching or wet chemical etching, or a combination thereof. The vertical portions 144A and 144B of the dielectric layer 144 remain and are referred to as contact liners 145, as shown in FIGS. 2G-1 to 2G-3, in accordance with some embodiments. Each of the contact liners 145 is formed in the corresponding contact openings 142, in accordance with some embodiments. In some embodiments, the contact liner 145 has a closed-loop profile in the plan view.

Each of the contact liners 145 includes first portions 145A along the first side surfaces S1 of the second interlayer dielectric layer 140, the etching stop layer 138 and the first interlayer dielectric layer 128, in accordance with some embodiments. The first portions 145A extend in the X direction. Each of the contact liners 145 also includes second portions 145B along the second side surfaces S2 of the second interlayer dielectric layer 140, the etching stop layer 138, and the contact etching stop layer 126, in accordance with some embodiments. The second portions 145B extend in the Y direction, in accordance with some embodiments.

In some embodiments, each of the first portions 145A has a thickness T1' (measured in the Y direction) in a range from about 0.1 nm to about 2 nm. In some embodiments, the second portions 145B has a thickness T2' (measured in the X direction) that is equal to or greater than the thickness T1' and in a range from about 0.5 nm to about 6 nm. In some embodiments, the ratio (T1'/T2') of the thickness T1' to the thickness T2' is in a range from about 0.1 to about 0.7.

In some other embodiments, the etching process completely removes the first portions 144A of the dielectric layer 144, and thus the contact liners 145 have no first portions 145A.

Figures 2, 2H:
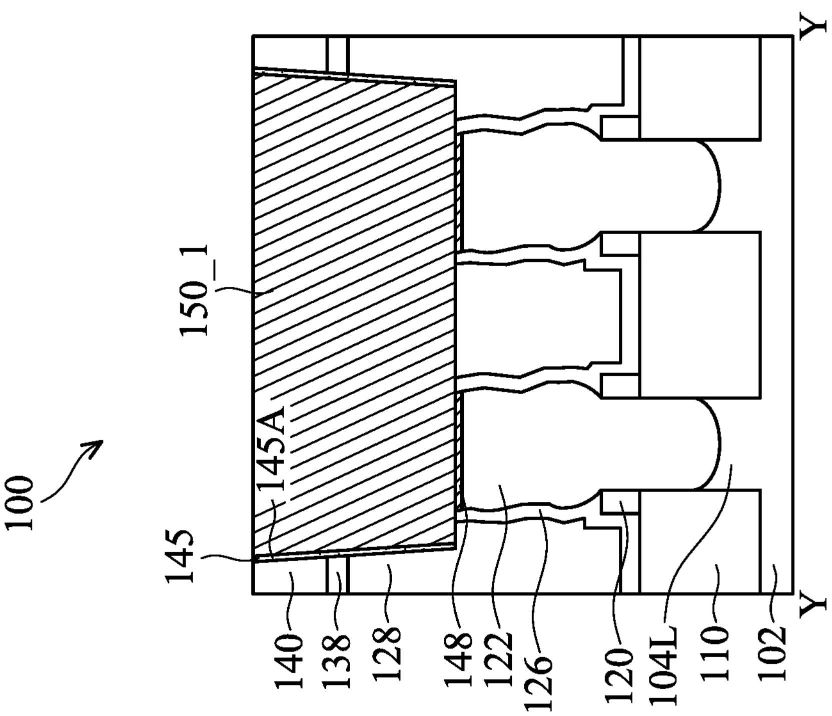
Figures 1, 2H:
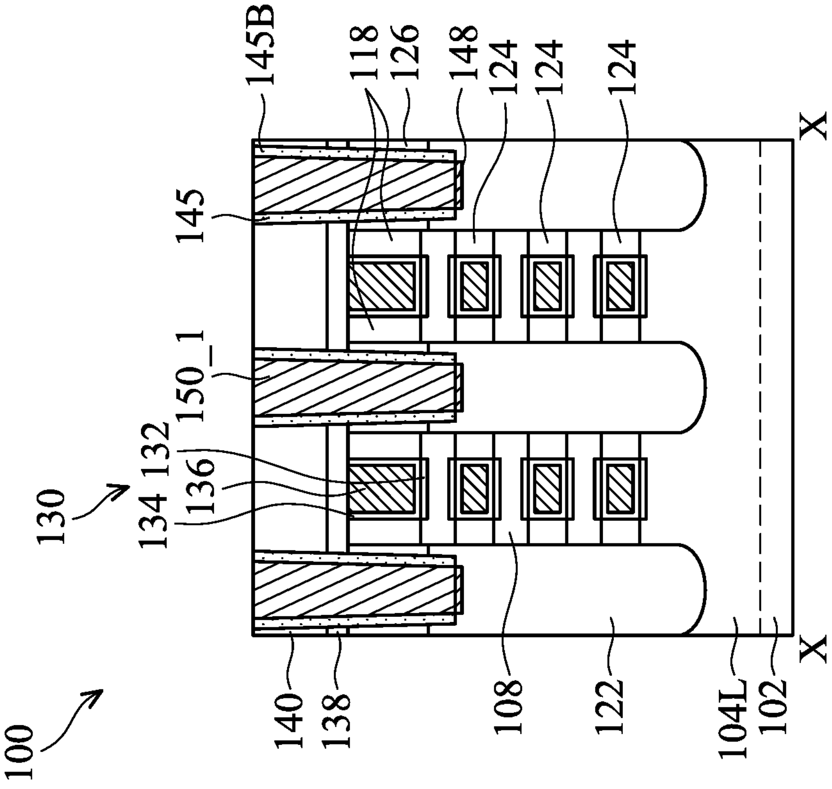
Figures 2, 2H, 3:
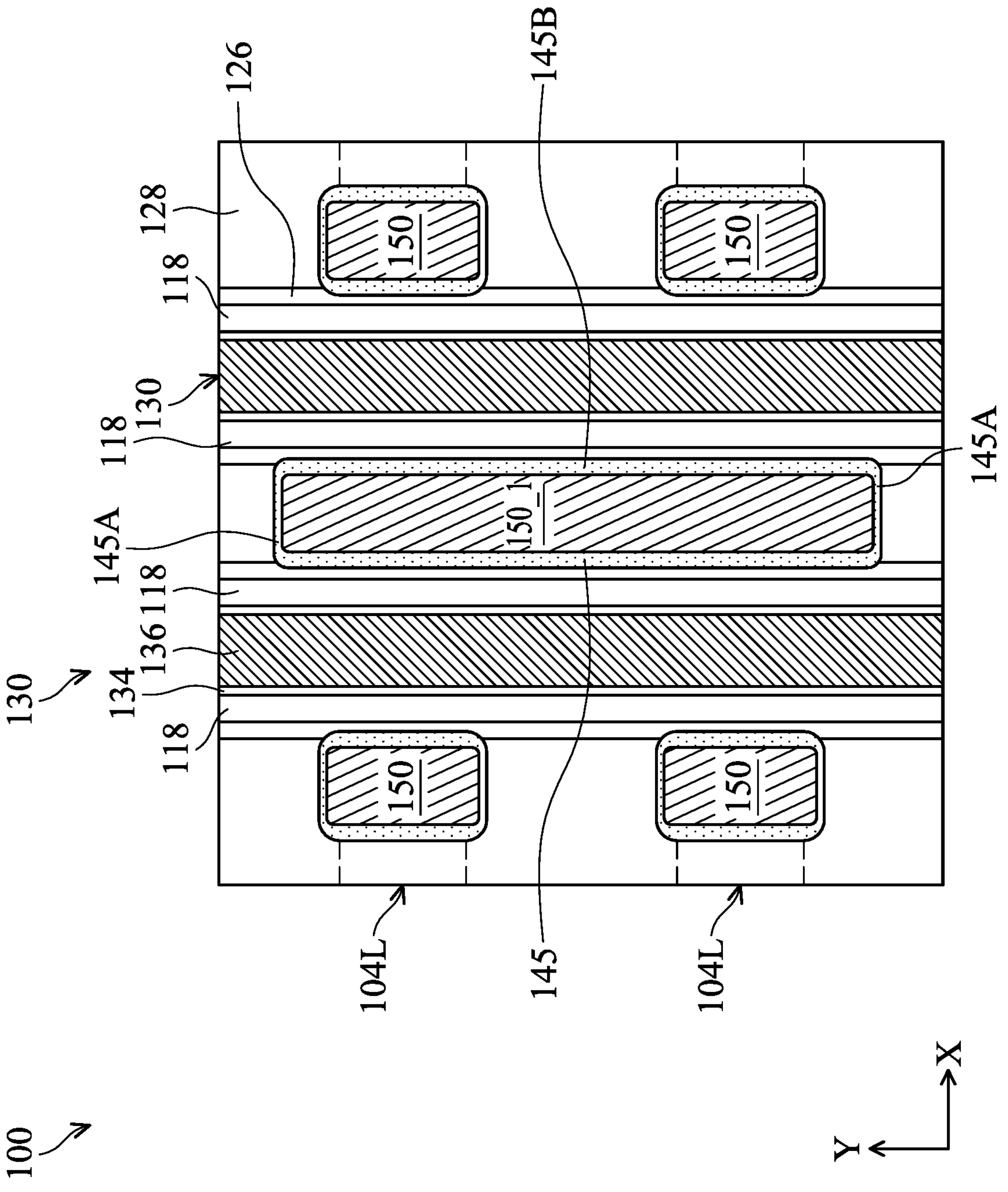

FIGS. 2H-1 and 2H-2 are cross-sectional views of the semiconductor structure 100 after the formation of salicide layers 148 and contact plugs 150 corresponding to line X-X and line Y-Y of FIG. 1, in accordance with some embodiments of the disclosure. FIG. 2H-3 is a plan view of the semiconductor structure 100.

Silicide layers 148 are formed on the exposed surfaces of the source/drain features 122, as shown in FIGS. 2H-1 and 2H-2, in accordance with some embodiments. In some embodiments, the silicide layers 148 are made of WSi, NiSi, TiSi and/or CoSi. In some embodiments, the formation of the silicide layers 148 includes cleaning the exposed surfaces of the source/drain features 122, depositing a metal material, and performing one or more annealing processes. The semiconductive material (e.g., Si) from the source/drain features 122 reacts with the metal material to form the silicide layers 148, in accordance with some embodiments. The unreacted portion of the metal material is removed using an etching process, and a post-clean process may be then performed on the silicide layers 148, in accordance with some embodiments.

Contact plugs 150 are formed in the contact openings 142, as shown in FIGS. 2H-1 to 2H-3, in accordance with some embodiments. The contact plugs 150 are nested within the contact liners 145, in accordance with some embodiments. The contact plugs 150 land on the source/drain features 122, in accordance with some embodiments. In some embodiments, the contact plugs 150_1 correspond to two source/drain features 122. In some embodiments, the contact plugs 150 extend in the Y direction. That is, the contact plugs 150 have longitudinal axes parallel to the Y direction, in accordance with some embodiments.

In some embodiments, the formation of the contact plugs 150 includes depositing one or more conductive materials for the contact plugs 150 to overfill the contact openings 142, in accordance with some embodiments. In some embodiments, one or more conductive materials are deposited using CVD, PVD, e-beam evaporation, ALD, electroplating (ECP), electroless deposition (ELD), another suitable method, or a combination thereof to overfill the contact openings. The one or more conductive materials over the top surface of the first interlayer dielectric layer 130 are planarized using, for example, CMP. After the planarization process, the top surfaces of the contact plugs 150 and the second interlayer dielectric layer 140 are substantially coplanar, in accordance with some embodiments.

The contact plugs 150 may have a multilayer structure including, for example, lining layers, barrier/adhesive layers, seed layers, metal bulk layers, another suitable layer, or a combination thereof. For example, a barrier/adhesive layer (not shown) may optionally be deposited along the sidewalls and the bottom surfaces of the contact openings 142. The barrier/adhesive layer is used to prevent the metal from the subsequently formed metal material from diffusing into the dielectric material (e.g., the first interlayer dielectric layer 130) and/or to improve adhesion between the subsequently formed metal material and the dielectric material (e.g., the first interlayer dielectric layer 130. The barrier/adhesive layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

A metal bulk layer is then deposited on the barrier/adhesive layer (if formed) to fill the remainder of the contact openings 142. In some embodiments, the metal bulk layer is made of one or more conductive materials, such as cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), or a combination thereof.

Figures 2, 2I:
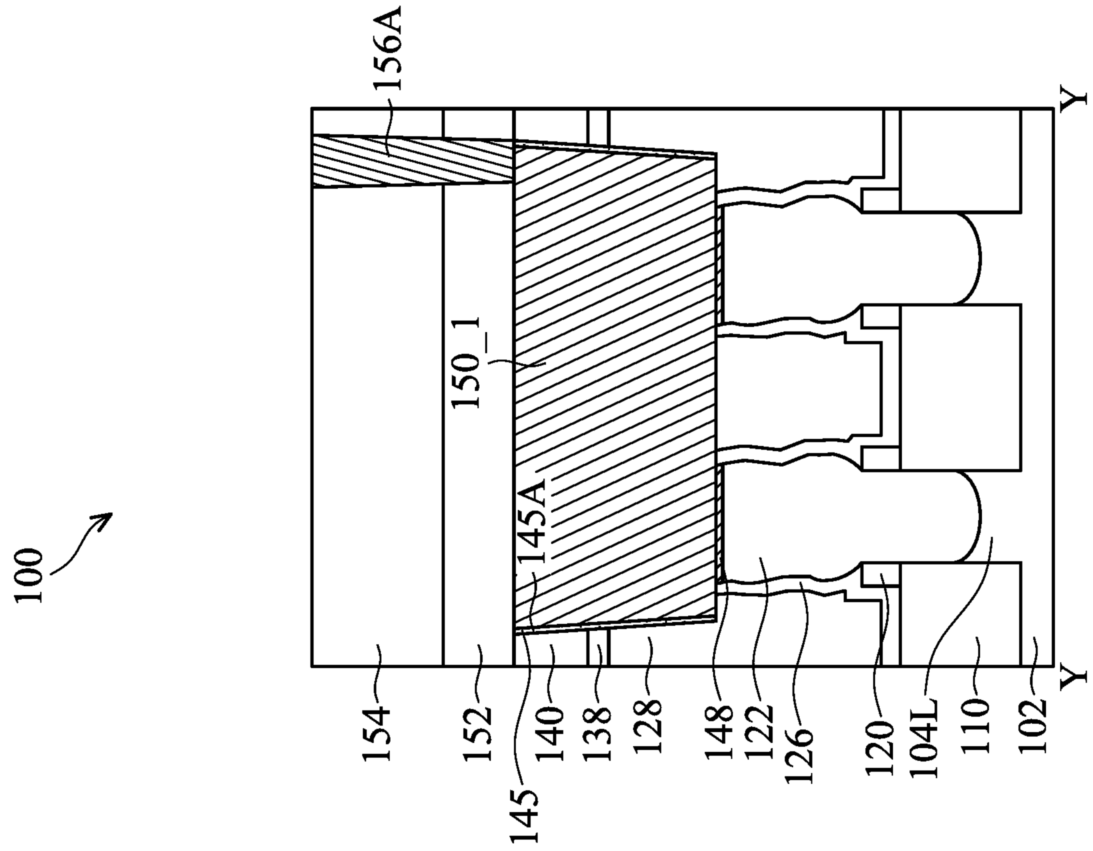
Figures 1, 2I:
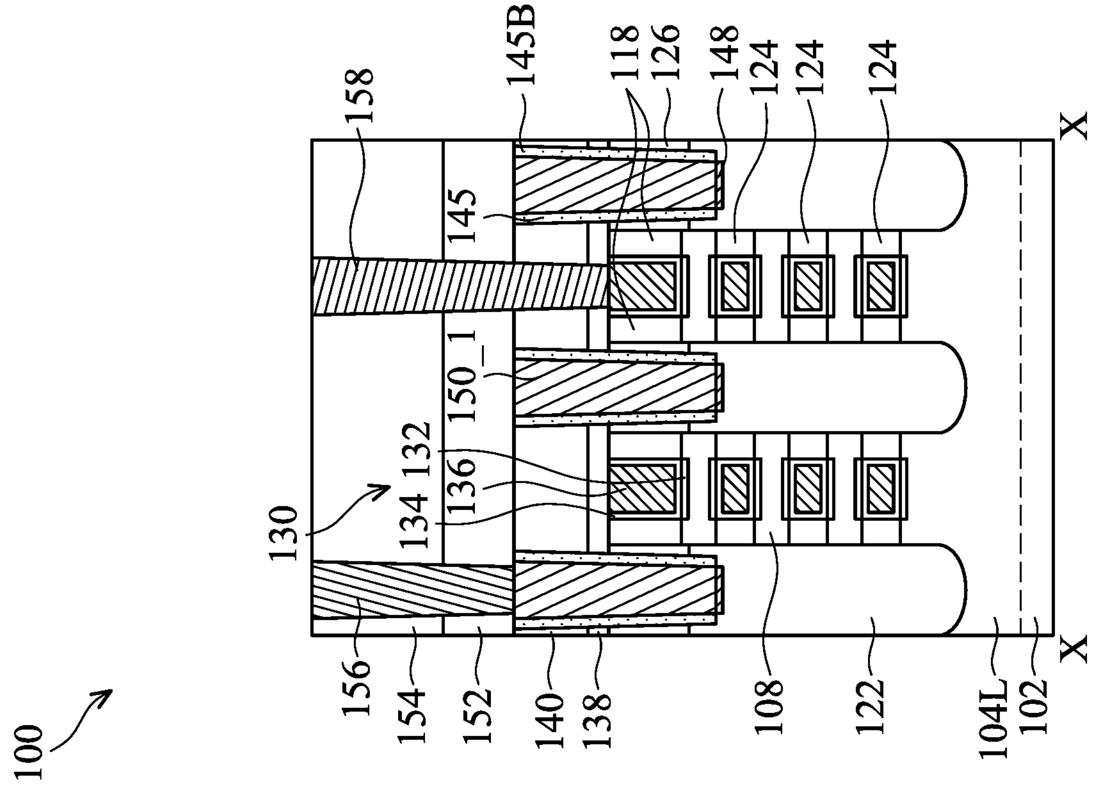
Figures 2, 2I, 3:
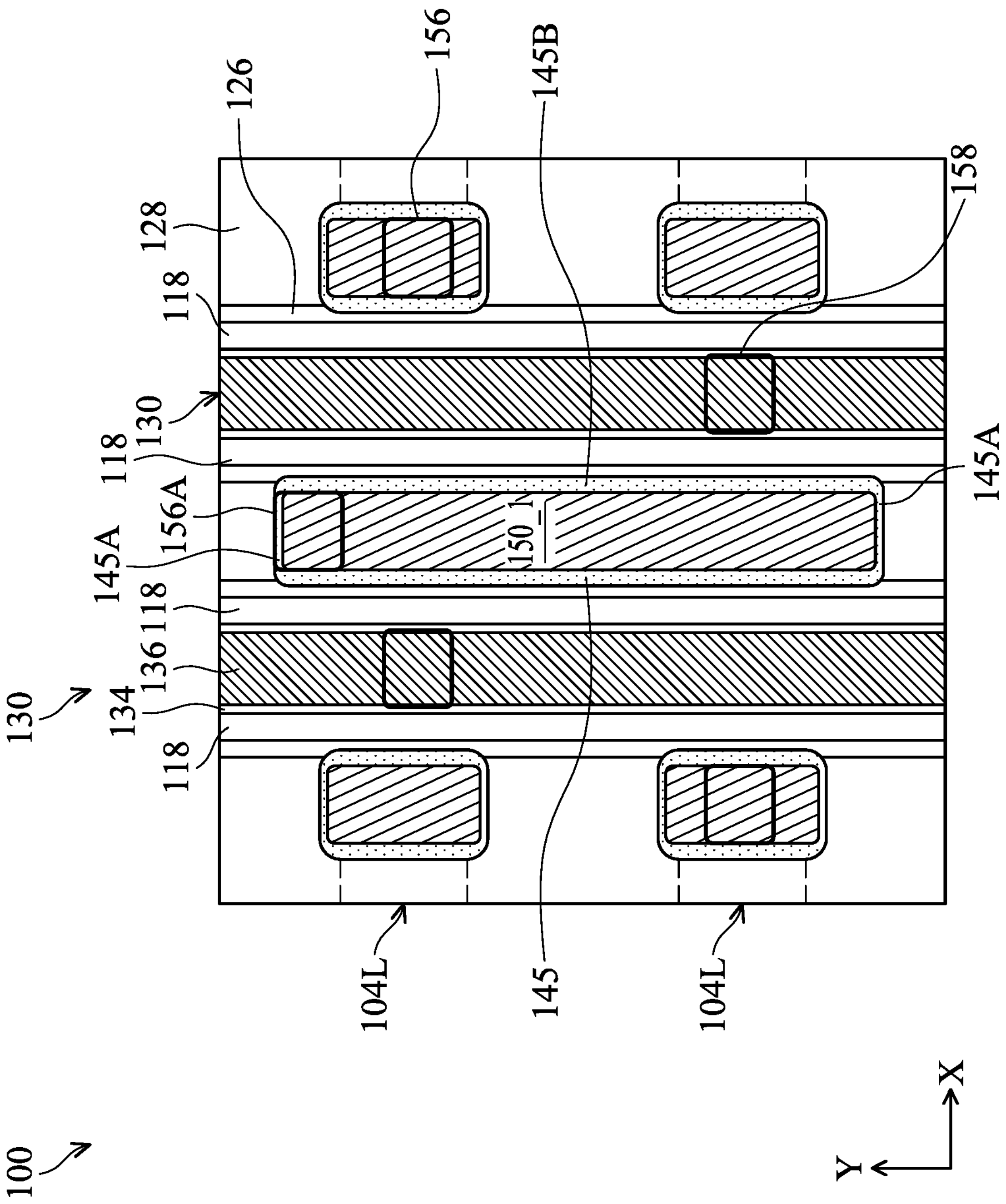

FIGS. 2I-1 and 2I-2 are cross-sectional views of the semiconductor structure 100 after the formation of an etching stop layer 152, a third interlayer dielectric layer 154 and vias 156 and 158 corresponding to line X-X and line Y-Y of FIG. 1, in accordance with some embodiments of the disclosure. FIG. 2I-3 is a plan view of the semiconductor structure 100.

An etching stop layer 152 is formed over the semiconductor structure 100, as shown in FIGS. 2I-1 and 2I-2, in accordance with some embodiments. In some embodiments, the etching stop layer 152 is made of dielectric material, such as silicon nitride (SiN), silicon oxynitride (SiON), silicon oxide ($SiO_2$), silicon carbide (SiC), oxygen-doped silicon carbide (SiC:O), oxygen-doped silicon carbonitride (Si(O)CN), or a combination thereof. In some embodiments, a dielectric material for the etching stop layer 152 is deposited using CVD (such as LPCVD, PECVD, HDP-CVD, or HARP), ALD, another suitable method, or a combination thereof.

A third interlayer dielectric layer 154 is formed over the semiconductor structure 100, as shown in FIGS. 2I-1 and 2I-2, in accordance with some embodiments. In some embodiments, the third interlayer dielectric layer 154 is made of dielectric material, such as USG, BPSG, FSG, PSG, BSG, or another suitable dielectric material. In some embodiments, the third interlayer dielectric layer 154 and etching stop layer 152 are made of different materials and have a great difference in etching selectivity. In some embodiments, the third interlayer dielectric layer 154 is deposited using such as CVD (such as HDP-CVD, PECVD, HARP or FCVD), another suitable technique, or a combination thereof.

Vias 156 are formed in and/or through the third interlayer dielectric layer 154 and the etching stop layer 152 and land on the contact plugs 150, and vias 158 are formed in and/or through the third interlayer dielectric layer 154, the etching stop layer 152, the second interlayer dielectric layer 140 and the etching stop layer 138 and land on the metal gate electrode layers 136 of the final gate stacks 130, as shown in FIGS. 2I-1 to 2I-3, in accordance with some embodiments.

The vias 156 are electrically connected to source/drain terminals of the nanostructure transistors through the contact plugs 150, and may be also referred to as source/drain vias (VS or VD), in accordance with some embodiments. The vias 158 are electrically connected to the metal gate electrode layers 136 of the final gate stacks 130, and may be also referred to as gate vias (VG), in accordance with some embodiments.

According to the routing of M1 metal lines, a via 156A is arranged on the end portion of the contact plug 150_1, as shown in FIGS. 2I-2 and 2I-3, in accordance with some embodiments. The via 156A covers both the contact plug 150_1 and the first portion 145A of the contact liner 145, in accordance with some embodiments. In accordance with the embodiments of the present disclosure, the first portions 145A of the contact liner 145 are formed with a relatively thin thickness T1', the via 156A has a larger contact area with the contact plug 150_1, thereby reducing the contact resistance. Therefore, the performance of the resulting semiconductor device may improve.

In addition, the second portions 145B of the contact liner 145 are formed with a relatively thick thickness T2', which may reduce the risk of leakage between the contact liner 145 and the final gate stack 130, in accordance with some embodiments. Therefore, the reliability of the resulting semiconductor device may improve.

In some embodiments, the formation of the vias 156 and 158 includes patterning the third interlayer dielectric layer 154, the etching stop layer 152, the second interlayer dielectric layer 140 and the etching stop layer 138 to form via openings (where the vias 156 and 158 are to be formed) using photolithography and etching processes. In some embodiments, the final gate stacks 130 are exposed from the via openings for the vias 158, and the contact plugs 150 are exposed from the via openings for the vias 156. The etch processes may include dry etching such as RIE, NBE, ICP etch, CCP etch, another suitable method, or a combination thereof. In some embodiments, the patterning processes for the vias 156 and the vias 158 may be formed separately.

Afterward, one or more conductive materials are deposited using CVD, PVD, e-beam evaporation, ALD, ECP, ELD, another suitable method, or a combination thereof to overfill the via openings, in accordance with some embodiments. The one or more conductive materials over the top surface of the third interlayer dielectric layer 154 are planarized using, for example, CMP. After the planarization process, the top surfaces of the vias 156 and 158 and the top surface of the second interlayer dielectric layer 152 are substantially coplanar, in accordance with some embodiments.

The vias 156 and 158 may have a multilayer structure. For example, a barrier/adhesive layer (not shown) may optionally be deposited along the sidewalls and the bottom surfaces of the via openings. The barrier/adhesive layer may be made of tantalum (Ta), tantalum nitride (TaN), titanium (Ti), titanium nitride (TiN), cobalt tungsten (CoW), another suitable material, or a combination thereof. A metal bulk layer is then deposited on the barrier/adhesive layer (if formed) to fill the remainder of the via openings. In some embodiments, the metal bulk layer is made of one or more conductive materials, such as cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), or a combination thereof.

Figures 2, 2J:
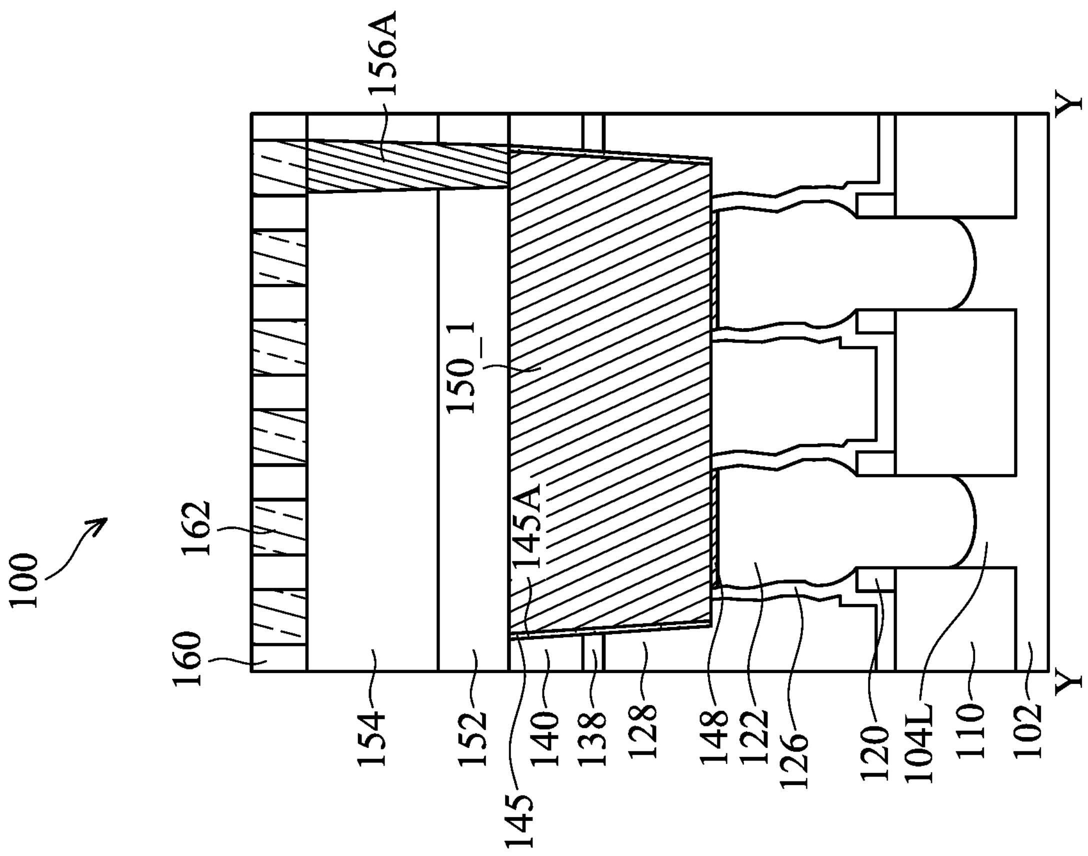
Figures 1, 2J:
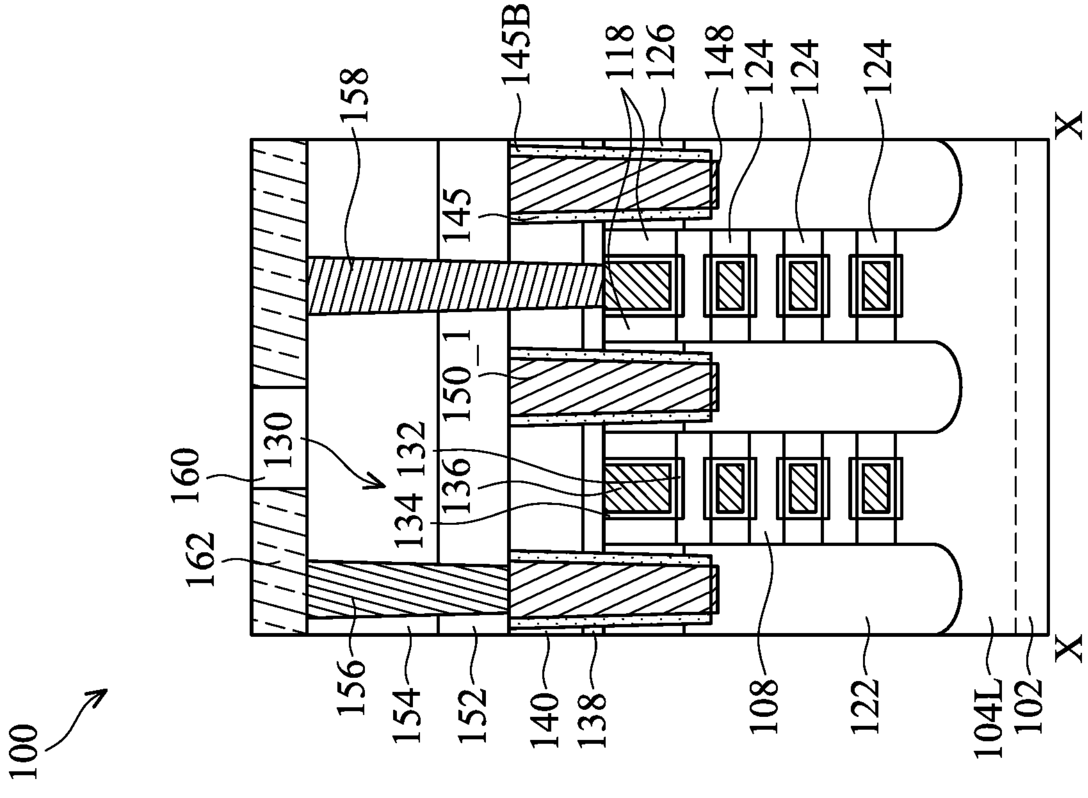
Figures 2, 2J, 3:
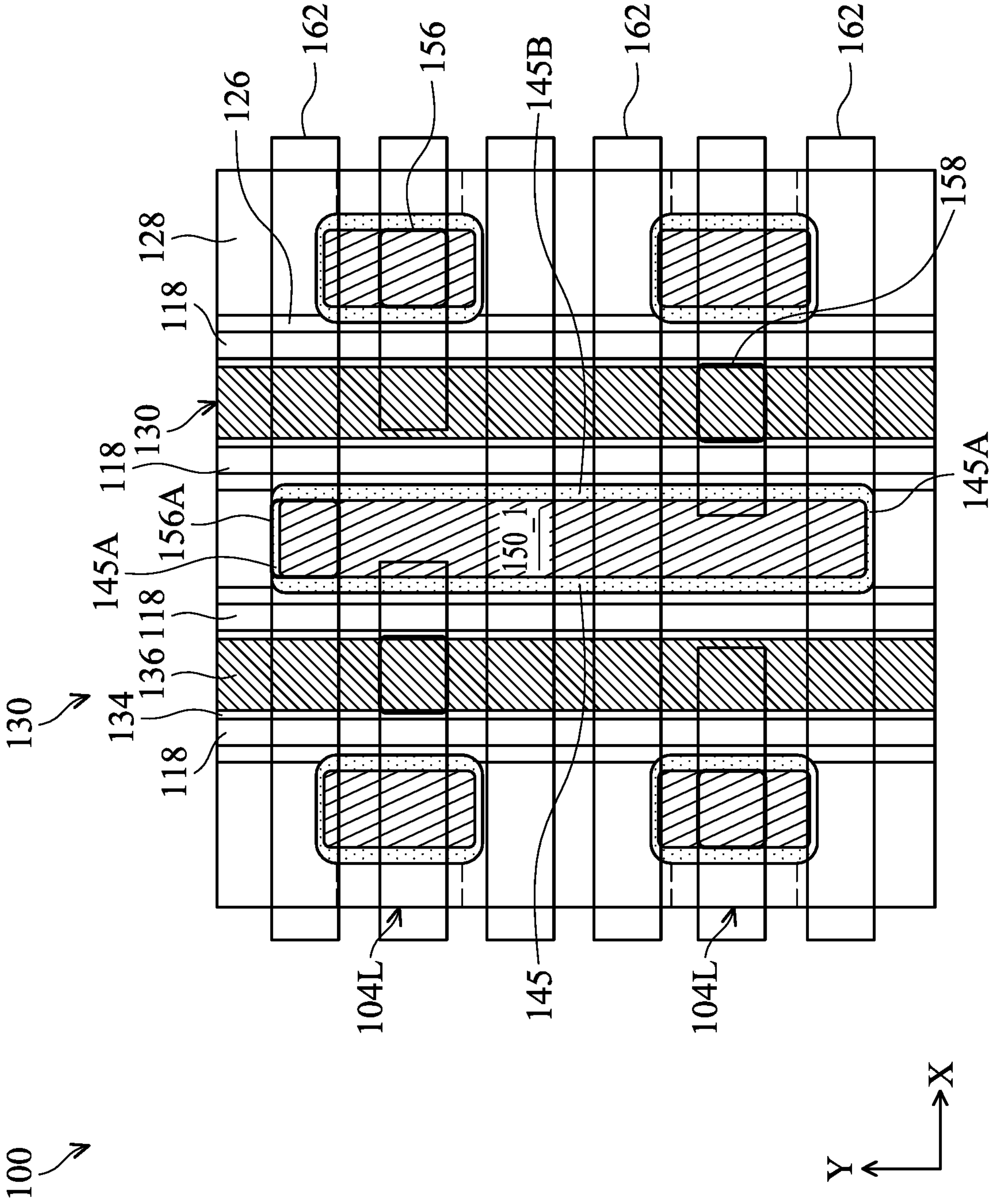
Figure 3:
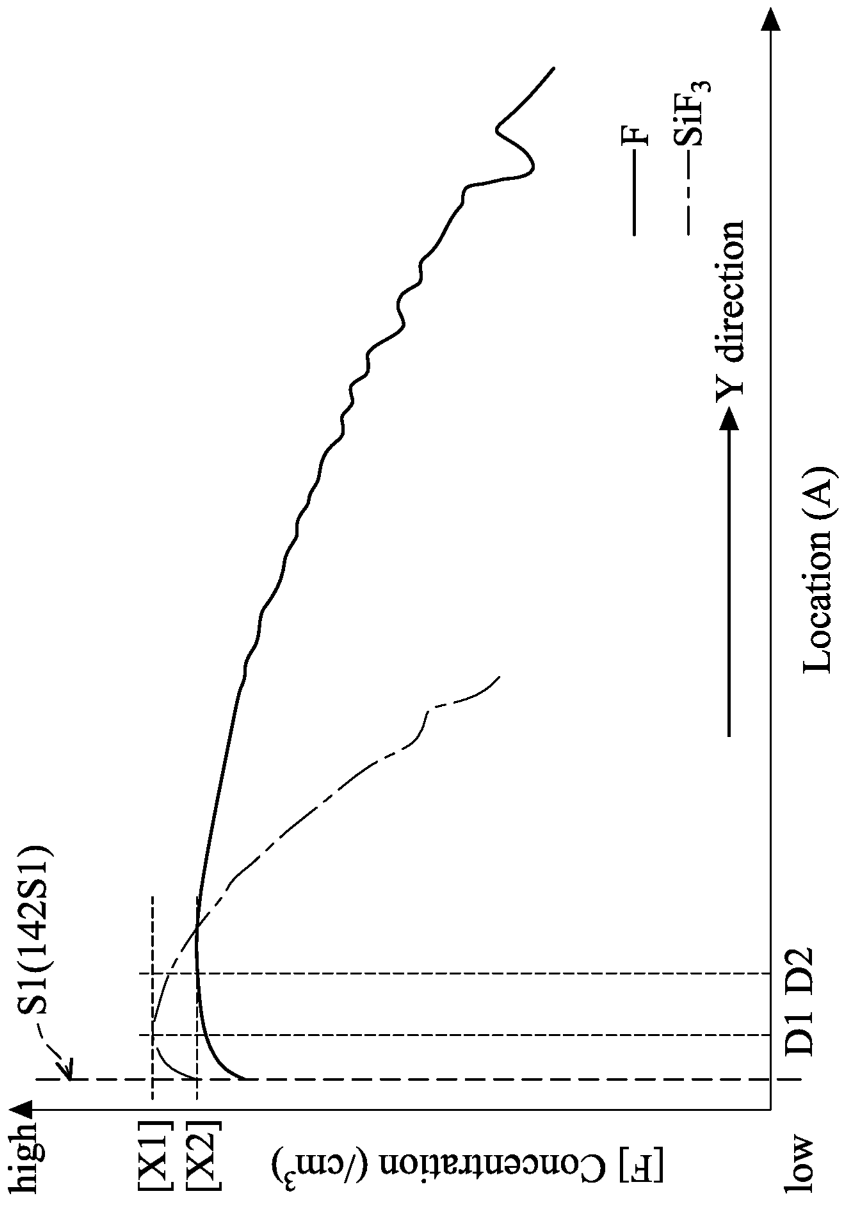

FIGS. 2J-1 and 2J-2 are cross-sectional views of the semiconductor structure 100 after the formation of an intermetal dielectric (IMD) layer 160 and a first metal layer (M1) corresponding to line X-X and line Y-Y of FIG. 1, in accordance with some embodiments of the disclosure. FIG. 2J-3 is a plan view of the semiconductor structure 100.

An intermetal dielectric layer 160 is formed over the vias 156 and 158 and the third interlayer dielectric layer 154, as shown in FIGS. 2J-1 to 2J-3, in accordance with some embodiments. In some embodiments, the intermetal dielectric layer 160 is made of one or more dielectric materials, such as silicon oxide (SiO), silicon nitride (SiN), silicon oxynitride (SiON), silicon carbide (SiC), aluminum oxide ($Al_2O_3$), dielectric material(s) with low dielectric constant (low-k) such as SiCOH, SiOCN, and/or SiOC, or a combination thereof.

In some embodiments, the intermetal dielectric layer 160 is made of an extreme low-k (ELK) dielectric material with a dielectric constant (k) less than about 3.0, or even less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SILK, or porous silicon oxide ($SiO_2$). In some embodiments, the intermetal dielectric layer 160 is formed using CVD (such as LPCVD, HARP, and FCVD), ALD, spin-on coating, another suitable method, or a combination thereof. A post-curing process (e.g., UV curing) may be performed on the as-deposited ELK dielectric material for the intermetal dielectric layer 160 to form a porous structure.

A first metal layer (M1) is formed in and/or through the intermetal dielectric layer 160, in accordance with some embodiments. The first metal layer includes several metal lines 162 e.g., power supply lines and signal lines, as shown in FIGS. 2J-1 to 2J-3, in accordance with some embodiments. The metal lines 162 are electrically connected to the vias 156 and 158, in accordance with some embodiments. The metal lines 162 extend in the X direction, in accordance with some embodiments. That is, the metal lines 162 have longitudinal axes parallel to the X direction, in accordance with some embodiments.

In some embodiments, the formation of the metal lines 162 includes patterning the intermetal dielectric layer 160 using photolithography and etching processes to form trenches (where the metal lines 162 are to be formed) through the intermetal dielectric layer 160 and exposing the vias 156 and 158. The etch processes may include dry etching such as RIE, NBE, ICP etch, CCP etch, another suitable method, or a combination thereof. One or more conductive materials for the metal lines 162 are then deposited using CVD, PVD, e-beam evaporation, ALD, ECP, ELD, another suitable method to overfill the trenches. Afterward, a planarization process such as CMP and/or an etching back process is performed to remove an excess portion of the conductive materials from the top surface of the intermetal dielectric layer 160. After the planarization process, the top surfaces of the metal lines 162 and the intermetal dielectric layer 160 are substantially coplanar, in accordance with some embodiments.

The metal lines 162 may have a multilayer structure. For example, a barrier/adhesive layer (not shown) may optionally be deposited along the sidewalls and the bottom surfaces of the trenches. The barrier/adhesive layer may be made of tantalum (Ta), tantalum nitride (TaN), titanium (Ti), titanium nitride (TiN), cobalt tungsten (CoW), another suitable material, or a combination thereof. A metal bulk layer is then deposited on the barrier/adhesive layer (if formed) to fill the remainder of the trenches. In some embodiments, the metal bulk layer is made of one or more conductive materials, such as cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

The semiconductor structure 100 may undergo further frontside BEOL processes to form various interconnection conductive features (not shown) over the semiconductor structure 100, such as metal layers and vias between neighboring two metal layers.

FIGS. 4A-1 through 4F-2 are cross-sectional views illustrating the formation of a semiconductor structure 200 at various intermediate stages. The embodiments of FIGS. 4A-1 through 4F-2 are similar to the embodiments of FIGS. 2A-1 through 2J-3, except that the implantation process 1000 is performed after the formation of the contact liners 145. FIGS. 4A-1, 4B-1, 4C-1, 4D-1, 4E-1 and 4F-1 illustrate the semiconductor structure 200 corresponding to line X-X, and FIGS. 4A-2, 4B-2, 4C-2, 4D-2, 4E-2 and 4F-2 illustrate the semiconductor structure 200 corresponding to line Y-Y of FIG. 1.

Figures 2, 4A:
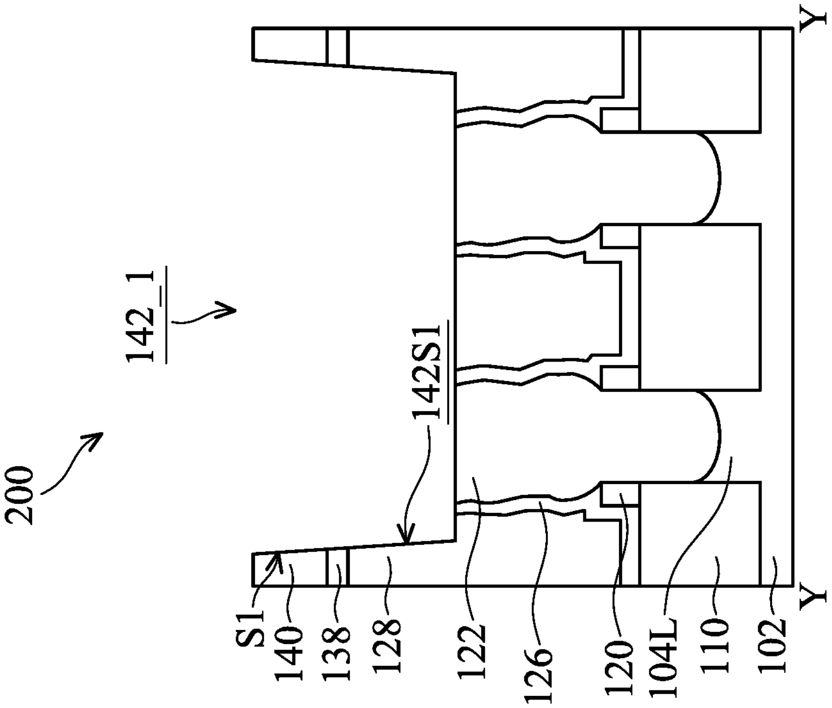
Figures 1, 4A:
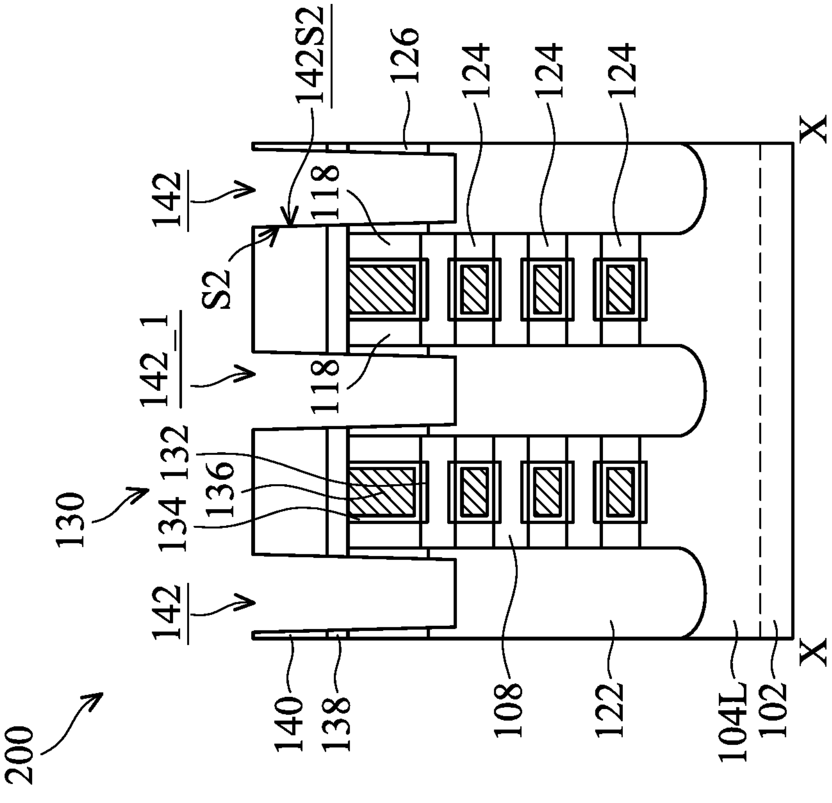

Continuing from FIGS. 2D-1 to 2D-3, the second interlayer dielectric layer 140, the etching stop layer 138, the first interlayer dielectric layer 128 and the contact etching stop layer 126 are patterned to form contact openings 142, as shown in FIGS. 4A-1 and 4A-2, in accordance with some embodiments.

Figures 2, 4B:
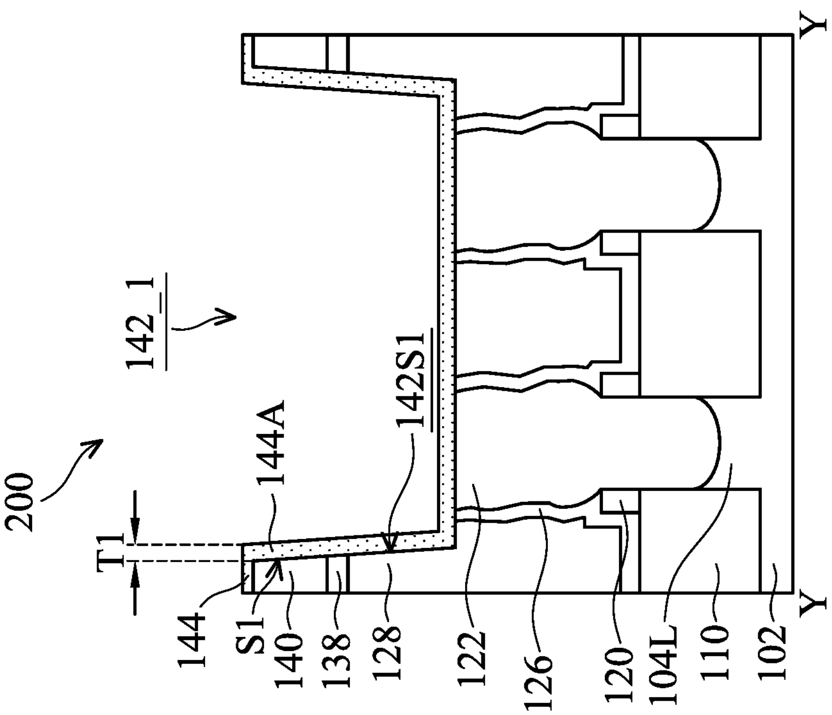
Figures 1, 4B:
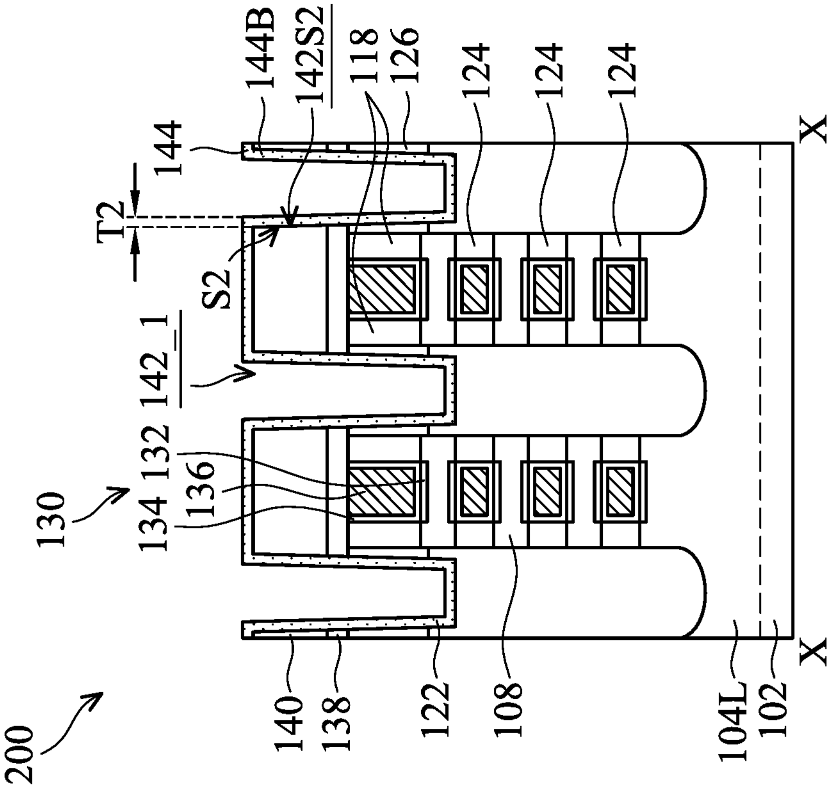

A dielectric layer 144 is formed over the semiconductor structure 100 to partially fill the contact openings 142, as shown in FIGS. 4B-1 to 4B-2, in accordance with some embodiments. In some embodiments, the first portions 144A of the dielectric layer 144 have a thickness T1 (measured in the Y direction) in a range from about 0.5 nm to about 10 nm. In some embodiments, the second portions 144B of the dielectric layer 144 have a thickness T2 (measured in the X direction) that is equal to or thinner than the thickness T1 and in a range from about 0.5 nm to about 6 nm. In some embodiments, the ratio (T1/T2) of the thickness T1 to the thickness T2 is in a range from about 1 to about 5.

Figures 1, 4C:
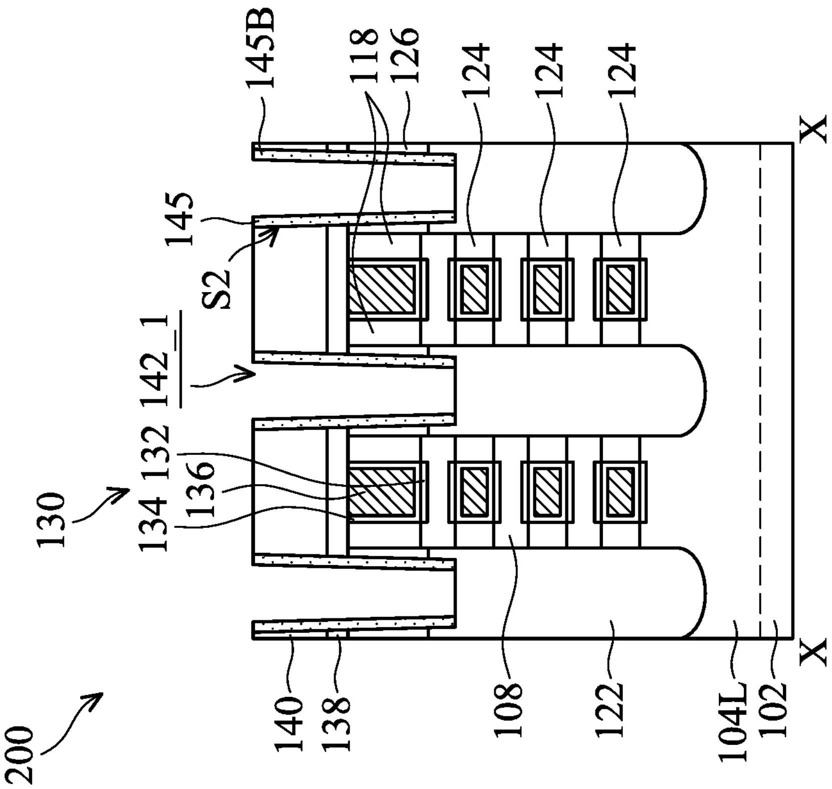
Figures 2, 4C:
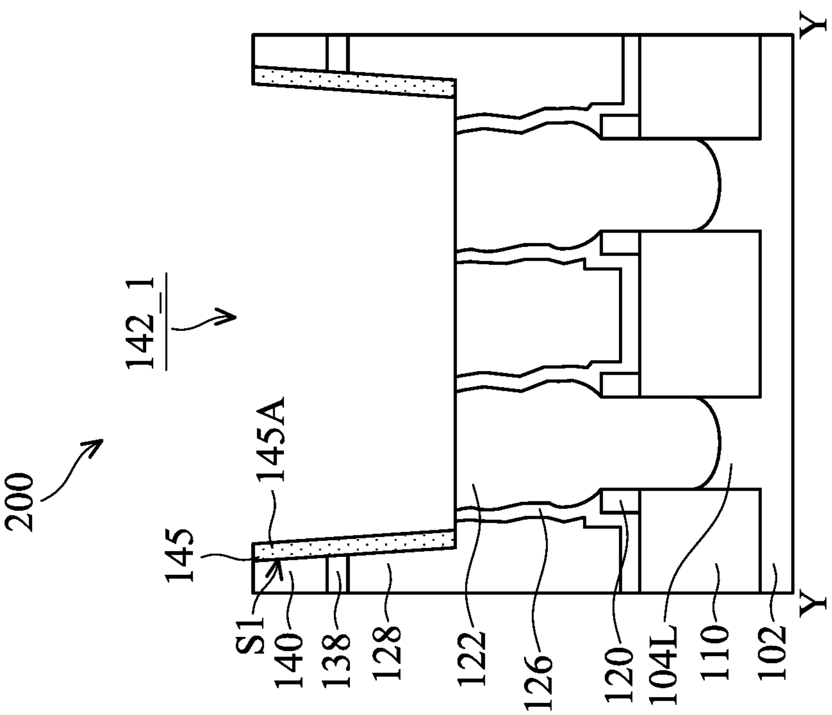

An etching process is performed on the dielectric layer 144 to remove the horizontal portions of the dielectric layer 144 along the top surfaces of the second interlayer dielectric layer 140 and the bottom surfaces of the contact openings 142, as shown in FIGS. 4C-1 and 4C-2, in accordance with some embodiments. The vertical portions 144A and 144B of the dielectric layer 144 remain and are referred to as contact liners 145, in accordance with some embodiments. Each of the contact liners 145 is formed in the corresponding contact openings 142, in accordance with some embodiments.

Figures 2, 4D:
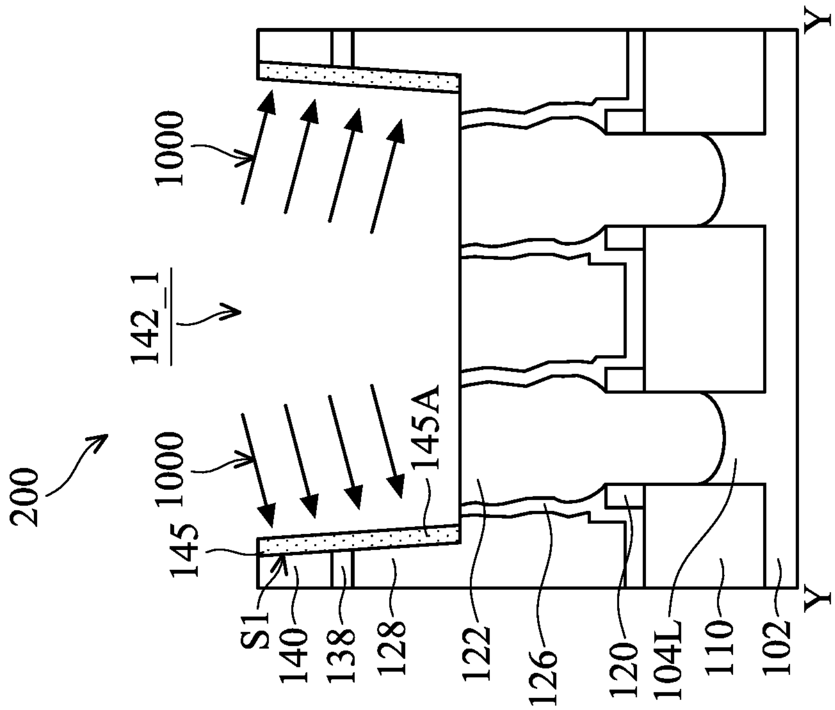
Figures 1, 4D:
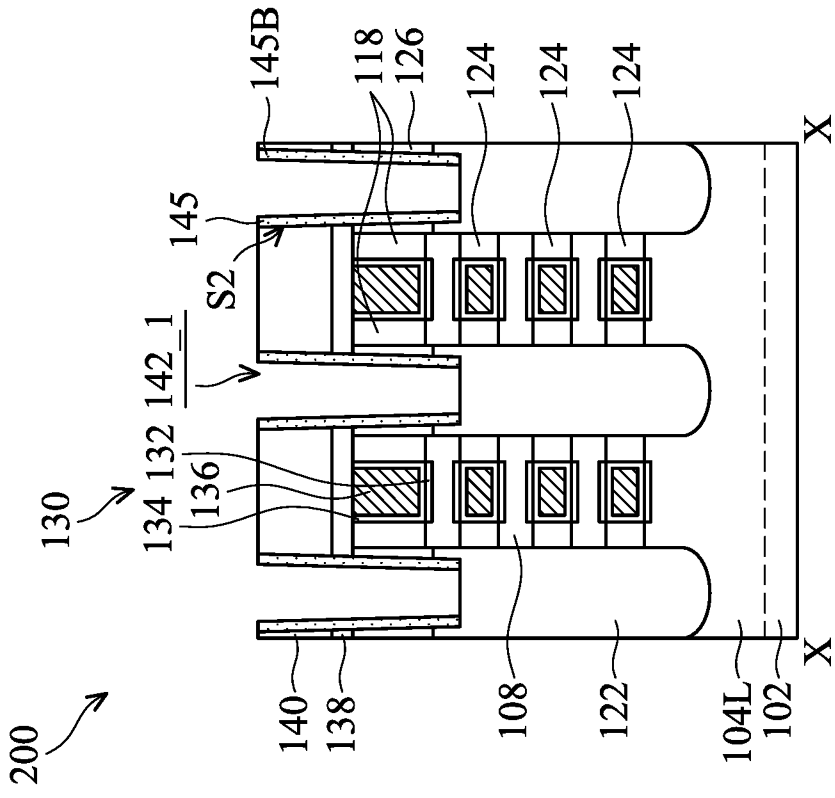

An implantation process 1000 is performed on the semiconductor structure 200 to introduce dopants through the contact openings 142 and into the first portions 145A of the contact liners 145, as shown in FIG. 4D-2, in accordance with some embodiments. The implantation process 1000 directs the implantation species (e.g., fluorine (F), $SiF_3$, carbon (C), argon (Ar), germanium (Ge), another suitable implantation species, a combination thereof, or the like) toward the first side surfaces S1 in the Y direction, in accordance with some embodiments. The implantation process 1000 may direct an implantation species in a non-twisting (or non-rotating) manner, in accordance with some embodiments. In some embodiments, the second portions 145B of the contact liners 145 are undoped.

The dopants are introduced toward the first side surfaces S1 and doped into the first portions 145A of the contact liners 145, in accordance with some embodiments. As a result, the doped first portions 145A of the contact liners 145 have a different etching selectivity than the undoped second portions 145B of the contact liners 145, in accordance with some embodiments. In some embodiments, the dopant concentration of first portions 145A is higher than the dopant concentration of the second portions 145B.

Figures 2, 4E:
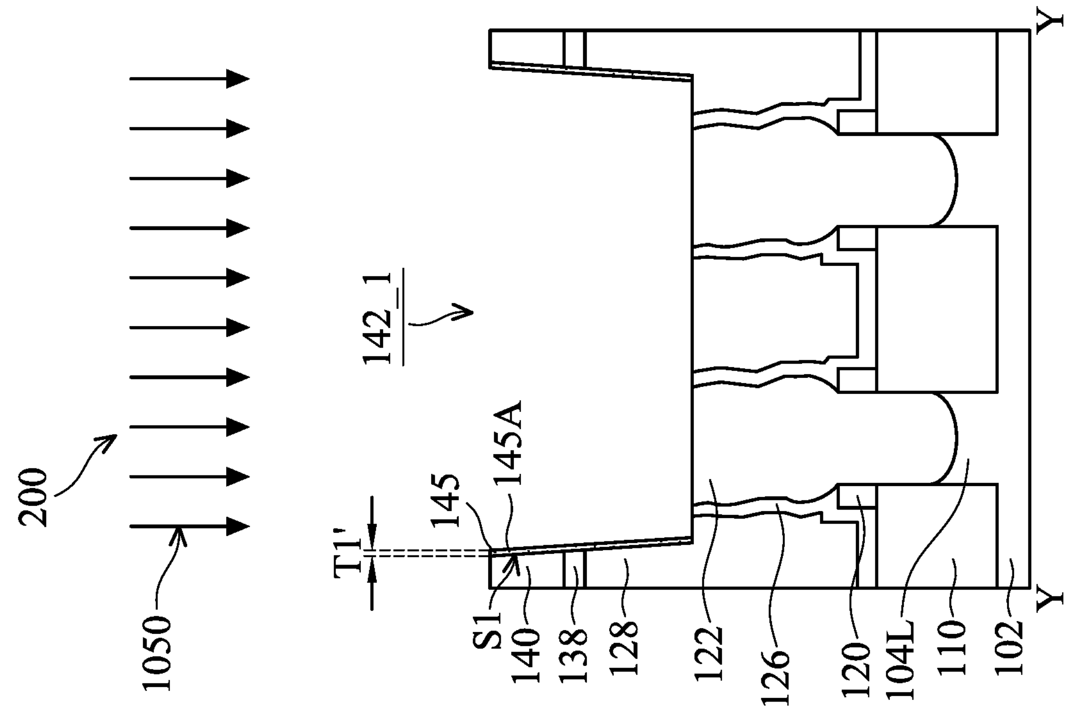
Figures 1, 4E:
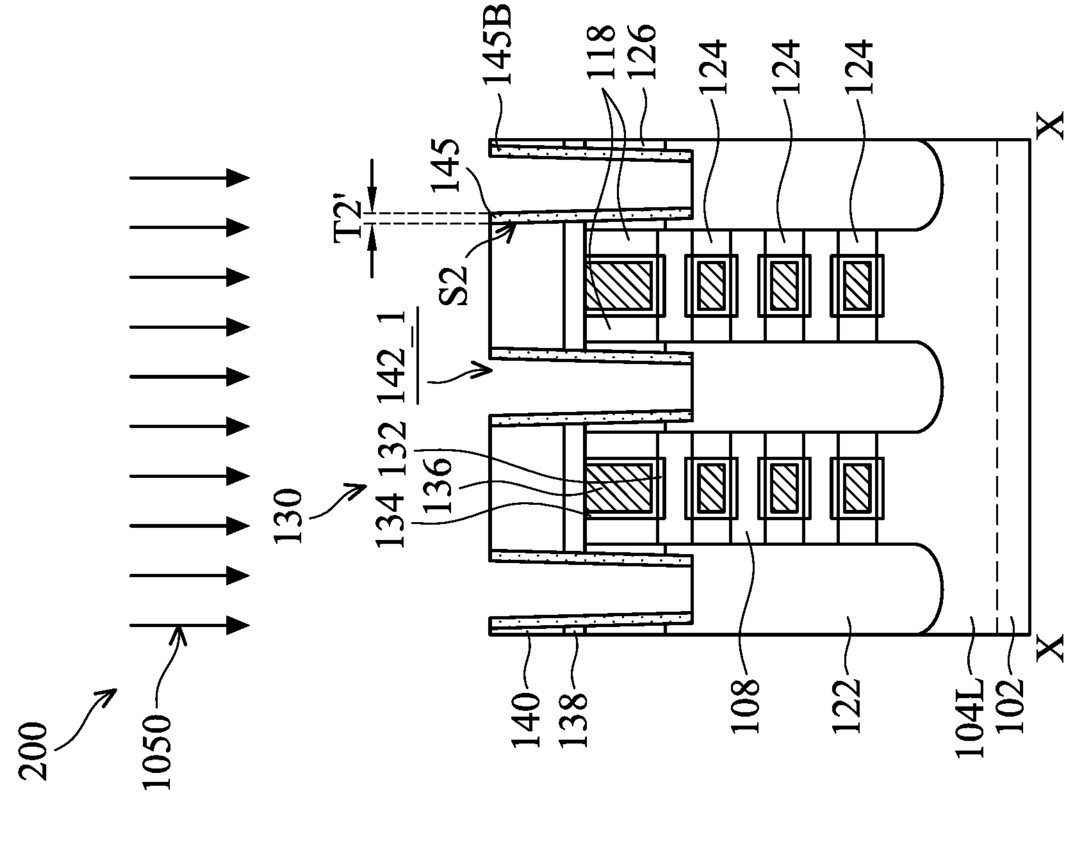

A pre-clean process 1050 are performed on the semiconductor structure 100 to remove an oxidation layer (e.g., native oxide) formed on the exposed surface of the source/drain features 122, as shown in FIGS. 4E-1 and 4E-2, in accordance with some embodiments. During the pre-clean process 1050, the contact liners 145 are also partially etched, in accordance with some embodiments. In the pre-clean process 1050, the etching rate of the first portions 145A of the contact liners 145 is faster than the etching rate of the first portions 145B of the contact liners 145, in accordance with some embodiments.

In some embodiments, after the pre-clean process 1050, the thickness T1' of the first portions 144A is in a range from about 0.1 nm to about 2 nm, and the thickness T2' of the second portions 144B is in a range from about 0.5 nm to about 6 nm. In some embodiments, the ratio (T1'/T2') of the thickness T1' to the thickness T2' is in a range from about 0.1 to about 0.7.

Figures 2, 4F:
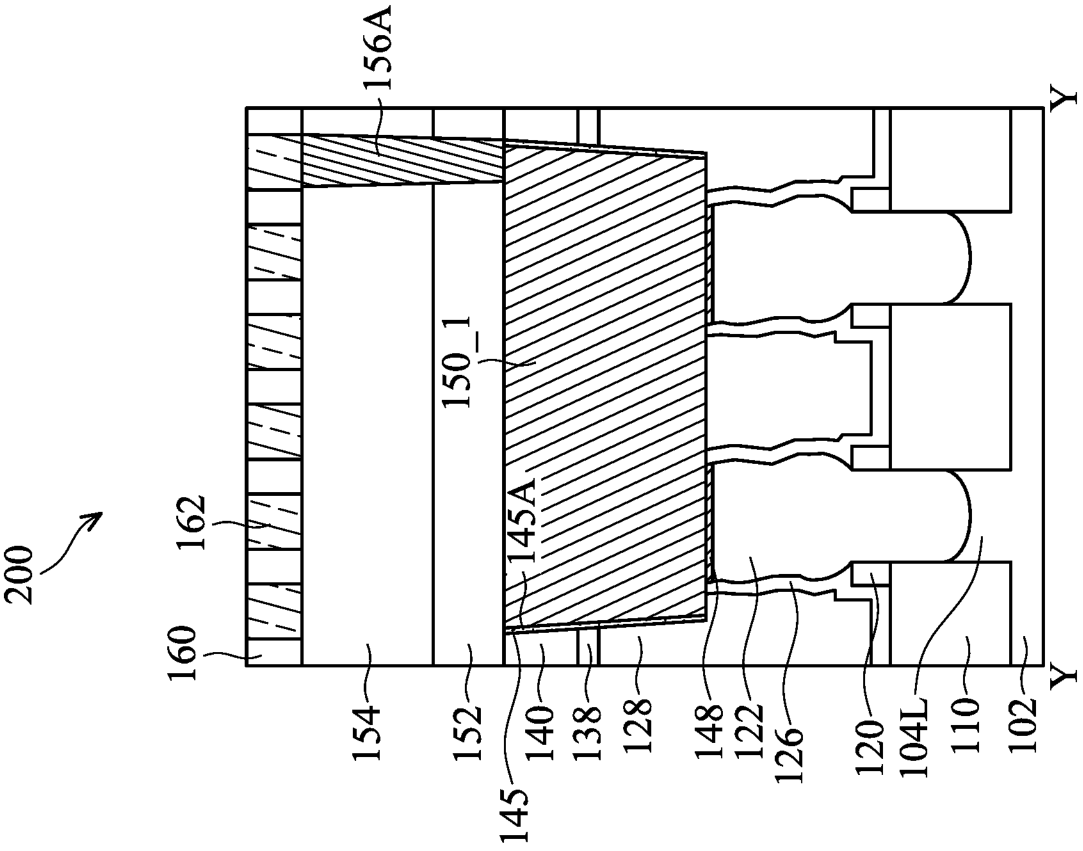
Figures 1, 4F:
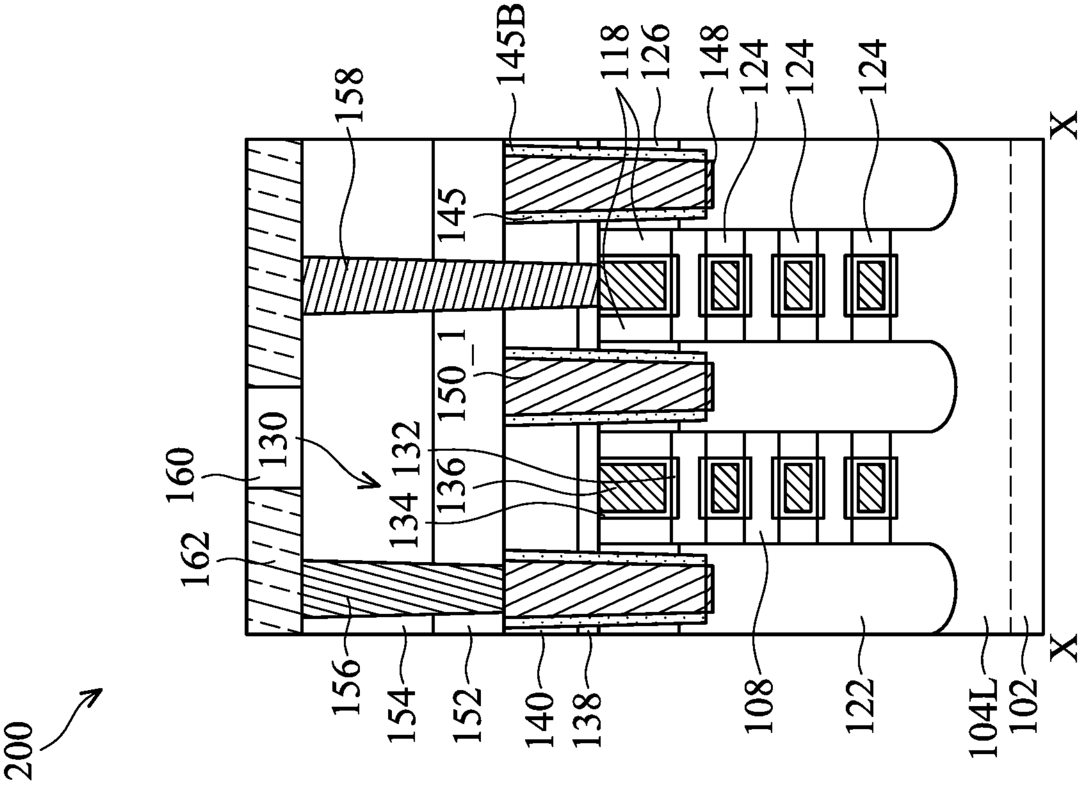

Silicide layers 148 are formed on the exposed surfaces of the source/drain features 122, as shown in FIGS. 4F-1 and 4F-2, in accordance with some embodiments. A post-clean process may be then performed on the silicide layers 148, in accordance with some embodiments. Contact plugs 150 are formed in the contact openings 142, as shown in FIGS. 4E-1 and 4E-2, in accordance with some embodiments.

The steps described above in FIGS. 2I-1 to 2J-3 are performed, thereby forming an etching stop layer 152, a third interlayer dielectric layer 154, vias 156 and 158, an intermetal dielectric layer 160 and metal lines 162, as shown in FIGS. 4F-1 and 4F-2, in accordance with some embodiments.

In accordance with the embodiments of the present disclosure, the first portions 145A of the contact liner 145 have a relatively thin thickness T1' and the second portions 145B of the contact liner 145 have a relatively thick thickness T2'. As a result, the via 156A has a larger contact area with the contact plug 150_1, and the risk of leakage between the contact liner 145 and the final gate stack 130 may be reduced. Therefore, the performance and reliability of the resulting semiconductor device may improve.

FIGS. 5A-1 through 5D-2 are cross-sectional views illustrating the formation of a semiconductor structure 300 at various intermediate stages. The embodiments of FIGS. 5A-1 through 5D-2 are similar to the embodiments of FIGS. 4A-1 through 4F-2, except that the contact liners 145 are thinned down in a post-clean process. FIGS. 5A-1, 5B-1, 5C-1 and 5D-1 illustrate the semiconductor structure 200 corresponding to line X-X, and FIGS. 5A-2, 5B-2, 5C-2 and 5D-2 illustrate the semiconductor structure 200 corresponding to line Y-Y of FIG. 1.

Figures 2, 5A:
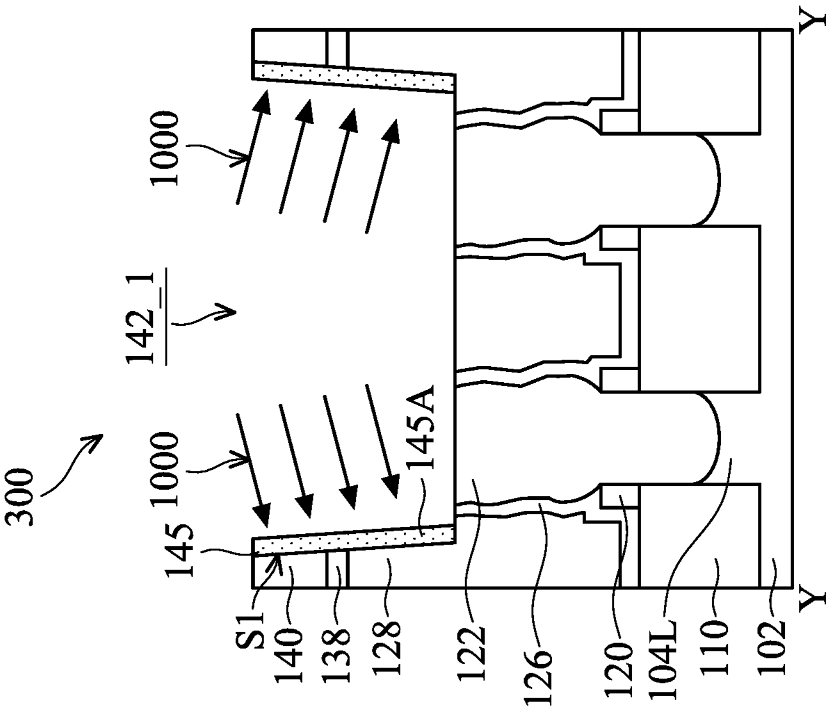
Figures 1, 5A:
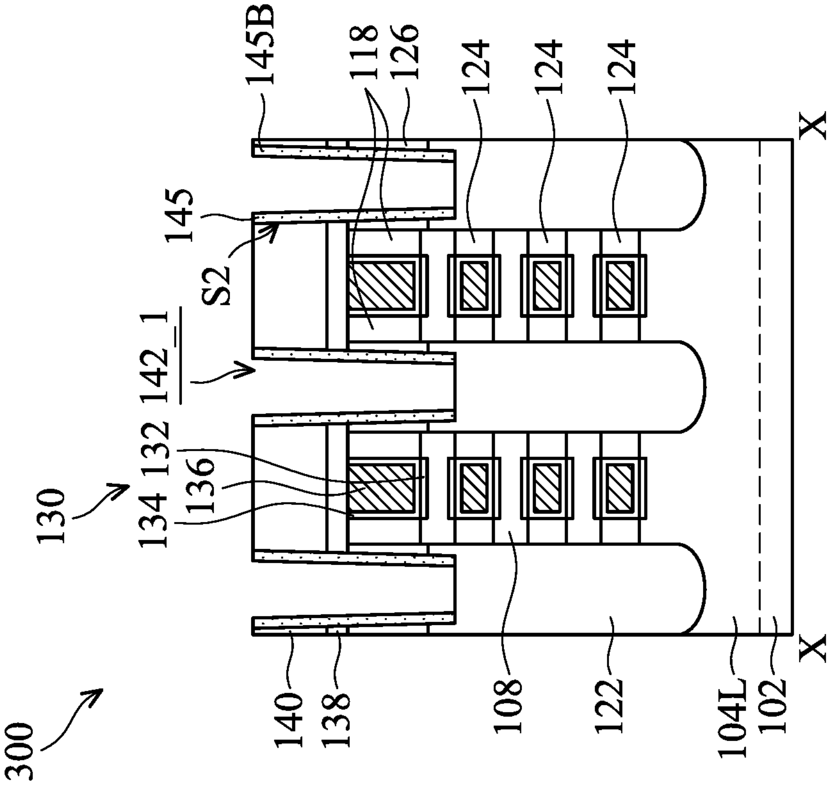

Continuing from FIGS. 4D-1 to 4D-2, an implantation process 1000 is performed on the semiconductor structure 300 to introduce dopants through the contact openings 142 and into the first portions 145A of the contact liners 145, as shown in FIG. 5A-2, in accordance with some embodiments.

Figures 2, 5B:
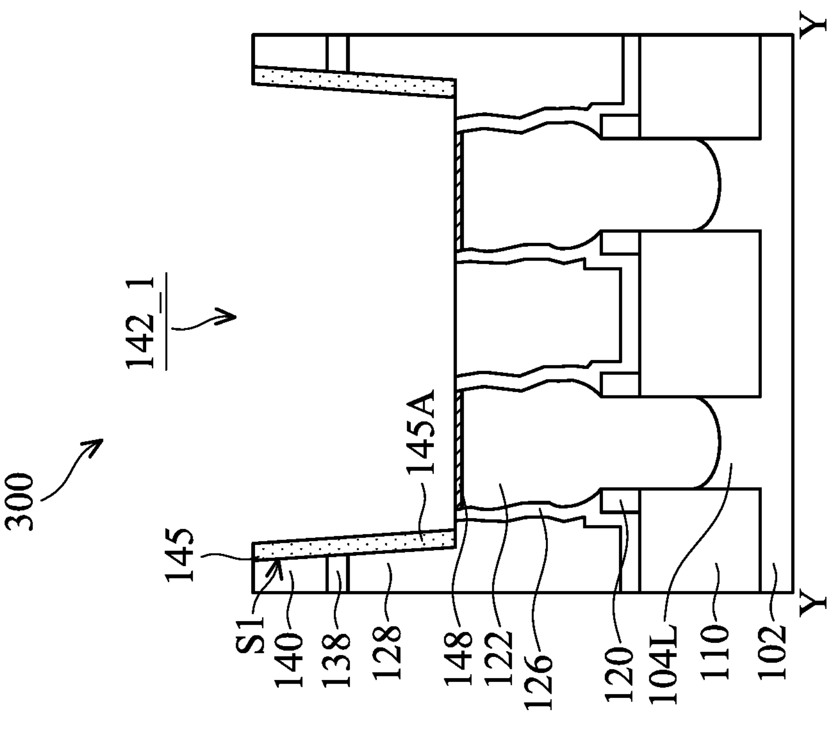
Figures 1, 5B:
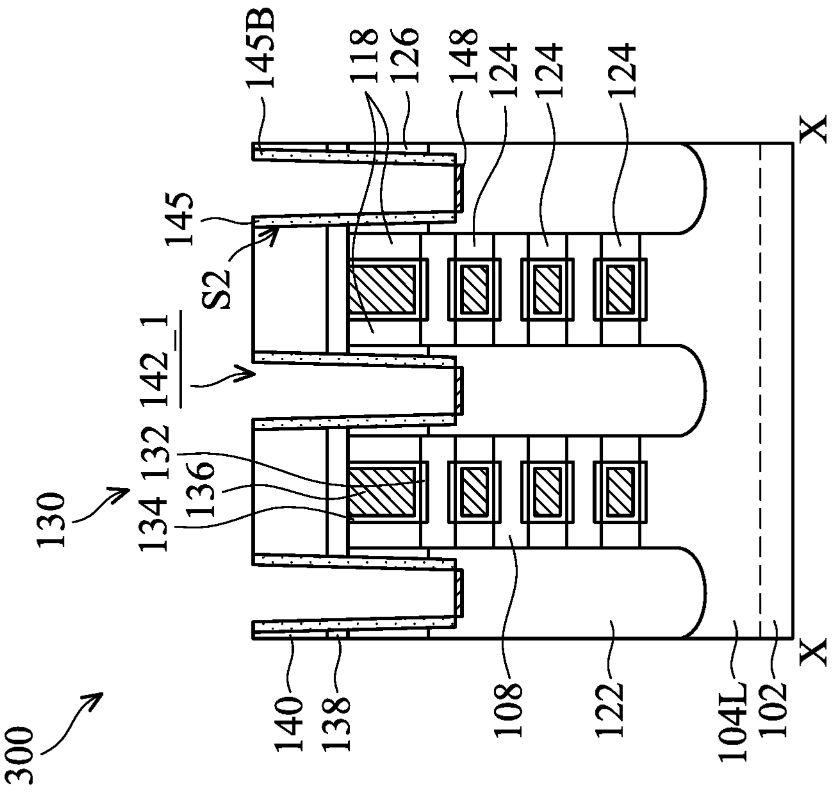

A pre-clean process are performed on the semiconductor structure 100 to remove an oxidation layer (e.g., native oxide) formed on the exposed surface of the source/drain features 122, in accordance with some embodiments. Silicide layers 148 are formed on the exposed surfaces of the source/drain features 122, as shown in FIGS. 5B-1 and 5B-2, in accordance with some embodiments.

Figures 1, 5C:
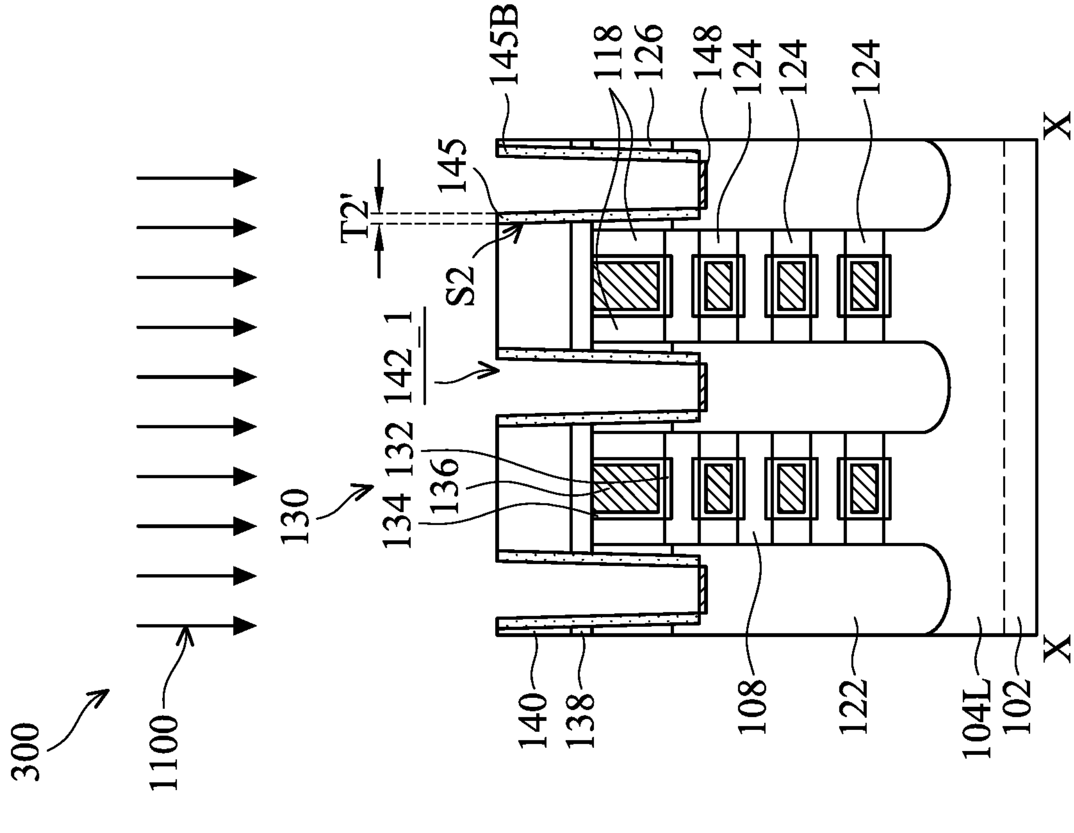
Figures 2, 5C:
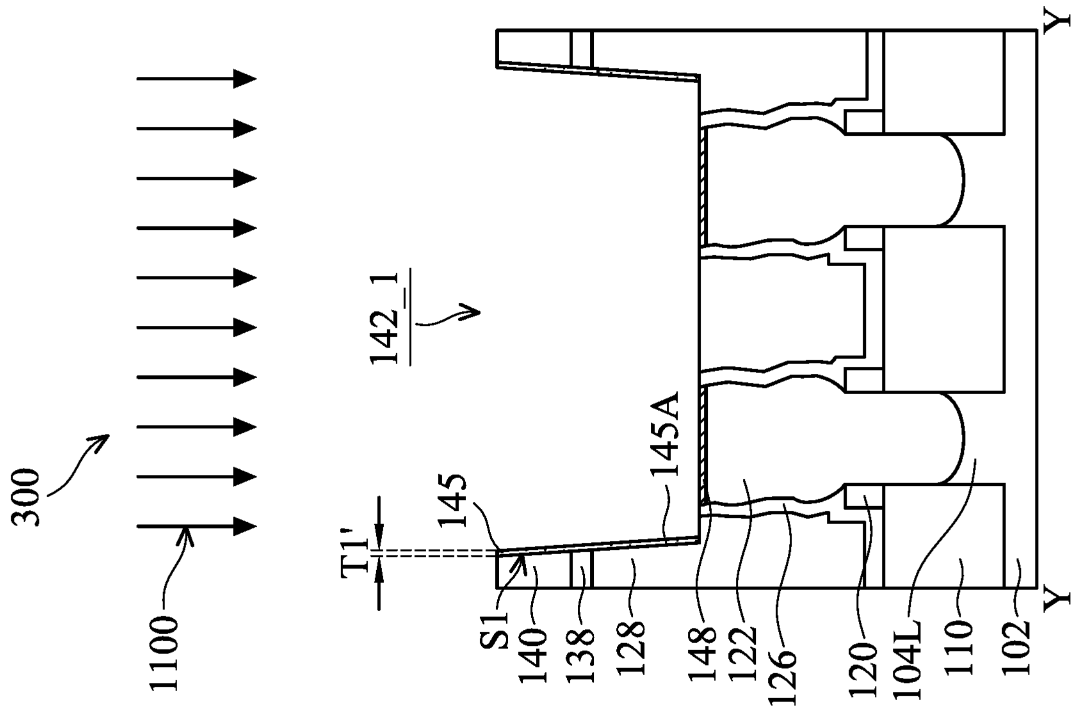

A post-clean process 1100 are performed on the silicide layers 148 to remove an oxidation layer (e.g., native oxide) formed on the silicide layers 148, as shown in FIGS. 5C-1 and 5C-2, in accordance with some embodiments. During the post-clean process 1100, the contact liners 145 are also partially etched, in accordance with some embodiments. In the post-clean process 1100, the etching rate of the first portions 145A of the contact liners 145 is faster than the etching rate of the first portions 145B of the contact liners 145, in accordance with some embodiments.

In some embodiments, after the post-clean process 1100, the thickness T1' of the first portions 144A is in a range from about 0.1 nm to about 2 nm, and the thickness T2' of the second portions 144B is in a range from about 0.5 nm to about 6 nm. In some embodiments, the ratio (T1'/T2') of the thickness T1' to the thickness T2' is in a range from about 0.1 to about 0.7.

Figures 1, 5D:
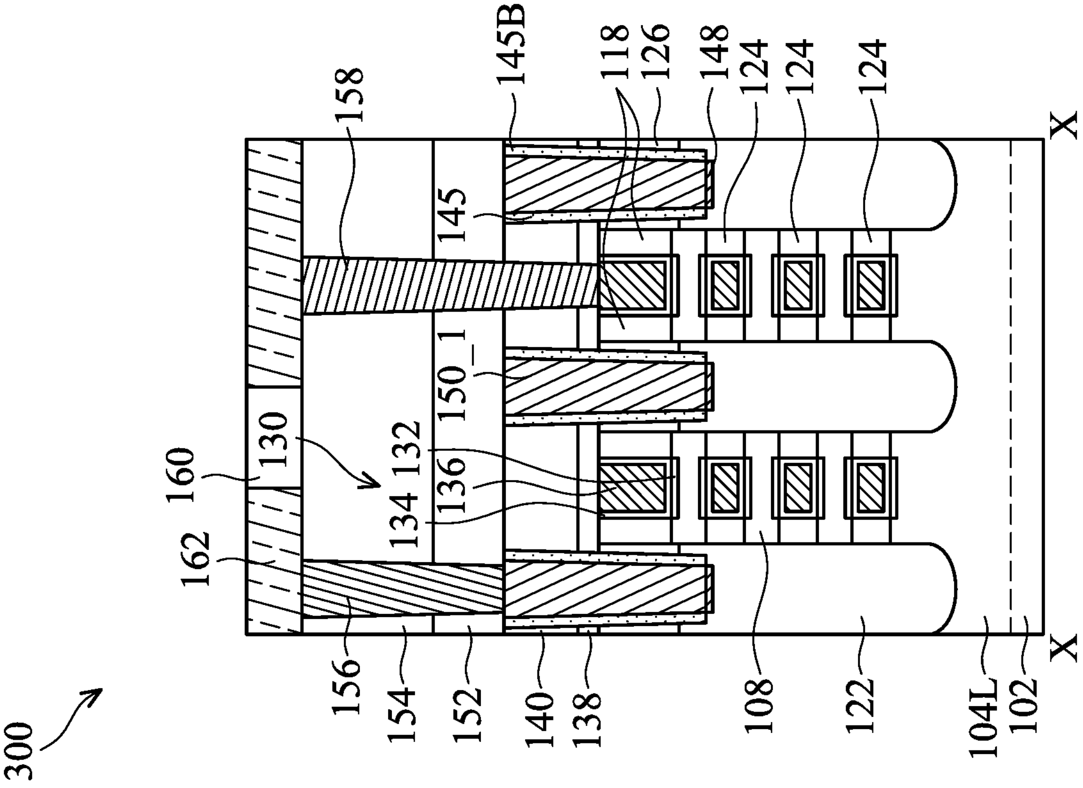
Figures 2, 5D:
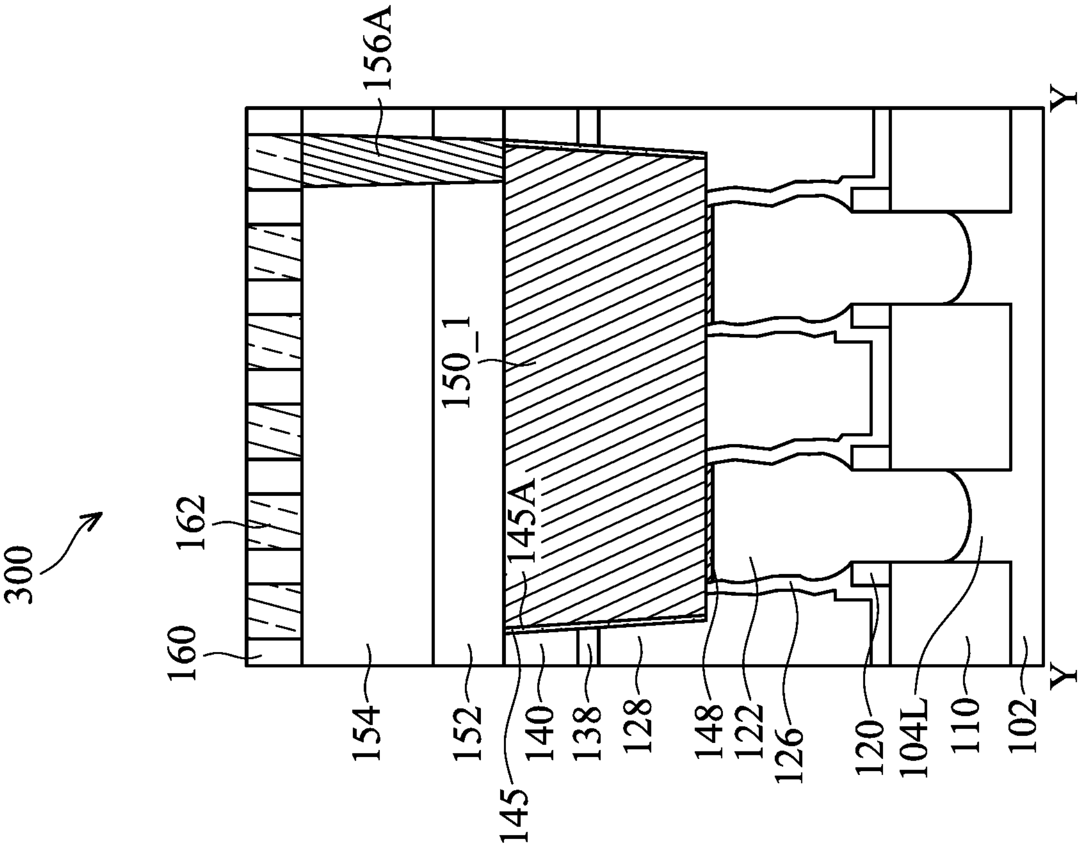

Contact plugs 150 are formed in the contact openings 142, as shown in FIGS. 5D-1 and 5D-2, in accordance with some embodiments. The steps described above in FIGS. 2I-1 to 2J-3 are performed, thereby forming an etching stop layer 152, a third interlayer dielectric layer 154, vias 156 and 158, an intermetal dielectric layer 160 and metal lines 162, as shown in FIGS. 5D-1 and 5D-2, in accordance with some embodiments.

In accordance with the embodiments of the present disclosure, the first portions 145A of the contact liner have a relatively thin thickness T1' and the second portions 145B of the contact liner 145 have a relatively thick thickness T2'. As a result, the via 156A has a larger contact area with the contact plug 150_1, and the risk of leakage between the contact liner 145 and the final gate stack 130 may be reduced. Therefore, the performance and reliability of the resulting semiconductor device may improve.

Figure 6:
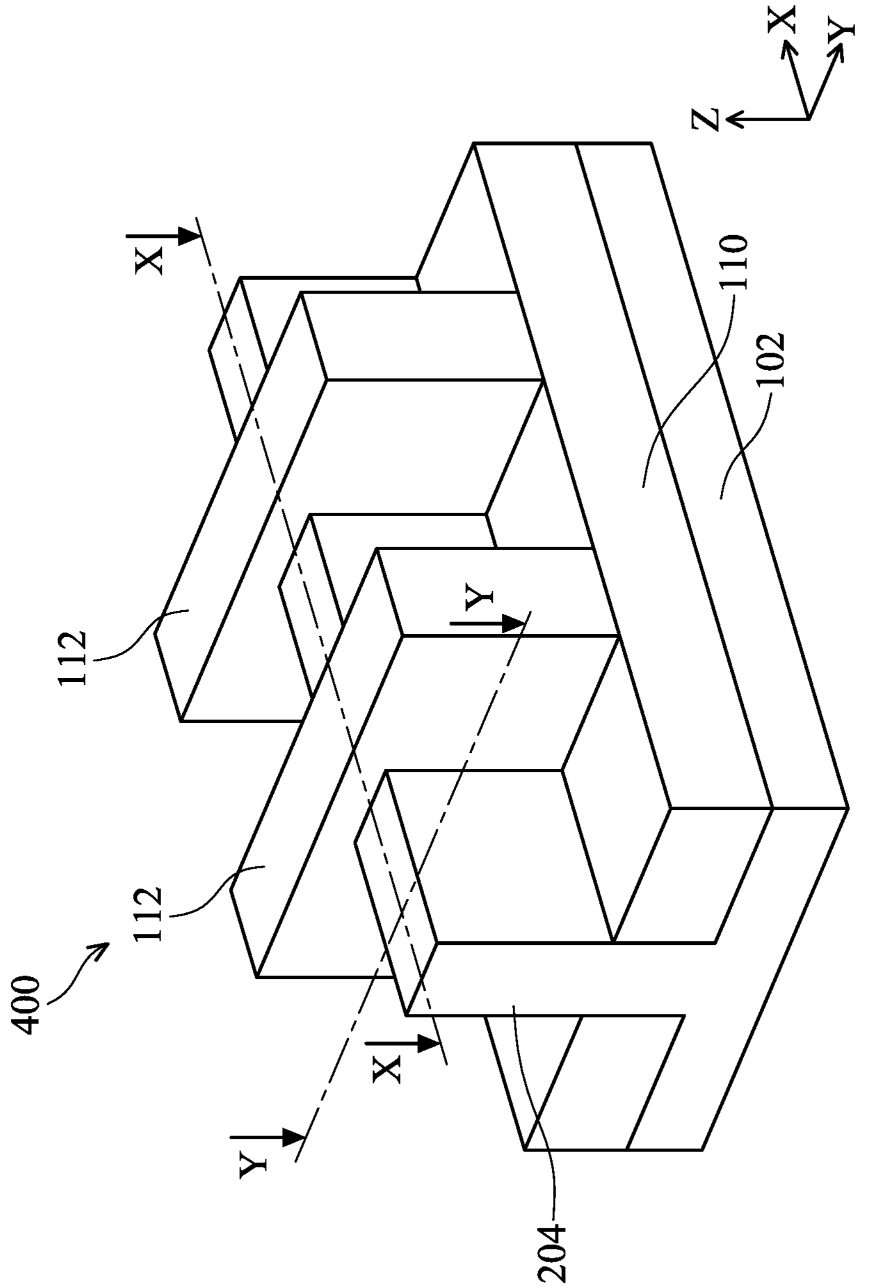
FIG. 6 is a perspective view of a semiconductor structure, in accordance with some embodiments of the disclosure.

FIG. 6 is a perspective view of a semiconductor structure 400 having a FinFET architecture, in accordance with some embodiments of the disclosure. The semiconductor structure 400 includes a substrate 102, a fin structure 204 and an isolation structure 110 over the substrate 102, in accordance with some embodiments.

Embodiments of the disclosure form a semiconductor structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate and patterned using a photolithography process. Spacers are formed alongside the patterned sacrificial layer using a self-aligned process. The sacrificial layer is then removed, and the remaining spacers may then be used to pattern the fins.

The fin structure 204 extends in X direction, in accordance with some embodiments. Gate structures 112 are formed with longitudinal axes parallel to the Y direction and extending across and/or surrounding the channel regions of the fin structure 204, in accordance with some embodiments.

FIG. 4 further illustrates reference cross-sections that are used in later figures. Cross-section X-X is in a plan parallel to the longitudinal axis of the fin structure 204 (i.e., X direction) and through the fin structure 204. Cross-section Y-Y is in a plan parallel to the longitudinal axis of the gate structure (i.e., Y direction) and across the source/drain region of the fin structure 204.

Figures 2, 7A:
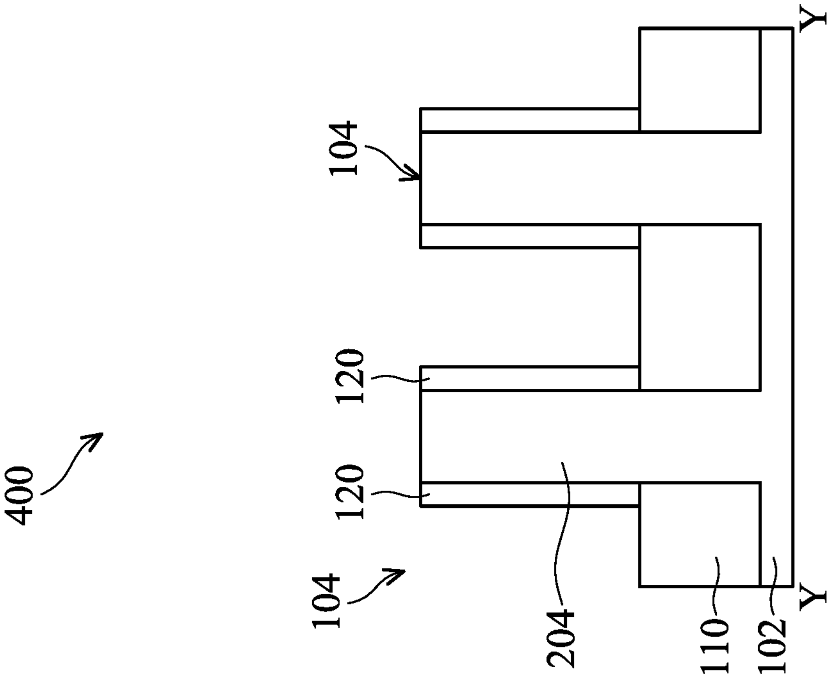
Figures 1, 7A:
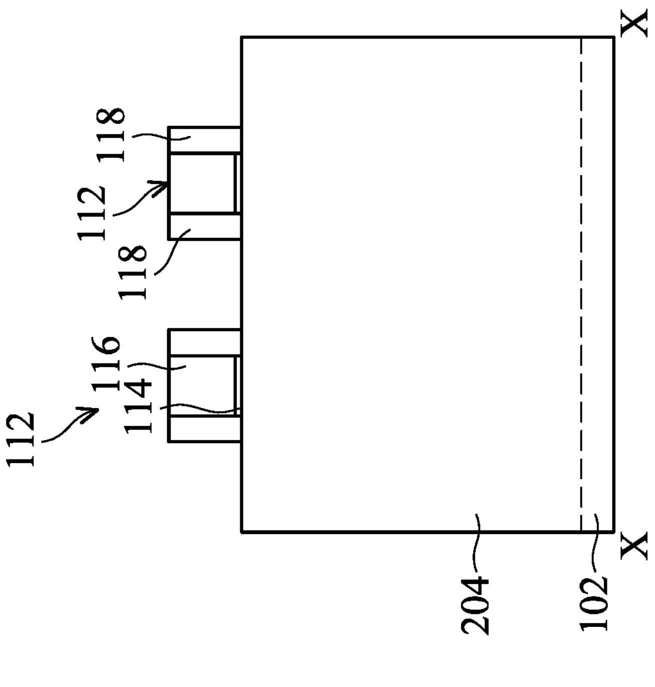
Figures 3, 7A:
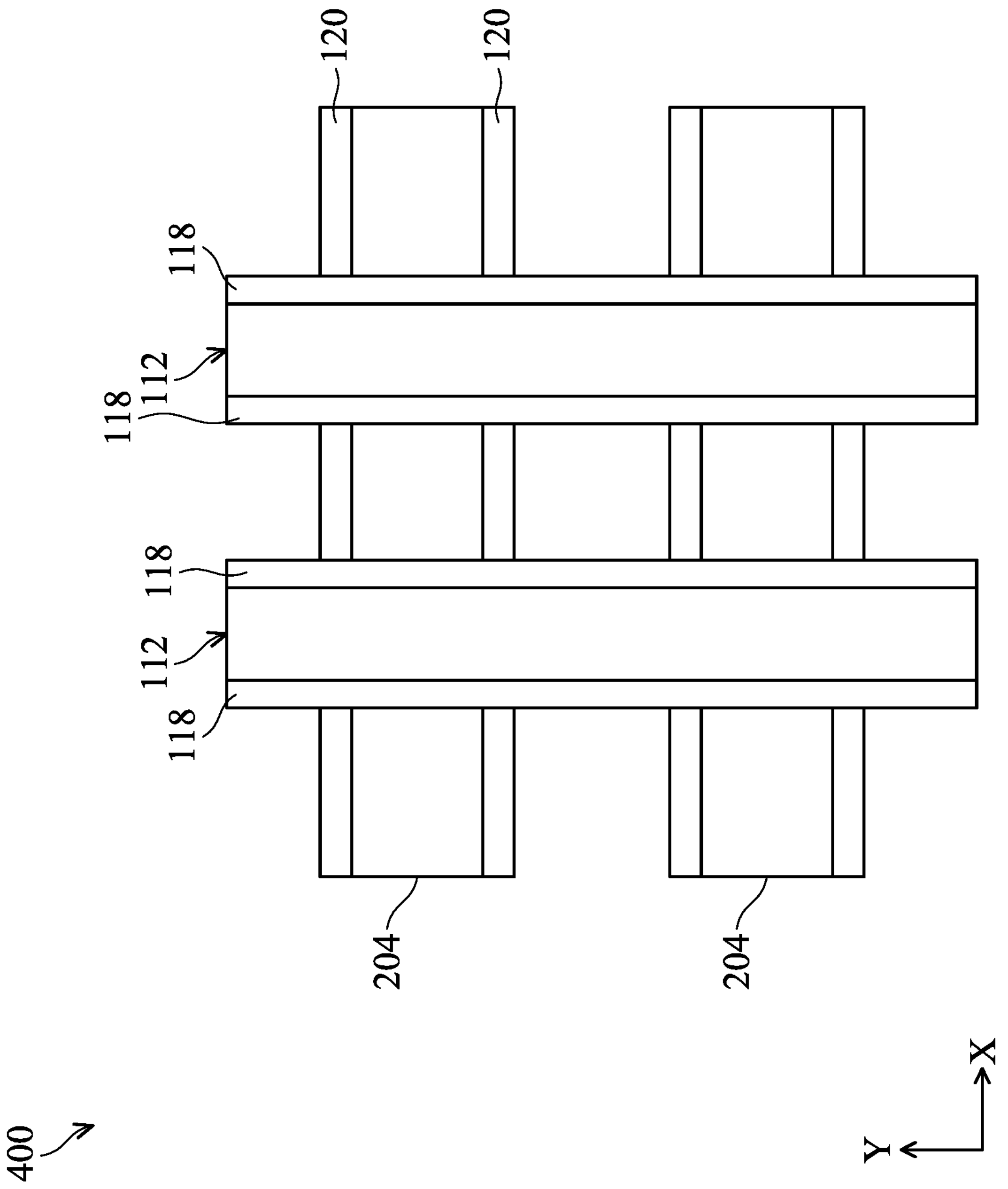

FIGS. 7A-1 through 7D-3 are schematic views illustrating the formation of a semiconductor structure 400 at various intermediate stages. FIGS. 7A-1 and 7A-2 are cross-sectional views of the semiconductor structure 400 after the formation of active regions 204, an isolation structure 110, dummy gate structures 112, gate spacer layers 118, and fin spacer layers 120 corresponding to line X-X and line Y-Y of FIG. 6. FIG. 7A-3 is a plan view illustrating the semiconductor structure 400.

The semiconductor structure 400 includes a substrate 102 and active regions 204 over the substrate 102, as shown in FIGS. 5A-1 to 5A-3, in accordance with some embodiments. The formation of the active regions 204 includes patterning the substrate 102 thereby forming trenches, in accordance with some embodiments. The portions of the substrate 102 that protrude from between the trenches serve as the active regions 204, in accordance with some embodiments. The patterning process may include photolithography and etching processes.

An isolation structure 110 is formed to surround the lower portions of the active regions 204, in accordance with some embodiments. Dummy gate structures 112 are formed across the active regions 204 and the isolation structure 110, in accordance with some embodiments. Gate spacer layers 118 are formed along opposite sidewalls of the dummy gate structures 112, and fin spacer layers 120 are formed along opposite sidewalls of the active regions 204, in accordance with some embodiments. The materials and the formation methods of the isolation structure 110, the dummy gate structures 112, the gate spacer layers 118 and the fin spacer layers 120 are similar to that of the isolation structure 110, the dummy gate structures 112, the gate spacer layers 118 and the fin spacer layers 120 described above.

Figures 1, 7B:
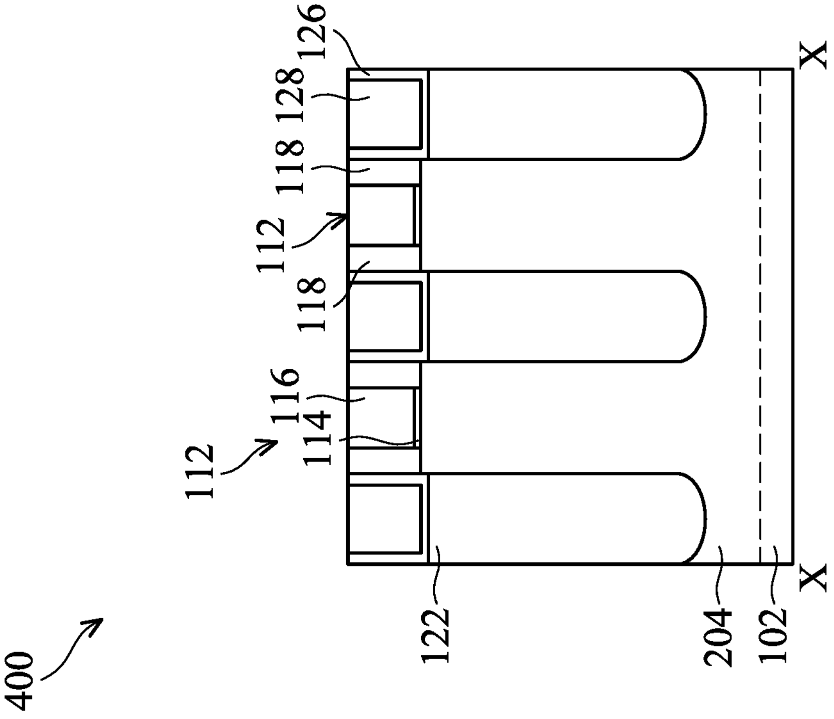
Figures 2, 7B:
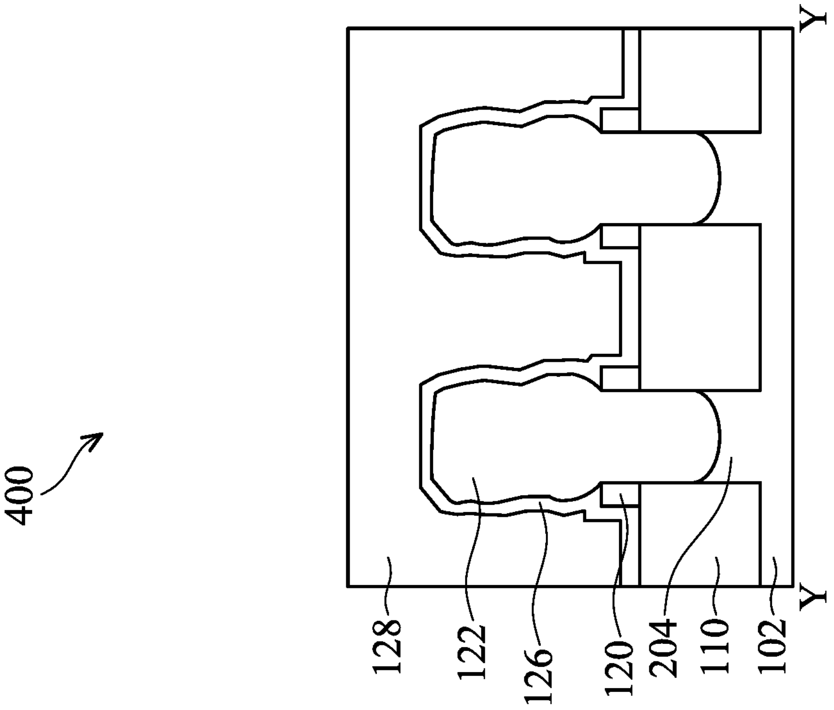
Figures 3, 7B:
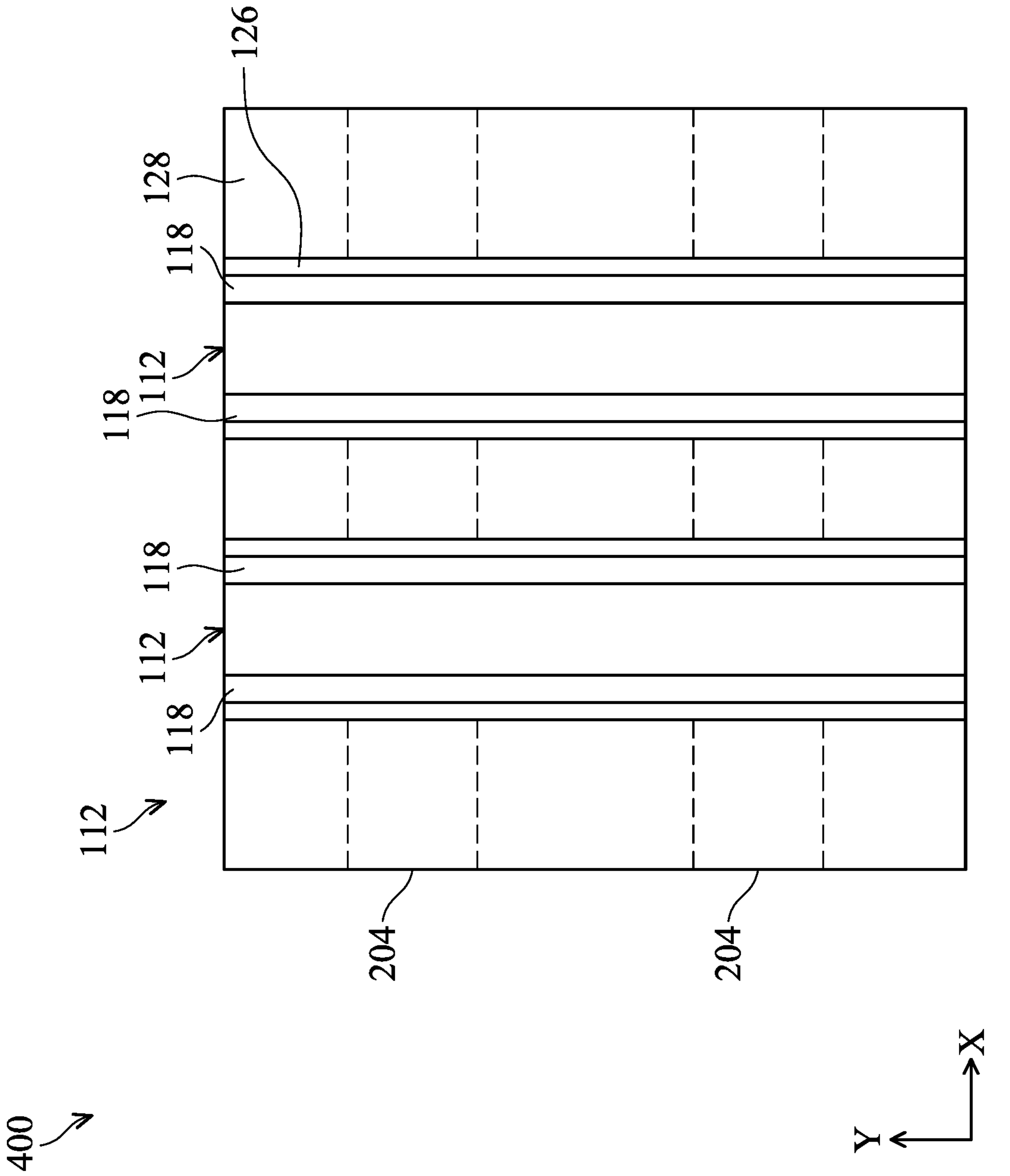

FIGS. 7B-1 and 7B-2 are cross-sectional views of the semiconductor structure 400 after the formation of source/drain features 122, inner spacer layers 124, a contact etching stop layer 126 and a first interlayer dielectric layer 128 corresponding to line X-X and line Y-Y of FIG. 6. FIG. 7B-3 is a plan view illustrating the semiconductor structure 400.

Source/drain features 122 are formed in and/or over the source/drain regions of the active regions 204, in accordance with some embodiments. A contact etching stop layer 126 is formed over the semiconductor structure 400 to cover the source/drain features 122, in accordance with some embodiments. A first interlayer dielectric layer 128 is formed over the contact etching stop layer 126, in accordance with some embodiments. The materials and the formation methods of the source/drain features 122, the dummy gate structures 112, the contact etching stop layer 126 and the first interlayer dielectric layer 128 are similar to that of the source/drain features 122, the dummy gate structures 112, the contact etching stop layer 126 and the first interlayer dielectric layer 128 described above.

Figures 2, 7C:
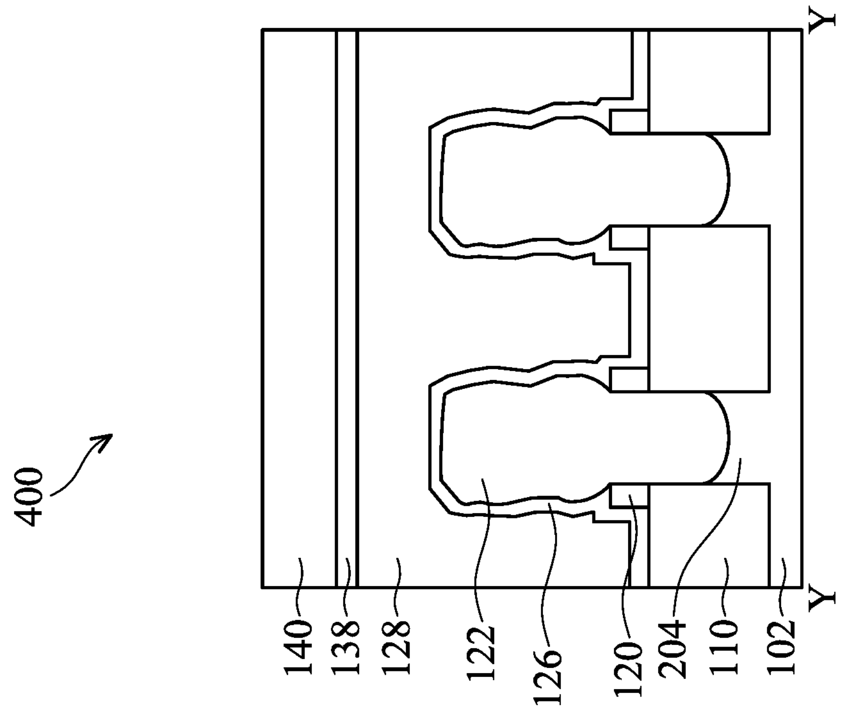
Figures 1, 7C:
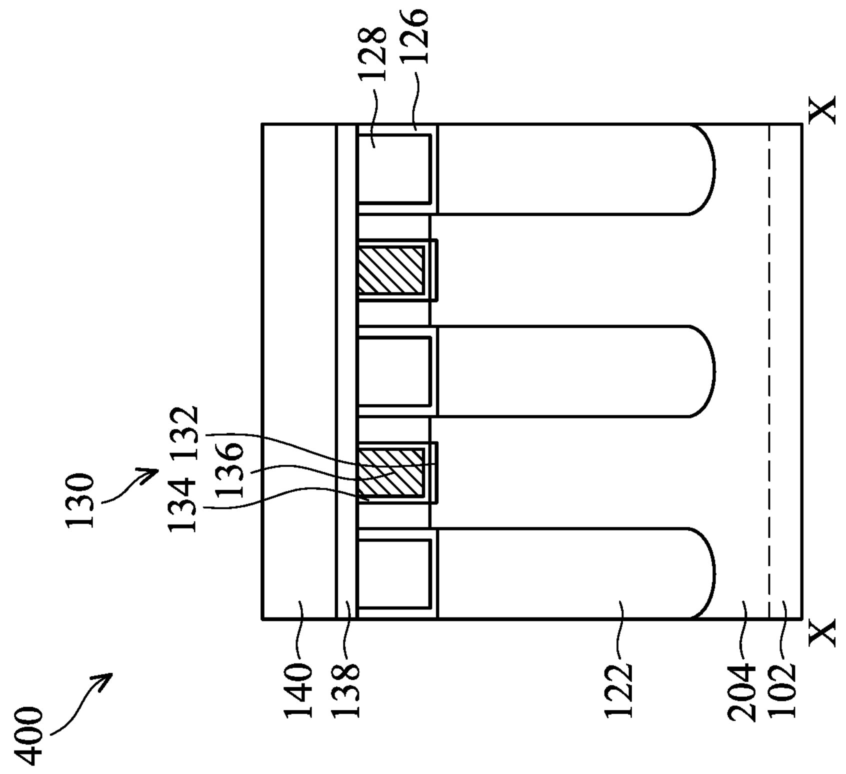
Figures 3, 7C:
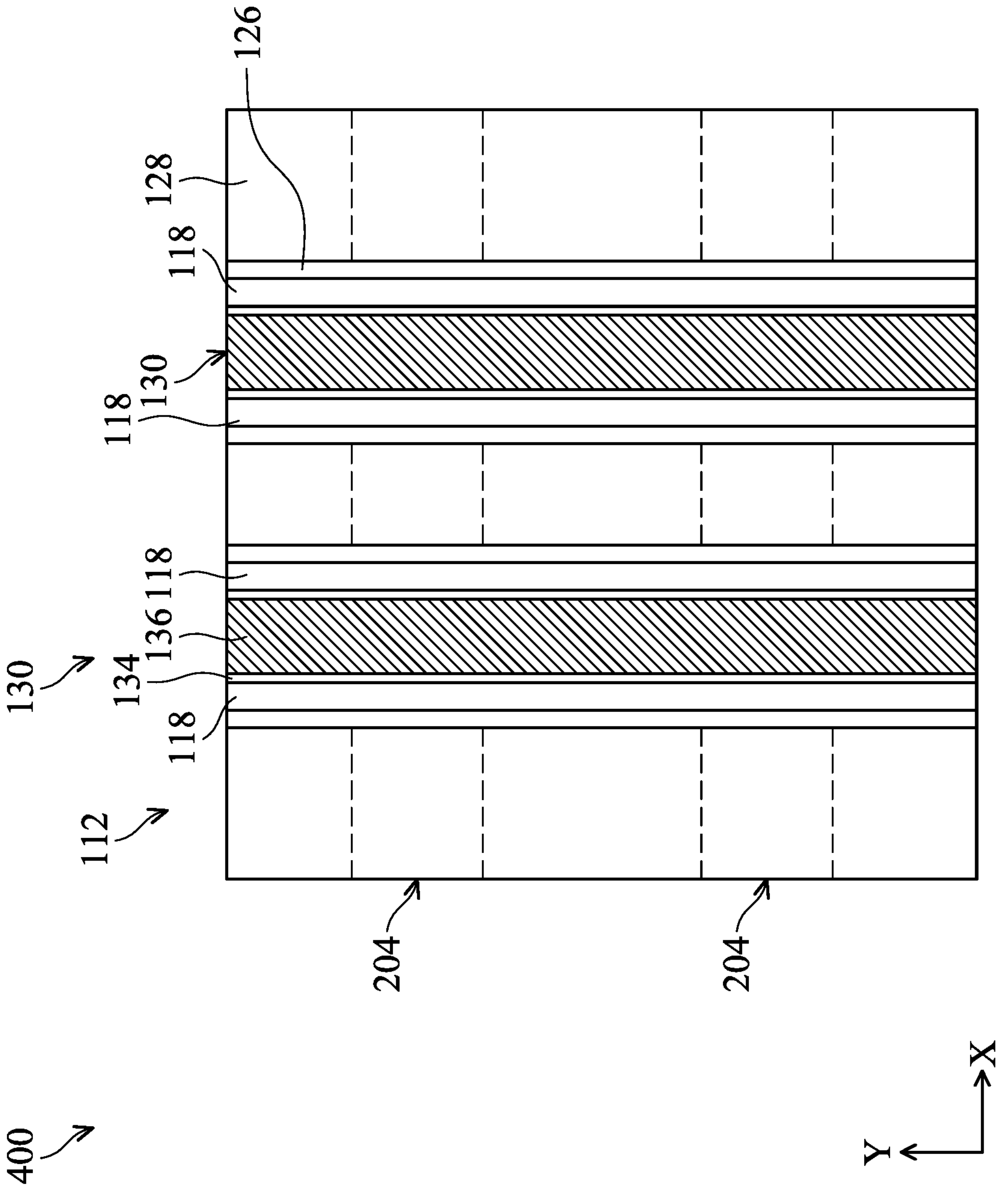
Figures 2, 7D:
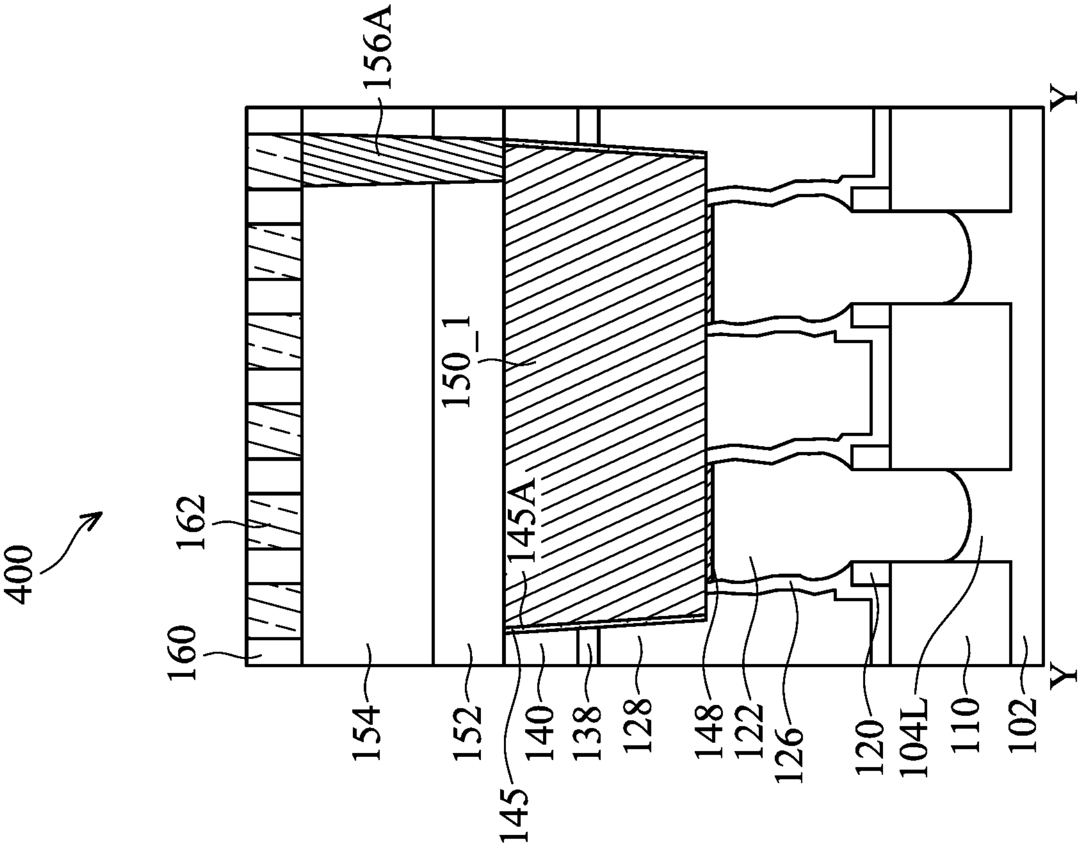
Figures 1, 7D:
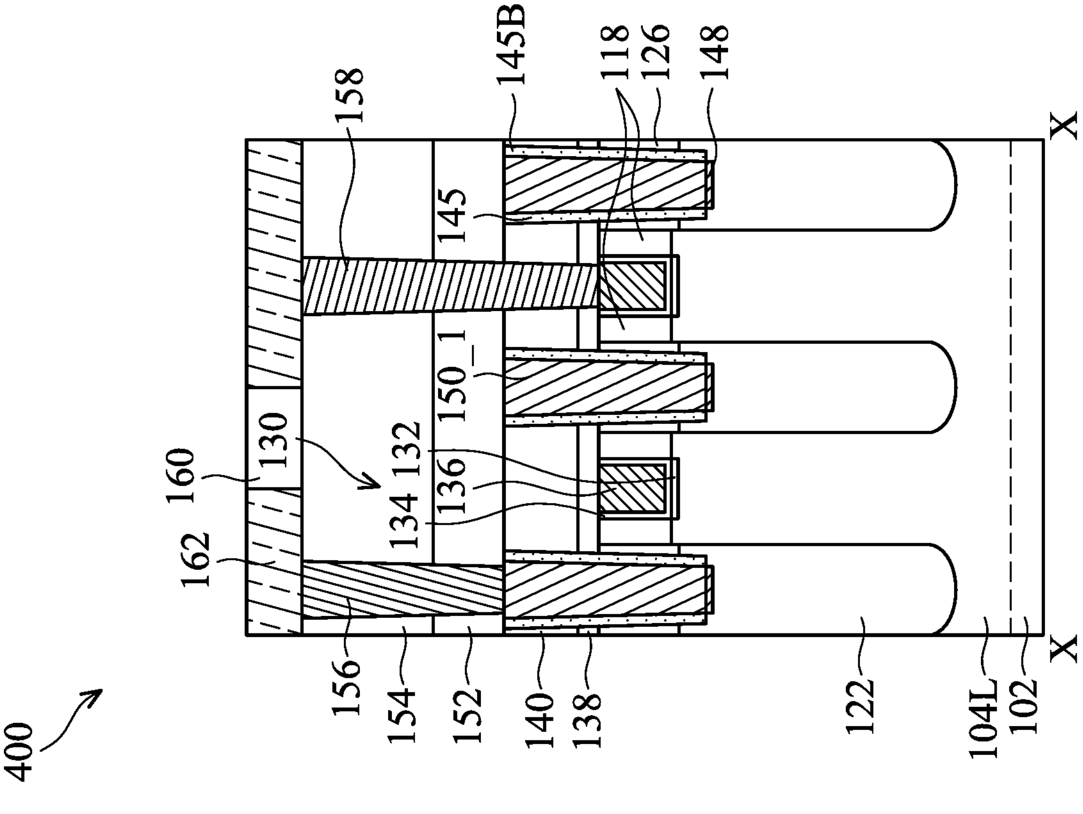
Figures 3, 7D:
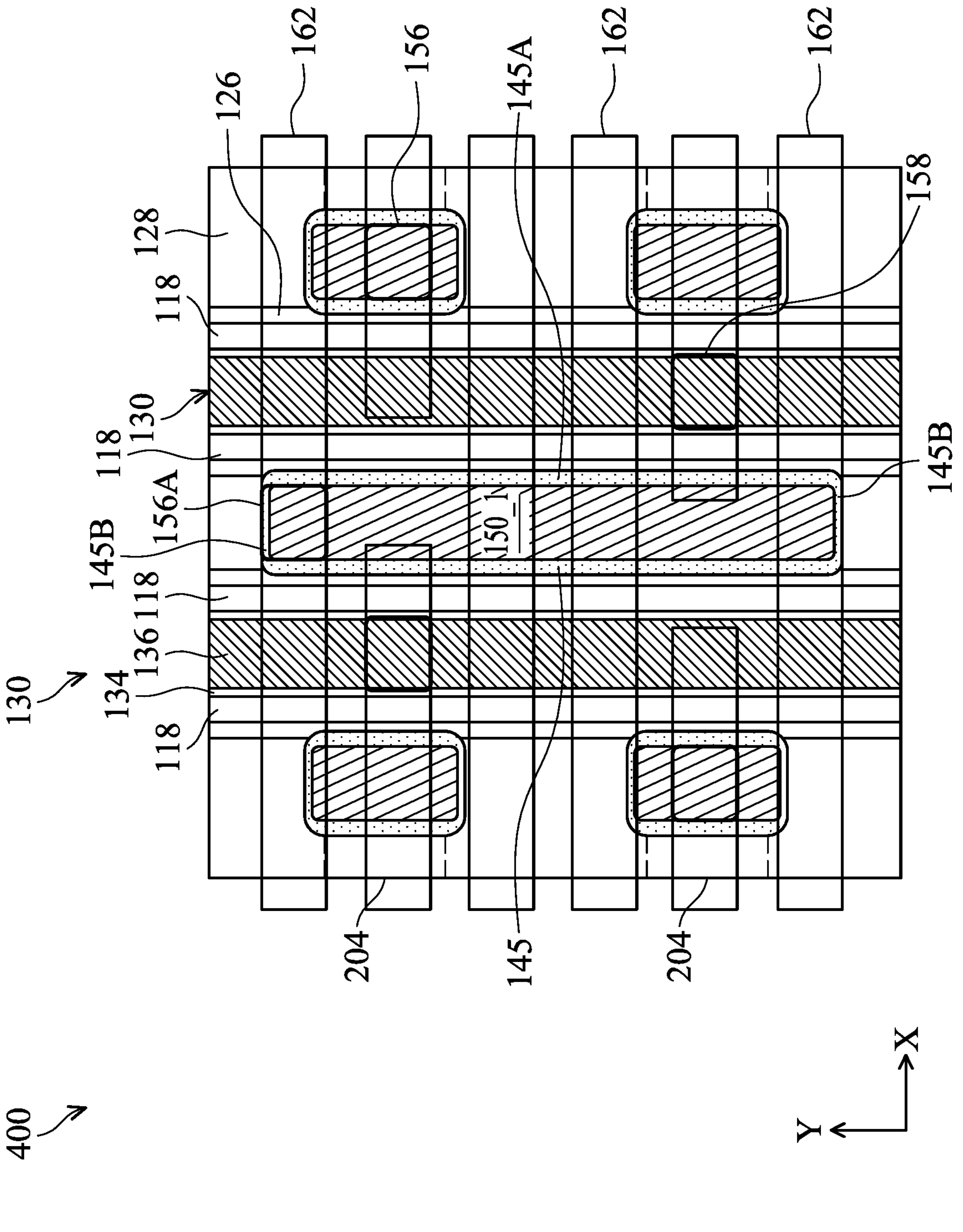
Figures 1, 8:
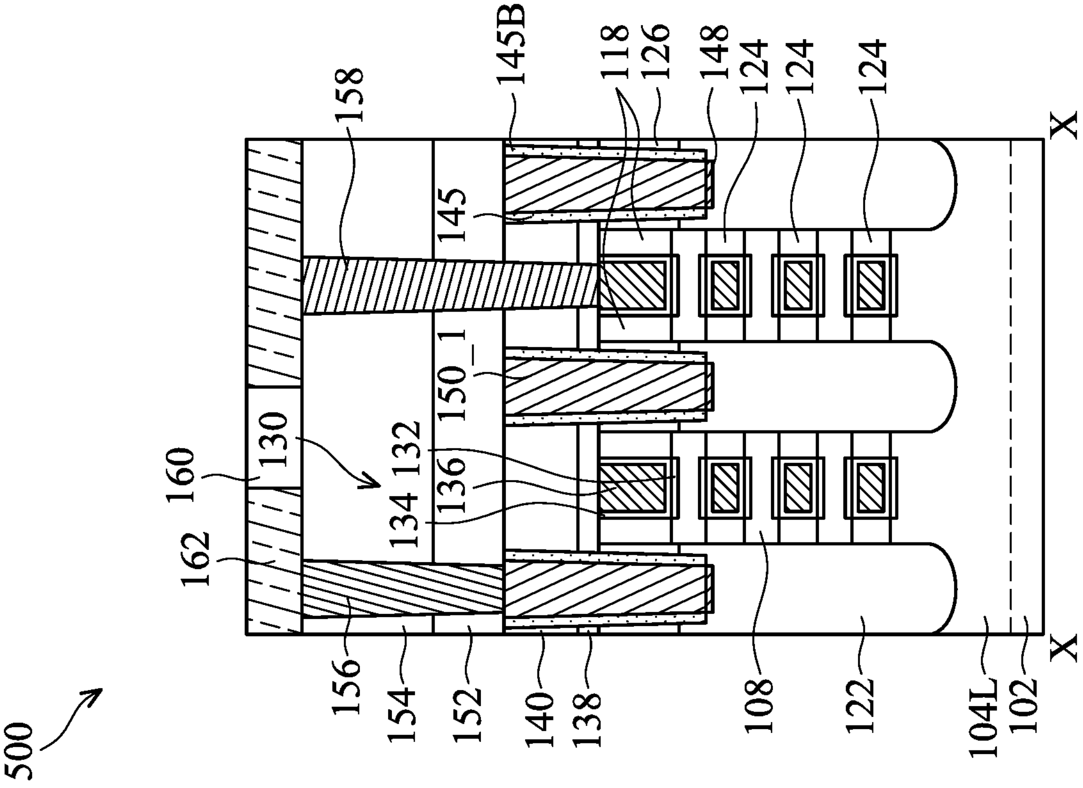
Figures 2, 8:
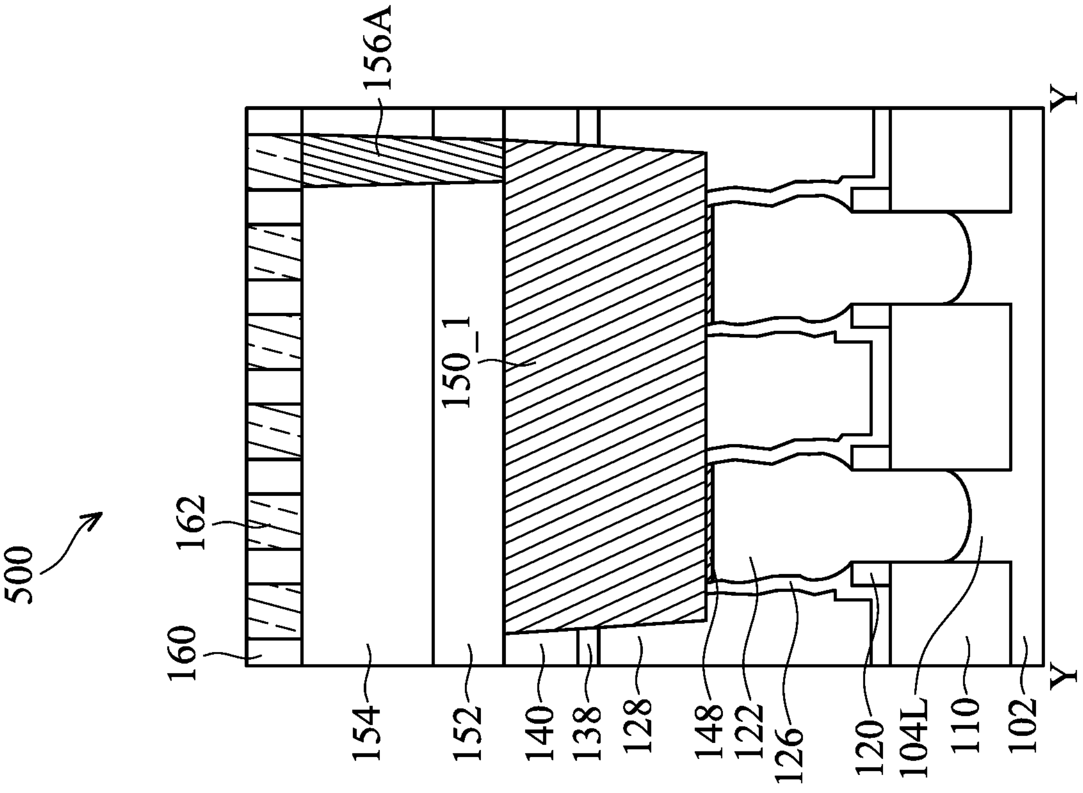
Figures 3, 8:
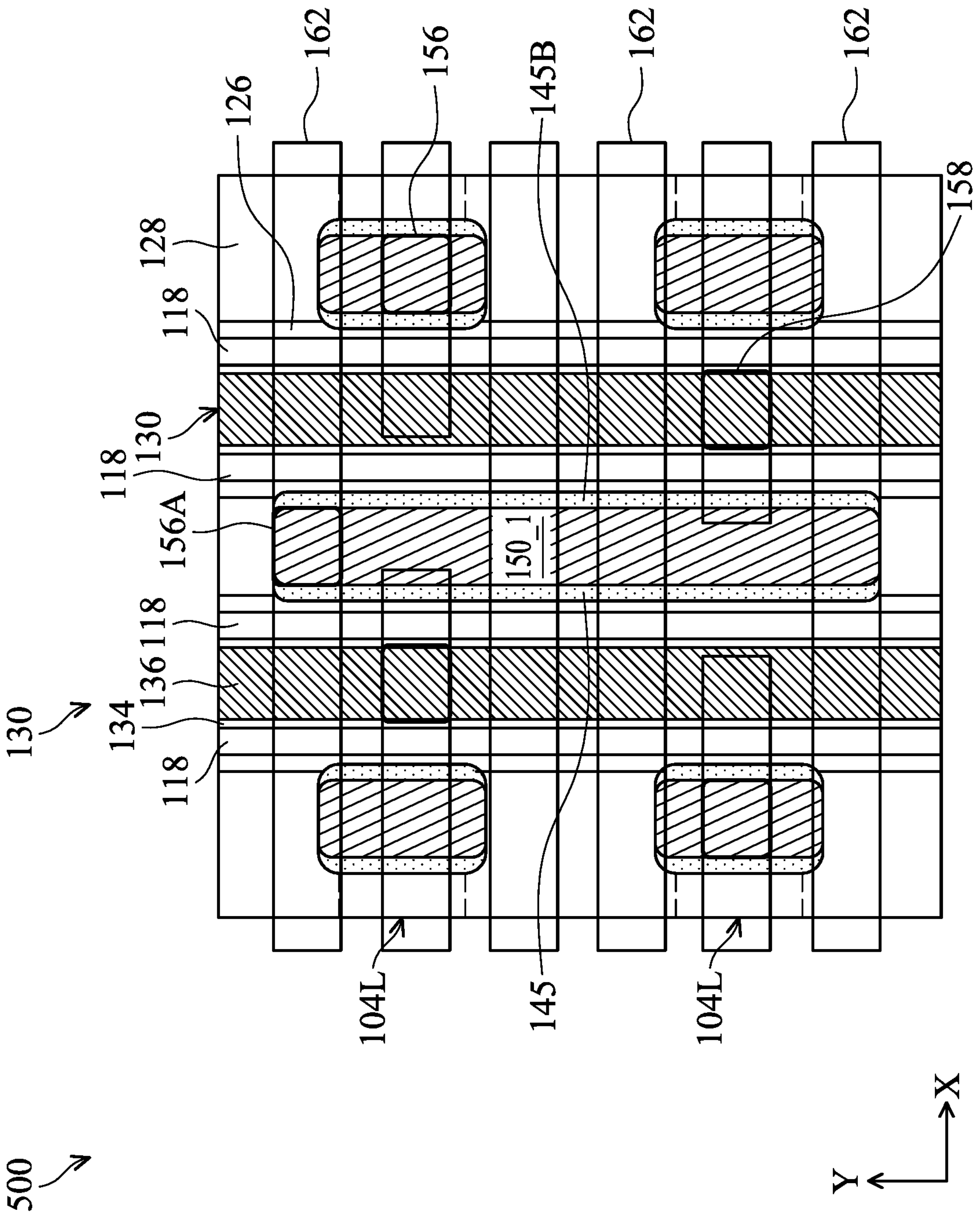

FIGS. 7C-1 and 7C-2 are cross-sectional views of the semiconductor structure 400 after the formation of final gate stacks 130, an etching stop layer 138 and a second interlayer dielectric layer 140 corresponding to line X-X and line Y-Y of FIG. 6, in accordance with some embodiments of the disclosure. FIG. 7C-3 is a plan view of the semiconductor structure 400.

One or more etching processes are performed to remove the dummy gate structures 112 to form gate trenches, in accordance with some embodiments. Final gate stacks 130 are formed in the gate trenches, thereby surrounding the active regions 204, as shown in FIGS. 7C-1 and 7C-3, in accordance with some embodiments. The final gate stacks 130 combine with the neighboring source/drain features 122 to form FinFETs, e.g., n-channel FinFETs and p-channel FinFETs. An etching stop layer 138 is formed over the semiconductor structure 100, in accordance with some embodiments. A second interlayer dielectric layer 140 is formed over the etching stop layer 138, in accordance with some embodiments. The materials and the formation methods of the final gate stack 130, the etching stop layer 138, and the second interlayer dielectric layer 140 are similar to that of the final gate stack 130, the etching stop layer 138, and the second interlayer dielectric layer 140 described above.

The steps described above in FIGS. 2D-1 to 2J-3 are performed on the semiconductor structure 400, thereby forming contact liners 145, silicide layers 168, contact plugs 150, an etching stop layer 152, a third interlayer dielectric layer 154, vias 156 and 158, an intermetal dielectric layer 160 and metal lines 162, as shown in FIGS. 5D-1 and 5D-2, in accordance with some embodiments. In some other embodiments, the formation of the contact liners 145 may be implemented using the method described above FIGS. 4A-1 to 4F-2, or the method described above FIGS. FIGS. 5A-1 to 5D-2.

FIGS. 8-1, 8-2 and 8-3 illustrate a semiconductor structure 500, which is a modification of the semiconductor structure 100 of FIGS. 2J-1, 2J-2 and 2J-3, in accordance with some embodiments of the disclosure.

In some other embodiments, the contact liners 145 have no first portions 145A. The contact plugs 150 are in direct contact with the second interlayer dielectric layer 140, the etching stop layer 138 and the first interlayer dielectric layer 128, in accordance with some embodiments of the disclosure. In some embodiments, the via 156A only lands on the contact plug 150_1, in accordance with some embodiments of the disclosure.

For example, in the embodiments shown in FIG. 2A-1 to 2J-3, the first portions 145A of the contact liners 145 are completely removed in the etching process described in FIGS. 2G-1 to 2G-3. In the embodiments shown in FIG. 4A-1 to 4F-2, the first portions 145A of the contact liners 145 are completely removed in the pre-clean process 1050 described in FIGS. 4E-1 and 4E-2. In the embodiments shown in FIG. 5A-1 to 5D-2, the first portions 145A of the contact liners 145 are completely removed in the post-clean process 1100 described in FIGS. 5C-1 and 5C-2.

As described above, the semiconductor structure and the method for forming the semiconductor structure are provided. The semiconductor structure may include the contact liner 145, and the contact plug 150_1 nested within the contact liner 145. The semiconductor structure may also include the via 156A on both the first portion 145A of the contact liner 145 and the contact plug 150_1, and the final gate stack 130 adjacent to the second portion 145B of the contact liner 145. Because the first portion 145A has a relatively thin thickness T1' and the second portion 145B has a relatively thick thickness T2', the via 156A has a larger contact area with the contact plug 150_1, while the risk of leakage between the contact plug 150_1 and the final gate stack 130 may be reduced. Therefore, the performance and reliability of the resulting semiconductor device may improve.

Embodiments of a semiconductor structure and the method for forming the same may be provided. The semiconductor structure may include a contact liner which includes a first portion extending in the X direction, and a via lands on first portion of the contact liner. The contact liner also includes a second portion extending in the Y direction and adjacent to the final gate stack. Because the first portion of the contact liner is thinner than the second portion of the contact liner, the contact resistance between the contact plug and the via may be reduced, while the risk of leakage between the contact plug and the final gate stack may be reduced. Therefore, the performance and reliability of the resulting semiconductor device may improve.

In some embodiments, a method for forming a semiconductor structure is provided. The method includes forming a source/drain feature over an active region, forming a gate stack across the active region, and forming an interlayer dielectric layer over the source/drain feature, etching the interlayer dielectric layer to form an opening exposing the source/drain feature. The opening has a first sidewall extending in a first horizontal direction that is perpendicular to a longitudinal axis of the gate stack and a second sidewall extending in a second horizontal direction that is parallel to the longitudinal axis of the gate stack. The method also includes forming a contact liner along the first sidewall and the second sidewall of the opening, and forming a contact plug in the opening. A first portion of the contact liner along the first sidewall of the opening is thinner than a second portion of the contact liner along the second sidewall of the opening.

In some embodiments, a method for forming a semiconductor structure is provided. The method includes forming a plurality of nanostructures over a fin element, forming a source/drain feature adjoining the plurality of nanostructures, forming an interlayer dielectric layer over the source/drain feature, etching the interlayer dielectric layer to form an opening, implanting a dopant through a first side surface of the interlayer dielectric layer exposed from the opening into the interlayer dielectric layer, forming a contact liner along sidewalls of the opening, and forming a contact plug nested within the contact liner.

In some embodiments, a semiconductor structure is provided. The semiconductor structure includes an active region extending in a first horizontal direction, a gate stack extending across the active region in a second horizontal direction, an interlayer dielectric layer over the active region and the gate stack, a contact plug through the interlayer dielectric layer and on a source/drain region of the active region, and a contact liner interposing between the interlayer dielectric layer and the contact plug. The contact liner includes a first portion extending in the first horizontal direction and a second portion extending in the second horizontal direction, and the first portion of the contact liner is thinner than the second portion of the contact liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a source/drain feature over an active region;

forming a gate stack across the active region;

forming an interlayer dielectric layer over the source/drain feature;

etching the interlayer dielectric layer to form an opening exposing the source/drain feature, wherein the opening has a first sidewall extending in a first horizontal direction that is perpendicular to a longitudinal axis of the gate stack and a second sidewall extending in a second horizontal direction that is parallel to the longitudinal axis of the gate stack;

forming a contact liner along the first sidewall and the second sidewall of the opening, wherein a first portion of the contact liner along the first sidewall of the opening is thinner than a second portion of the contact liner along the second sidewall of the opening; and forming a contact plug in the opening.

2. The method for forming the semiconductor structure as claimed in claim 1, further comprising:

doping a dopant into the interlayer dielectric layer from the first sidewall of the opening using an implantation process.

3. The method for forming the semiconductor structure as claimed in claim 2, wherein the dopant includes fluorine, carbon, argon, germanium, or a combination thereof.

4. The method for forming the semiconductor structure as claimed in claim 3, wherein the dopant in the interlayer dielectric layer has a peak concentration close to the first sidewall of the opening and gradually decreases toward an interior of the interlayer dielectric layer in the second horizontal direction.

5. The method for forming the semiconductor structure as claimed in claim 1, further comprising:

forming a dielectric layer along the first sidewall and the second sidewall of the opening, wherein a first portion of the dielectric layer along the first sidewall of the opening is thicker than a second portion of the dielectric layer along the second sidewall of the opening;

doping a dopant into the first portion of the dielectric layer;

cleaning a surface of the source/drain feature exposed from the opening; and forming a silicide layer on the surface of the source/drain feature exposed from the opening, wherein the first portion of the dielectric layer forms the first portion of the contact liner and the second portion of the dielectric layer forms the second portion of the contact liner.

6. The method for forming the semiconductor structure as claimed in claim 5, wherein the first portion of the dielectric layer is thinned down while cleaning the surface of the source/drain feature.

7. The method for forming the semiconductor structure as claimed in claim 5, further comprising:

cleaning a surface of the silicide layer, wherein the first portion of the dielectric layer is thinned down while cleaning the surface of the silicide layer.

8. The method for forming the semiconductor structure as claimed in claim 1, further comprising:

forming a via on the contact plug, wherein the first portion of the contact liner is covered by the via.

9. The method for forming the semiconductor structure as claimed in claim 1, wherein the active region comprises a fin element extending in the first horizontal direction and a plurality of nanostructures stacked over the fin element.

10. The method for forming the semiconductor structure as claimed in claim 1, wherein the active region comprises a fin structure surrounded by the gate stack.

11. A method for forming a semiconductor structure, comprising:

forming a plurality of nanostructures over a fin element;

forming a source/drain feature adjoining the plurality of nanostructures;

forming an interlayer dielectric layer over the source/drain feature;

etching the interlayer dielectric layer to form an opening;

implanting a dopant through a first side surface of the interlayer dielectric layer exposed from the opening into the interlayer dielectric layer;

forming a contact liner along sidewalls of the opening; and forming a contact plug nested within the contact liner.

12. The method for forming the semiconductor structure as claimed in claim 11, wherein the implanting of the dopant into the interlayer dielectric layer induces a cleavage of silicon-oxygen (Si—O) bond on the first side surface of the interlayer dielectric layer.

13. The method for forming the semiconductor structure as claimed in claim 12, wherein the implanting of the dopant into the interlayer dielectric layer further induces a formation of silicon-fluorine (Si—F) bond on the first side surface of the interlayer dielectric layer.

14. The method for forming the semiconductor structure as claimed in claim 11, wherein the first side surface of the interlayer dielectric layer extends in a first horizontal direction that is parallel to a longitudinal axis of the fin element, and the dopant is implanted through the first side surface of the interlayer dielectric layer while keeping the dopant from being implanted from a second side surface of the opening extending in a second horizontal direction that is perpendicular to the longitudinal axis of the fin element.

15. The method for forming the semiconductor structure as claimed in claim 14, where forming the contact liner comprises:

depositing a dielectric layer over the interlayer dielectric layer and in the opening, wherein a deposition rate of a first portion of the dielectric layer along the first side surface of the interlayer dielectric layer is slower than a deposition rate of a second portion of the dielectric layer along the second side surface of the interlayer dielectric layer; and etching the dielectric layer to remove a third portion of the dielectric layer along a top surface of the interlayer dielectric layer.

16. A method for forming a semiconductor structure, comprising:

forming an active region over a substrate;

forming a source/drain feature over a source/drain region of the active region;

forming a gate stack over a channel region of the active region;

forming a contact etching stop layer to cover the source/drain feature;

forming an interlayer dielectric layer over the contact etching stop layer;

etching the interlayer dielectric layer and the contact etching stop layer to form an opening;

forming a dielectric layer in the opening, wherein the dielectric layer includes a first portion formed along a first sidewall of the opening and a second portion formed along a second sidewall of the opening;

treating the first portion of the dielectric layer with ion beams;

etching the dielectric layer, wherein the first portion of the dielectric layer is etched by a first etching rate, and the second portion of the dielectric layer is etched by a second etching rate that is less than the first etching rate; and forming a contact plug in the opening.

17. The method for forming the semiconductor structure as claimed in claim 16, further comprising:

forming a silicide layer on a surface of the source/drain feature before etching the dielectric layer, wherein an oxide layer formed on the silicide layer is removed during etching the dielectric layer.

18. The method for forming the semiconductor structure as claimed in claim 16, wherein the first sidewall of the opening extends in a first direction that is perpendicular to a longitudinal axis of the gate stack, and the second sidewall of the opening extends in a second direction that is parallel to the longitudinal axis of the gate stack.

19. The method for forming the semiconductor structure as claimed in claim 16, wherein a first sidewall of the opening is longer than a second sidewall of the opening.

20. The method for forming the semiconductor structure as claimed in claim 16, wherein an oxide layer formed on the source/drain feature is removed during etching the dielectric layer.

* * * * *